(12) United States Patent  
Matsuzaki et al.

(10) Patent No.: US 7,907,434 B2
(45) Date of Patent: Mar. 15, 2011

(54) SEMICONDUCTOR APPARATUS HAVING A LARGE-SIZE BUS CONNECTION

(75) Inventors: Yasurou Matsuzaki, San Jose, CA (US); Yasuharu Sato, Kawasaki (JP); Tadao Aikawa, Kawasaki (JP); Masafumi Yamazaki, Kawasaki (JP); Takaaki Suzuki, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 361 days.

(21) Appl. No.: 11/984,932

(22) Filed: Nov. 26, 2007

(65) Prior Publication Data
US 2008/0142847 A1  Jun. 19, 2008

Related U.S. Application Data

(62) Division of application No. 11/143,649, filed on Jun. 3, 2005, now Pat. No. 7,317,241, which is a division of application No. 10/766,890, filed on Jan. 30, 2004, now Pat. No. 6,936,874, which is a division of application No. 09/956,973, filed on Sep. 21, 2001, now Pat. No. 6,727,533.

(30) Foreign Application Priority Data

Nov. 29, 2000 (JP) .................. 2000-363901
Nov. 29, 2000 (JP) .................. 2000-363902
Nov. 29, 2000 (JP) .................. 2000-363903

(51) Int. Cl.
  *G11C 5/06* (2006.01)
(52) U.S. Cl. .......... 365/63; 257/211; 257/266; 257/635; 257/758

(58) Field of Classification Search .................... 365/63; 257/211, 266, 635, 758
See application file for complete search history.

(56) References Cited

U.S. PATENT DOCUMENTS

| 5,077,733 | A | 12/1991 | Whipple |
| 5,619,472 | A | 4/1997 | Okamura |
| 5,898,223 | A | 4/1999 | Frye et al. |
| 6,147,912 | A * | 11/2000 | Kitazawa ............... 365/189.02 |
| 6,403,463 | B1 | 6/2002 | Suyama |
| 6,429,528 | B1 | 8/2002 | King et al. |
| 6,441,479 | B1 | 8/2002 | Ahn et al. |
| 6,492,723 | B2 | 12/2002 | Suyama |
| 6,653,877 | B2 * | 11/2003 | Tsujino ................... 327/161 |
| 6,707,159 | B1 | 3/2004 | Kumamoto et al. |
| 6,725,316 | B1 * | 4/2004 | Gans .................... 710/307 |
| 6,732,203 | B2 * | 5/2004 | Kanapathippillai et al. .... 710/66 |
| 6,842,104 | B1 * | 1/2005 | Osaka et al. .............. 340/2.28 |
| 7,329,562 | B2 | 2/2008 | Kumamoto et al. |
| 2001/0054920 | A1 | 12/2001 | Tsujino |
| 2002/0004932 | A1 | 1/2002 | Shau |
| 2002/0167829 | A1 | 11/2002 | Friedman et al. |
| 2003/0002316 | A1 * | 1/2003 | Morita et al. ............ 365/63 |

(Continued)

FOREIGN PATENT DOCUMENTS

JP  58-86756 A  5/1983

(Continued)

*Primary Examiner* — Ly D Pham
(74) *Attorney, Agent, or Firm* — Arent Fox LLP

(57) ABSTRACT

In a semiconductor apparatus of the present invention, a plurality of circuit components are provided. A first bus interconnects the circuit components. A second bus interconnects the circuit components. A switching unit outputs a select signal that causes each circuit component to select one of the first bus and the second bus when transmitting a signal from one of the circuit components to another. The second bus has a size larger than a size of the first bus.

9 Claims, 45 Drawing Sheets

U.S. PATENT DOCUMENTS

2003/0031066 A1 * 2/2003 Yanagisawa et al. ......... 365/200

FOREIGN PATENT DOCUMENTS

| | | |
|---|---|---|
| JP | 8-031982 A | 2/1996 |
| JP | 11-40746 A | 2/1999 |
| JP | 2000-223319 A | 8/2000 |
| JP | 2000-243771 A | 9/2000 |
| JP | 2002-15569 | 1/2002 |

* cited by examiner

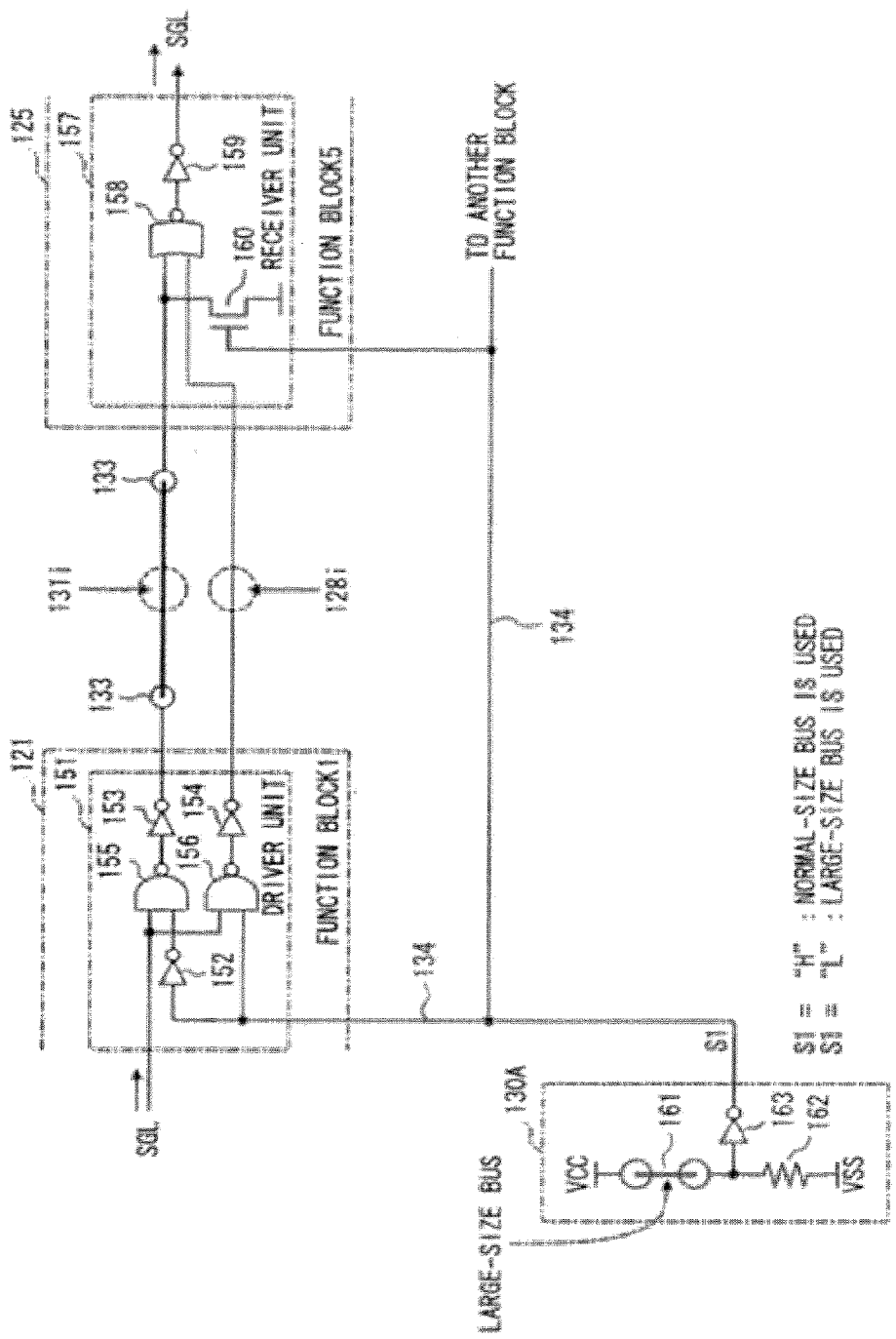

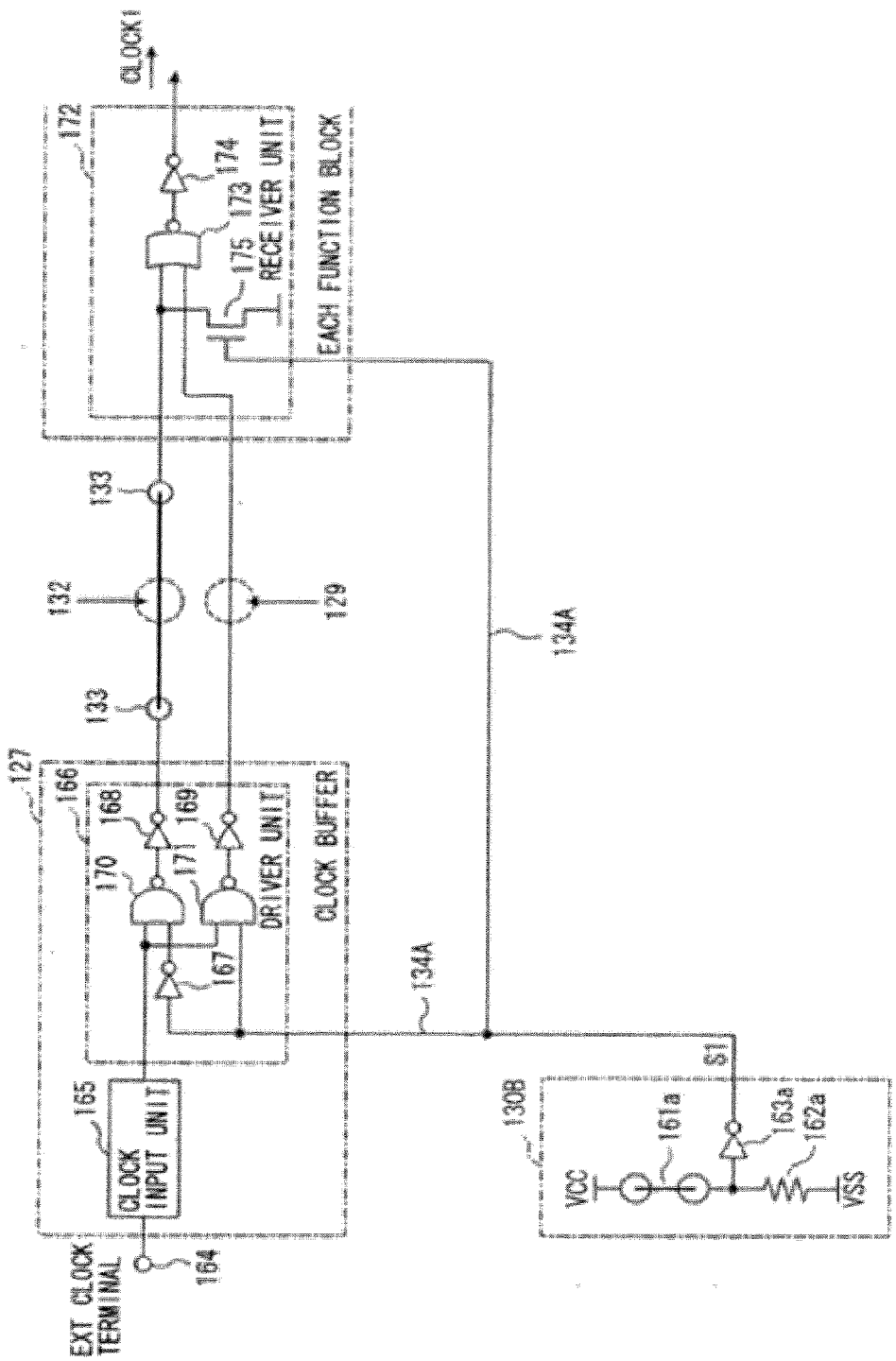

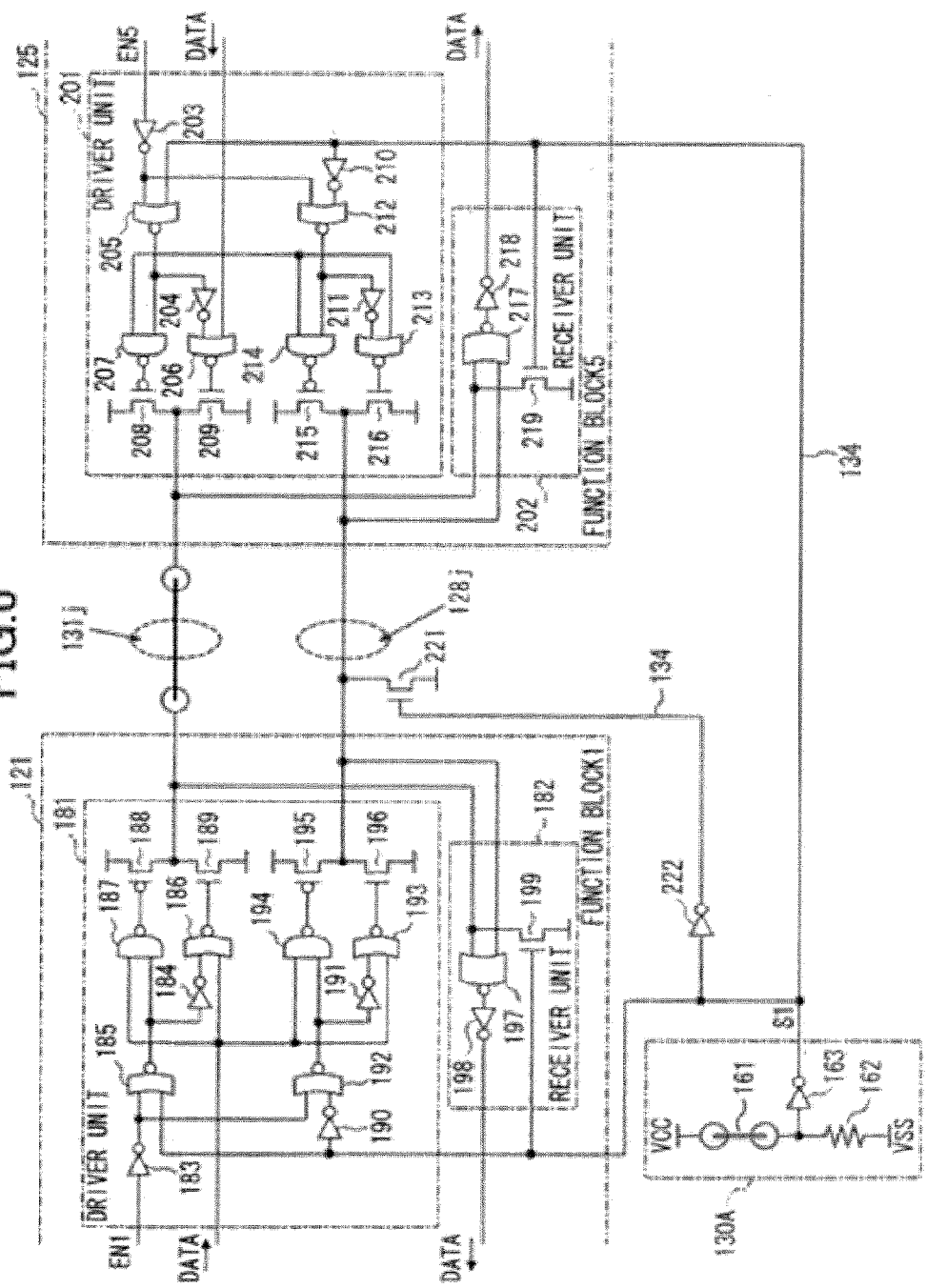

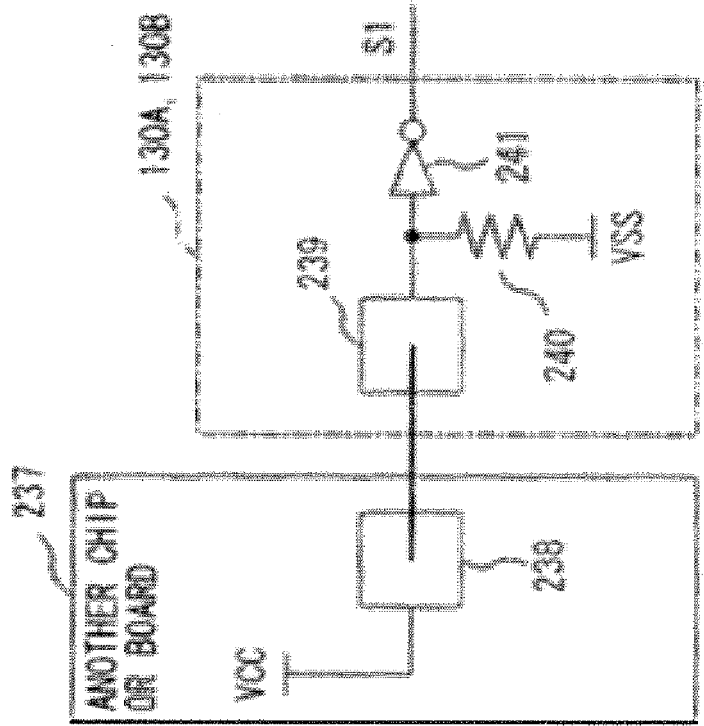

FIG. 34A
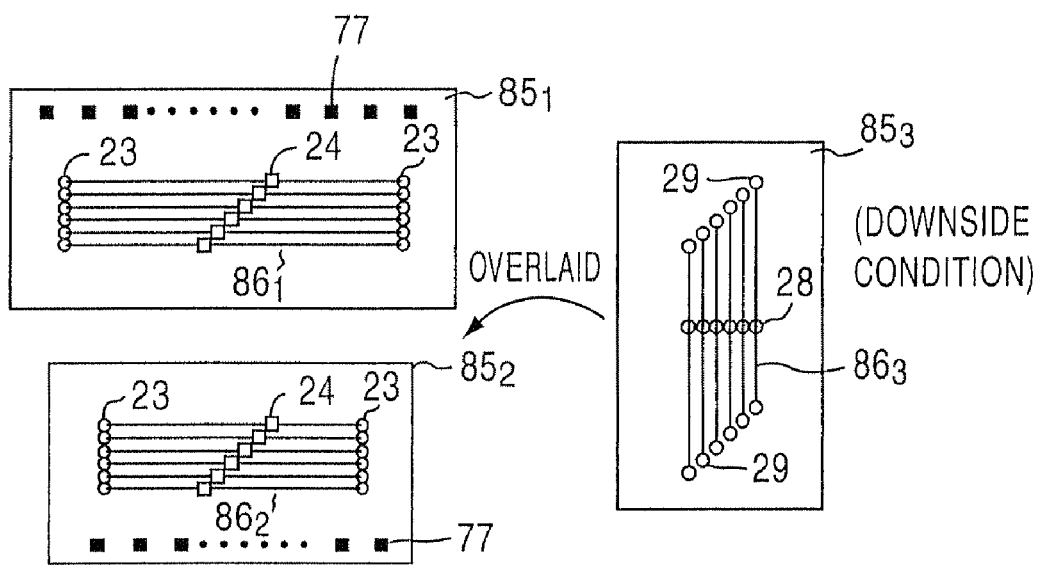
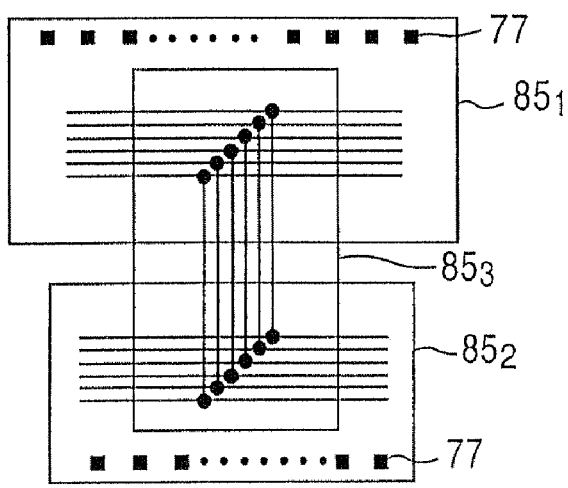
AFTER ASSEMBLY
FIG. 34B
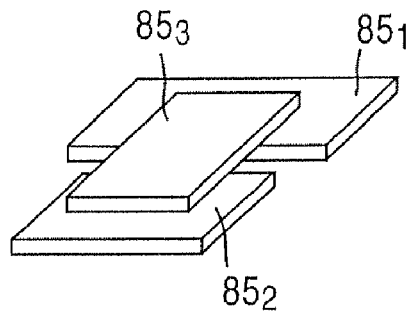

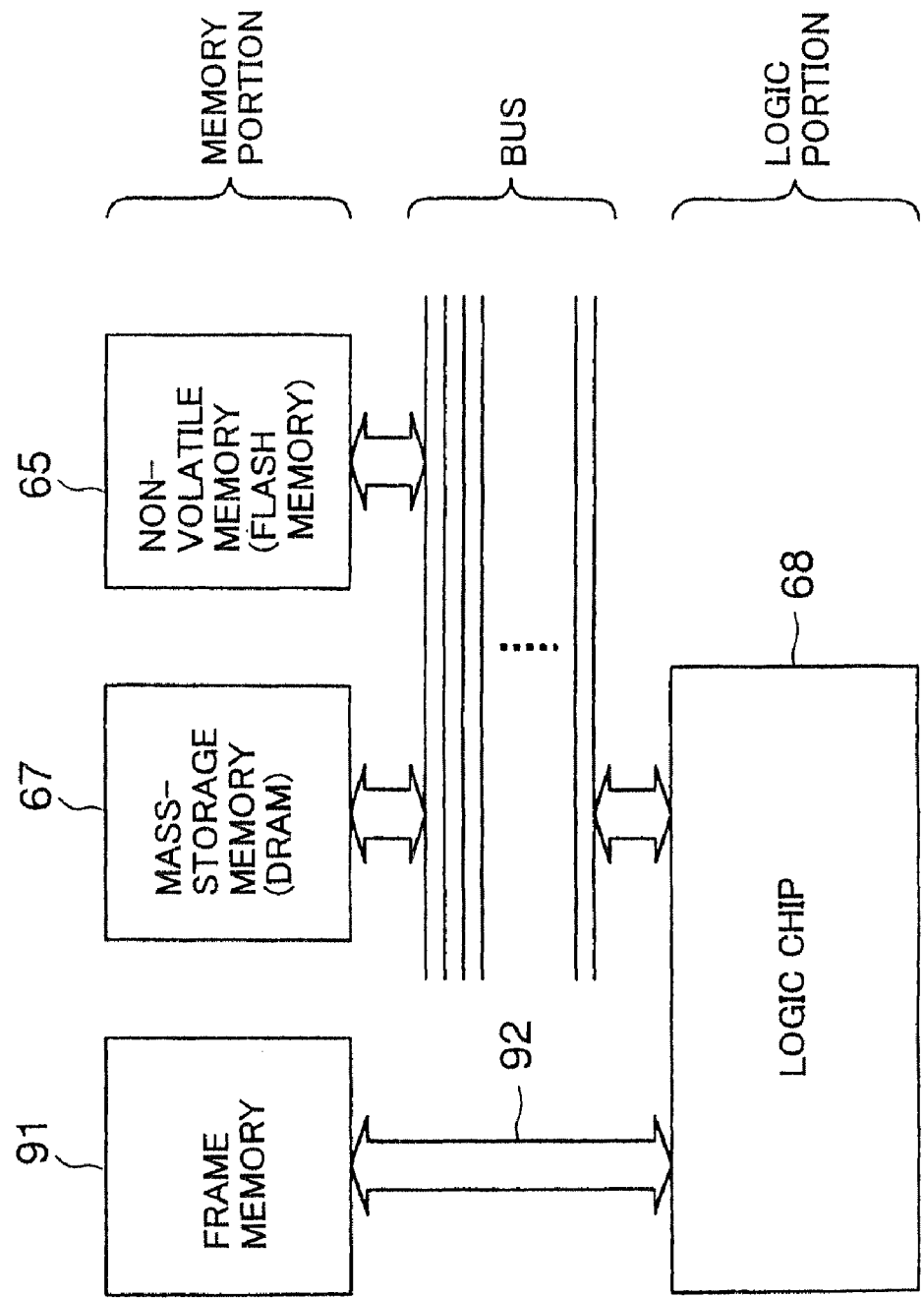

SINGLE-BIT SEMICONDUCTOR APPARATUS

MULTI-BIT SEMICONDUCTOR APPARATUS

SEMICONDUCTOR APPARATUS HAVING A LARGE-SIZE BUS CONNECTION

CROSS-REFERENCE TO RELATED APPLICATION

This is a divisional application which claims the benefit of U.S. patent application Ser. No. 11/143,649, filed Jun. 3, 2005, now U.S Pat. No. 7,317,241 which in turn is a Divisional application of Parent application Ser. No. 10/766,890, filed Jan. 30, 2004 now U.S. Pat. No. 6,936,874 B2, which in turn is a Divisional application of Parent application Ser. No. 09/956,973, filed Sep. 21, 2001, now U.S. Pat. No. 6,727,533 B2 the entire specification claims and drawings of which are incorporated herewith by reference.

BACKGROUND OF THE INVENTION

1. Field of the Invention

The present invention generally relates to a semiconductor apparatus, and more particularly to a semiconductor apparatus having a large-size bus connection (super connection) which attention is currently focused on.

2. Description of the Related Art

A large-size bus connection (supper connection) is a wiring technology that employs a large-size bus wiring layer having a comparatively large width in a range of 5 ■ ■ ■ to 10 ■ ■. The large-size bus connection is expected to make it possible to provide a high-speed operation of semiconductor apparatus with low power consumption.

The large-size bus connection has the following advantages over a normal-size bus connection that is formed in a conventional semiconductor apparatus through micromachining:

1) it provides a small electrical resistance because the width of the wiring layer is large, 2) it provides a small parasitic capacity because the interlayer distance between the bulk and the insulating layer and the wiring intervals of the large-size bus connection are large, and 3) it is suited for a high-speed operation of semiconductor devices because the time constant of the large-size bus is very small.

The packaging areas of semiconductor devices have been reduced on a yearly basis, and high-density implementation methods, such as ball-grid array (BGA), have been developed. When the BGA method is used, the bumps are arrayed on the surface of a semiconductor chip. The re-wiring method is provided to connect the bumps with the integrated circuit of the semiconductor chip. The re-wiring method employs a wiring layer including a pattern of wiring on the resin layer, such as polyimide resin, which is provided on the chip surface. The wiring layer, used in the re-wiring method, has a relatively large width, and it may be considered the large-size bus connection.

Further, a multi-chip semiconductor apparatus in which a logic device and a memory device coexist is known. For example, in the multi-chip semiconductor apparatus, the memory chip is overlaid onto the logic chip, and the connection of the memory device and the logic device is established by using the large-size bus wiring layer in the rewiring method, such as the bumps or the like. The large-size bus connection is provided to connect together the I/O (input/output) devices of the two chips.

Each of the logic chip and the memory chip includes a plurality of blocks, and each block contains the internal circuits. The internal circuits of the blocks and the I/O device are interconnected by an internal bus of each of the logic chip and the memory chip. For the purpose of connection of various circuits, the internal bus of each chip in the multi-chip semiconductor apparatus has a relatively large length of the wiring. In a conventional multi-chip semiconductor apparatus, the internal buses of the chips are a normal-size bus that is formed by using a micromachining process, although the length of the wiring is increasing as the degree of integration grows. The parasitic capacity of the internal buses in the conventional multi-chip semiconductor apparatus is increased due to the use of the normal-size bus connection, which will lower the operating speed of the apparatus and increase the power consumption of the apparatus. Hence, it is difficult for the conventional multi-chip semiconductor apparatus to provide a high-speed operation with low power consumption if the degree of integration of the circuits in the chip grows.

SUMMARY OF THE INVENTION

An object of the present invention is to provide a semiconductor apparatus that operates at a high speed with low power consumption by using the large-size bus connection as the signal transmission line between the circuit components of the chip.

Another object of the present invention is to provide a semiconductor apparatus that has a large-size bus wiring structure configured to suit to both the wafer test conducted before formation of the large-size bus connection and the chip test or operating test conducted after the formation of the large-size bus connection.

Another object of the present invention is to provide a multi-chip semiconductor apparatus that operates at a high speed with low power consumption by using the large-size bus connection as the signal transmission line between the circuit components of the chip.

Another object of the present invention is to provide a semiconductor apparatus that provides flexibility of the layout of the circuit components by using the large-size bus connection.

The above-mentioned objects of the present invention are achieved by a semiconductor apparatus having circuit components, the semiconductor apparatus comprising: a first bus which interconnects the circuit components; a second bus which interconnects the circuit components; and a switching unit which outputs a select signal that causes each circuit component to select one of the first bus and the second bus when transmitting a signal from one of the circuit components to another, the second bus having a size larger than a size of the first bus.

The above-mentioned objects of the present invention are achieved by a semiconductor apparatus having circuit components, the semiconductor apparatus comprising: a first bus which interconnects the circuit components; a second bus which interconnects the circuit components; and a switching unit which outputs a select signal that causes each circuit component to select one of the first bus and the second bus when transmitting a signal from one of the circuit components to another, the switching unit being configured such that the first bus is selected only when a wafer test is conducted before formation of the second bus, and the second bus is selected at any time the semiconductor apparatus operates after the wafer test is conducted.

The above-mentioned objects of the present invention are achieved by a multi-chip semiconductor apparatus in which a first chip and a second chip coexist and each of the first and second chips includes circuit components, one of the first and second chips comprising: a first wiring layer which is provided on a semiconductor substrate; a second wiring layer which is provided on an insulating layer covering the first wiring layer, the second wiring layer including conductive lines each interconnecting the circuit components of said one of the first and second chips; a plurality of first electrodes which are provided in the first wiring layer; and a second electrode which is provided on each of the conductive lines, each conductive line being configured to interconnect the plurality of first electrodes and the second electrode.

The above-mentioned objects of the present invention are achieved by a semiconductor apparatus comprising: an external terminal; a first internal circuit connected to the external terminal via a first contact; a second internal circuit connected to the external terminal via a second contact; and a large-size bus connecting the external terminal to each of the first internal circuit and the second internal circuit, wherein the large-size bus is provided in a second wiring layer on an insulating layer covering a first wiring layer provided on a semiconductor chip, the second wiring layer contacting both the first and second contacts, and the external terminal being brought into contact with the second wiring layer, wherein the connection of the large-size bus enables the first internal circuit and the second internal circuit to be spaced apart each other.

In the semiconductor apparatus of one preferred embodiment of the invention, the large-size bus that has a size larger than a size of the normal-size bus is provided to interconnect the circuit components of the chip. The large-size bus connection to constitute the large-size bus has a small parasitic capacity and enables the operation at a low driving voltage, and it is possible to provide a high-speed operation of the semiconductor apparatus with low power consumption.

The multi-chip semiconductor apparatus of one preferred embodiment of the invention does not require the I/O devices that are needed to connect together the multiple chips as in the conventional multi-chip semiconductor apparatus. According to the multi-chip semiconductor apparatus of the present invention, the delay time is shortened and the power consumption is reduced.

Further, in the semiconductor apparatus of one preferred embodiment the invention, the large-size bus interconnects the circuit components via the external electrodes. The semiconductor apparatus of the present invention is effective in providing flexibility of the layout of the circuit components while providing high-speed operation with low power consumption.

BRIEF DESCRIPTION OF THE DRAWINGS

Other objects, features and advantages of the present invention will become apparent from the following detailed description when read in conjunction with the accompanying drawings.

FIG. 4 is a diagram for explaining a large-size bus signal line and a normal-size bus signal line through which an address signal and a control signal are transmitted in the semiconductor apparatus of FIG. 2.

FIG. 5 is a diagram for explaining a large-size bus signal line and a normal-size bus signal line through which a clock signal is transmitted in the semiconductor apparatus of FIG. 2.

FIG. 6 is a diagram for explaining a large-size bus signal line and a normal-size bus signal line through which a data signal is transmitted in the semiconductor apparatus of FIG. 2.

FIG. 7A, FIG. 7B, FIG. 7C and FIG. 7D are diagrams of variations of the switching units for use in the semiconductor apparatus of the present embodiment.

FIG. 34A and FIG. 34B are diagrams showing a fifteenth preferred embodiment of the multi-chip semiconductor apparatus of the invention.

FIG. 35 is a diagram for explaining another configuration of the LSI system.

DETAILED DESCRIPTION OF PREFERRED EMBODIMENTS

Before the preferred embodiments of the present invention are explained, a description will be given of a logic chip to which the present invention is applied, with reference to FIG. 1.

Figure 1:
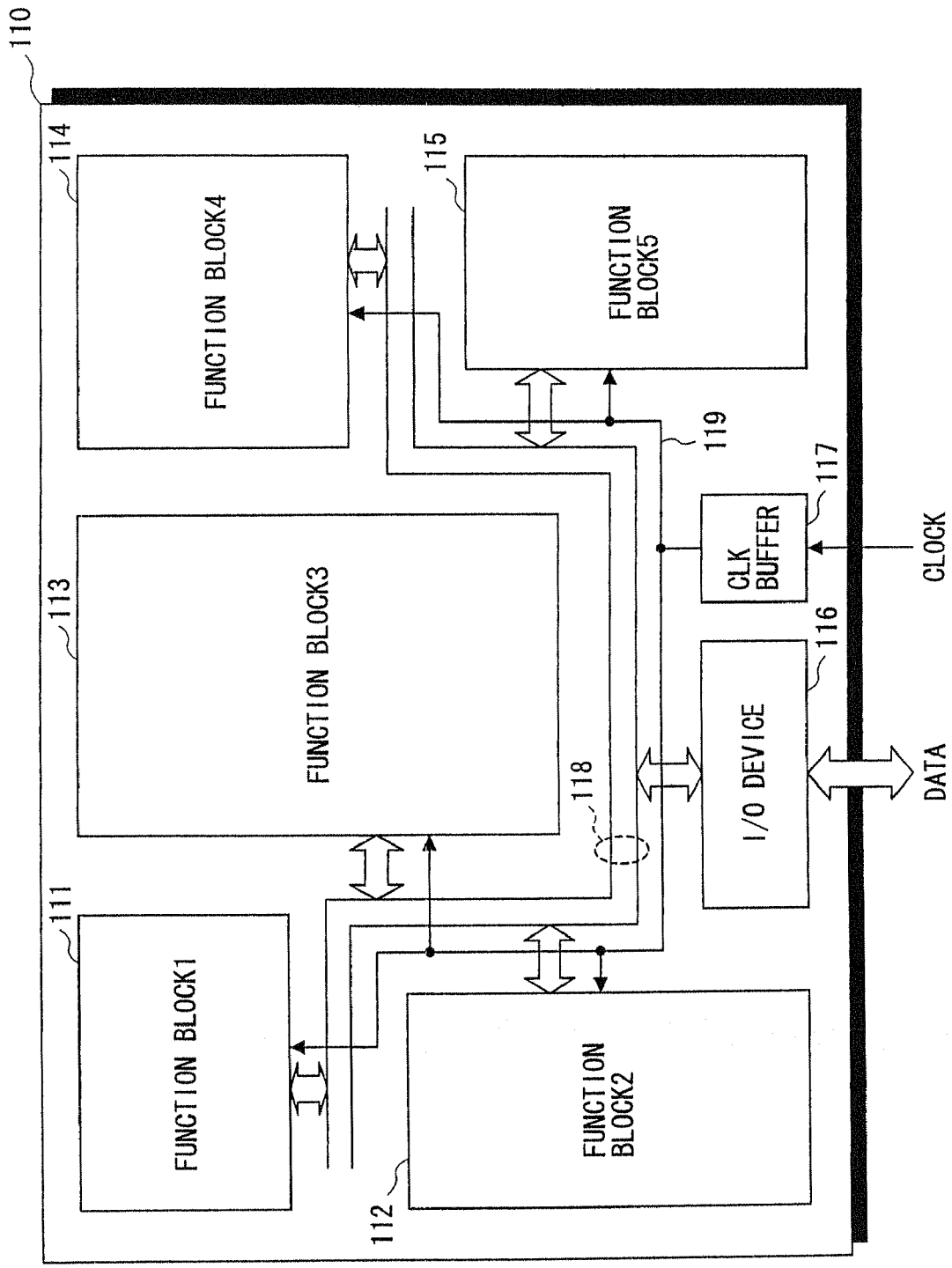
FIG. 1 is a block diagram of a logic chip.

FIG. 1 shows a configuration of a logic chip. As shown in FIG. 1, the logic chip 110 generally includes a plurality of function blocks 111 through 115, an I/O (input/output) device 116, and a clock buffer 117. Each of the function blocks 111 through 115 includes internal circuits. The I/O device 116 provides interface for the logic chip 110 with an external device. The clock buffer 117 retains an externally supplied clock signal and delivers the clock signal to the internal circuits. A bus 118 and a clock signal line 119 are provided to interconnect the function blocks 111 through 115, the I/O device 116 and the clock buffer 117 and to transmit a signal between the respective elements of the logic chip 110. The bus 118 serves to deliver a data signal, an address signal and a control signal between the respective elements of the logic chip 110. The clock signal line 119 serves to deliver the clock signal, output by the clock buffer 117, to the respective elements of the logic chip 110.

In a conventional semiconductor apparatus, the bus 118 and the clock signal line 119 are signal lines that are formed through micromachining. Among the signal lines of the logic chip 110, the bus 118 and the clock signal line 119 are relatively long signal lines. In one preferred embodiment of the semiconductor apparatus of the present invention, the large-size bus connection is applied to these relatively long signal lines.

Next, a description will be given of the preferred embodiments of the present invention.

Figure 2:
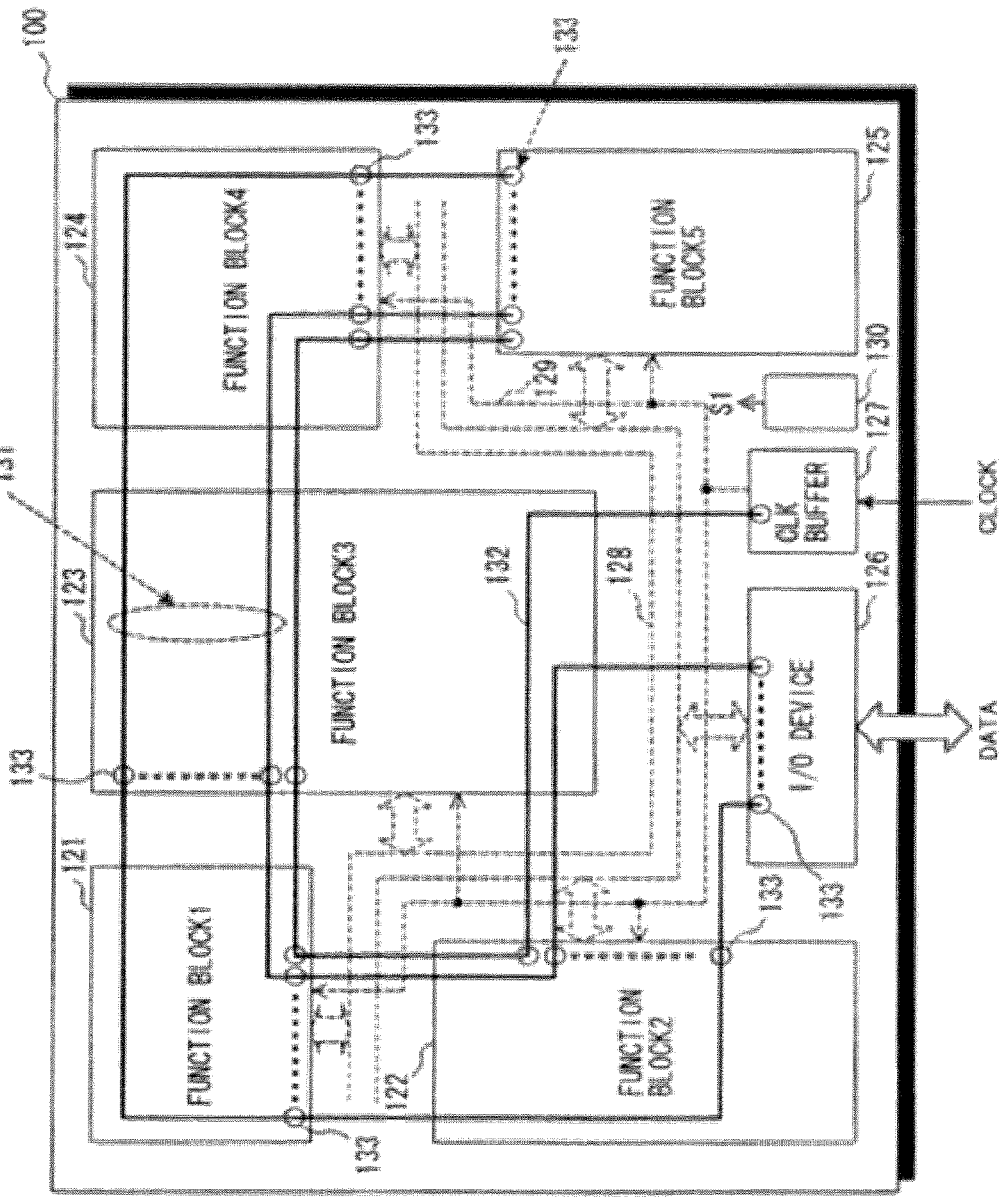
FIG. 2 is a block diagram of a first preferred embodiment of the semiconductor apparatus of the invention.

FIG. 2 shows a first preferred embodiment of the semiconductor apparatus of the invention.

As shown in FIG. 2, the semiconductor apparatus 100 of the present embodiment is a logic chip (or a logic device) that is similar to the logic chip 110 of FIG. 1. The semiconductor apparatus 100 generally includes a plurality of function blocks 121 through 125, an I/O device 126, and a clock buffer 127. Each of the function blocks 121 through 125 includes internal circuits. The I/O device 126 provides interface for the semiconductor apparatus 100 with an external device. The clock buffer 127 retains an externally supplied clock signal and delivers the clock signal to the internal circuits. A bus 128 and a clock signal line 129, which are indicated by the dotted lines in FIG. 2, are provided to interconnect the function blocks 121 through 125, the I/O device 126 and the clock buffer 127 and to transmit a signal between the respective elements of the semiconductor apparatus 100.

In the semiconductor apparatus 100 of FIG. 2, the bus 128 and the clock signal line 129 are essentially the same as the corresponding elements 118 and 119 of the logic chip 110 shown in FIG. 1. Namely, the bus 128 and the clock signal line 129 are relatively long signal lines that are formed through micromachining, (which are called the normal-size bus connection). The bus 128 and the clock signal line 129 are provided to interconnect the function blocks 121 through 125, the I/O device 126 and the clock buffer 127 and to transmit a signal between the respective elements of the semiconductor apparatus 100.

Further, the semiconductor apparatus 100 (the logic chip) of FIG. 2 is provided with a large-size bus 131, a clock signal line 132, and a switching unit 130. The large-size bus 131 and the clock signal line 132 are formed by using the large-size bus connection. In the semiconductor apparatus 100 of the present embodiment, the function blocks 121-125, the I/O device 126 and the clock buffer 127 are operated such that one of the normal-size bus 128 and the large-size bus 131 and one of the clock signal line 129 and the clock signal line 132 are selected in response to a select signal S1 output by the switching unit 130. The selected bus and the selected clock signal line are connected to each of the function blocks 121-125, the I/O device 126 and the clock buffer 127.

Figure 3:
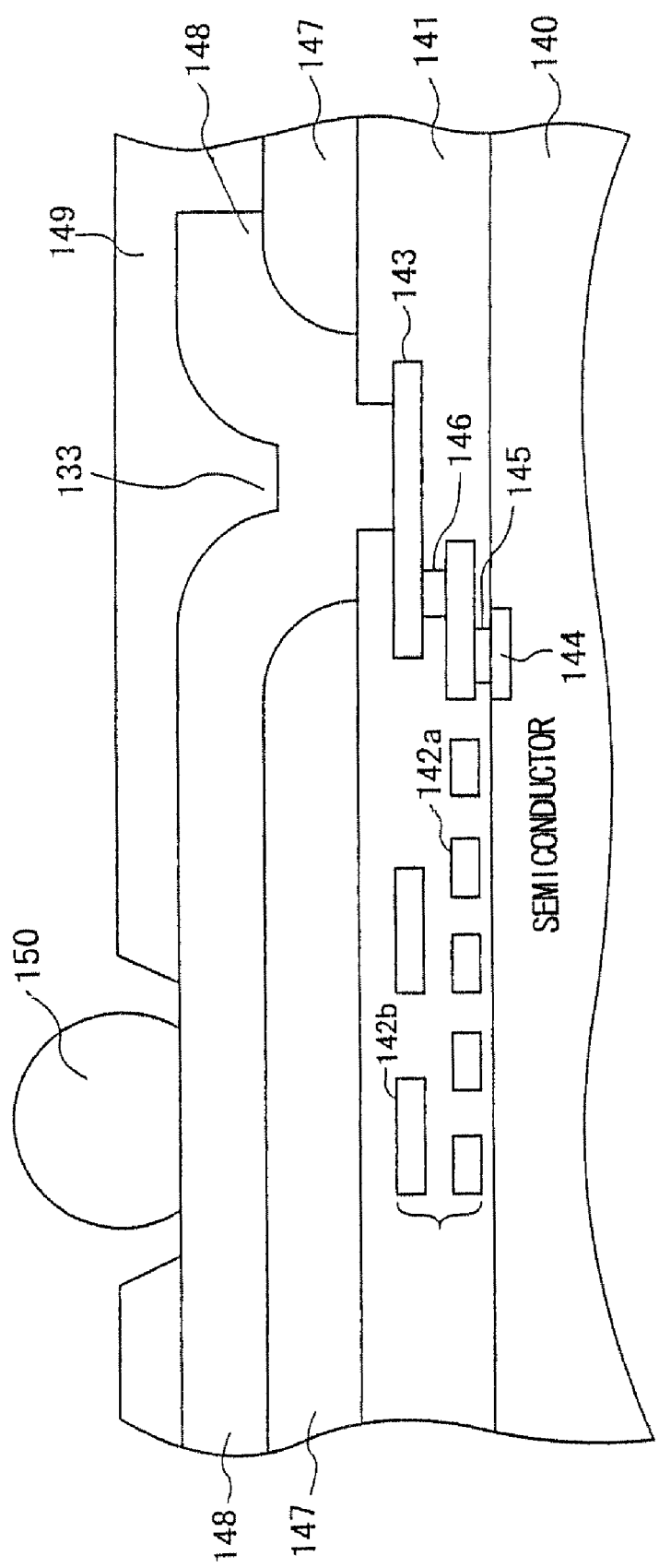
FIG. 3 is a cross-sectional view of the semiconductor apparatus of FIG. 2.

FIG. 3 is a cross-sectional view of the semiconductor apparatus of FIG. 2 for explaining the relationship between the normal-size bus 128 with the clock signal line 129 and the large-size bus 131 with the clock signal line 132.

As shown in FIG. 3, the multi-level wiring layer 142 is formed on the semiconductor substrate 140. The multi-level wiring layer 142 includes the wiring layer 142a and the wiring layer 142b. The wiring layers 142a and 142b are isolated from each other by an insulating layer of polyimide resin. Further, an insulating layer of polyimide resin is provided on the top surface of the upper wiring layer 142b. For the sake of convenience, the insulating layers of the multi-level wiring layer 142 are collectively designated by reference numeral 141.

In the semiconductor apparatus shown in FIG. 3, the bus 128 and the clock signal line 129 are provided in the multi-level wiring layer 142. These signal lines are the normal-size bus connection formed through micromachining.

Further, in the semiconductor apparatus of FIG. 3, the multi-level wiring layer 142 includes the electrode 143 which is connected to the wiring layers 142a and 142b. The electrode 143 is electrically connected to the diffusion layer 144 via the contacts 145 and 146 and the intermediate wiring layer. The diffusion layer 144 is formed on the semiconductor substrate 140.

Further, in the semiconductor apparatus of FIG. 3, the large-size bus wiring layer 148 is provided on the insulating layer 147. The large-size bus 131 and the clock signal line 132 are provided in the large-size bus wiring layer 148. The wiring layer 148 includes the contact 133 that is coupled to the electrode 143. The electrode 143 is exposed to the wiring layer 148 at the contact hole which is formed in the insulating layer 141. The wiring layer 148 enters the insulating layers 141 and 147 at the contact hole so that the contact 133 is electrically connected to the electrode 143. The large-size bus wiring layer 148 is larger in width and thickness than the wiring layers 142a and 142b of the multi-level wiring layer 142. For example, the large-size bus wiring layer 148 has a width in a range of 5 ■ ■ ■ to 10 ■ ■.

In the semiconductor apparatus of FIG. 3, the cover layer 149 is provided on the large-size bus wiring layer 148. The cover layer 149 includes an opening (or a through hole) where the large-size bus wiring layer 148 is exposed. The electrode 150 is provided at the opening of the cover layer 149, and the electrode 150 is used to connect the large-size bus 131 (or the clock signal line 132) with another chip provided on the wiring layer 148. The electrode 150 is constructed, for example, in the form of the bump.

In the above-described embodiment, the electrode 150 is provided when forming a multi-chip semiconductor apparatus. The electrode 150 of the semiconductor apparatus 100 is connected to the electrode of another chip. When there is no need to form the multi-chip semiconductor apparatus, the electrode 150 may be omitted from the semiconductor apparatus 100. In such embodiment, the large-size bus wiring layer 148 is fully covered with the cover layer 149.

As shown in FIG. 2, in the semiconductor apparatus 100 of the present embodiment, the respective signal lines of the large-size bus 131 and the clock signal line 132 are connected to each of the function blocks 121-125 via the contacts 133. The respective signal lines of the large-size bus 131 are connected to the I/O device 126 via the contacts 133. Further, the clock signal line 132 is connected to the clock buffer 127 via the contact 133.

FIG. 4 shows a large-size bus signal line and a normal-size bus signal line through which an address signal and a control signal are transmitted in the semiconductor apparatus of FIG. 2.

In FIG. 4, the signal line 128i as one of the signal lines of the normal-size bus 128 and the signal line 131i as one of the signal lines of the large-size bus 131 are provided to transmit the address signal and the control signal between the function blocks 121 and 125 in the semiconductor apparatus 100.

The normal-size bus 128 and the large-size bus 131 may include the signal lines through which the signal is transmitted in one direction only and the signal lines through which the signal is bi-directionally transmitted. The signal lines 128i and 131i, shown in FIG. 4, are the signal lines through which the signal is transmitted in one direction only. For example, a control signal or an address signal is transmitted through the signal lines in one direction only.

As shown in FIG. 4, the function block 121 includes a driver unit 151, and the driver unit 151 sends the signal SGL, supplied from the internal circuit of the function block 121, to the selected one of the signal line 128i and the signal line 131. A bus switching unit 130A is provided in the switching unit 130 in FIG. 2. The switching unit 130A outputs a select signal S1 to the driver 151 via the control line 134, and the selected one of the signal line 128i and the signal line 131 is determined according to the high/low level of the select signal S1 output by the switching unit 130A.

The driver unit 151 includes an inverter 152, an inverter 153, an inverter 154, an NAND gate 155 and an NAND gate 156. When the select signal S1 received at the drive unit 151 is set at the high level ("H"), the NAND gate 156 is set in the active state and the NAND gate 155 is set in the inactive state. In this case, the signal SGL is delivered to the signal line 128i of the normal-size bus 128 through the NAND gate 156 and the inverter 154. On the other hand, when the select signal S1 received at the drive unit 151 is set at the low level ("L"), the NAND gate 155 is set in the active state and the NAND gate 156 is set in the inactive state. In this case, the signal SGL is delivered to the signal line 131i of the large-size bus 131 through the NAND gate 155 and the inverter 153.

As shown in FIG. 4, the switching unit 130A includes a large-size bus 161, a resistor 162 and an inverter 163. The large-size bus 161 and the resistor 162 are connected in series, and the power source voltage VCC and the ground voltage VSS are supplied to the ends of the large-size bus 161 and the resistor 162. When the large-size bus 161 is not formed in the switching unit 130A, the input of the inverter 63 is at the level of the ground voltage VSS. The select signal S1 output by the switching unit 130A in this condition is set at the high level ("H"). When the large-size bus 161 is provided in the switching unit 130A, the input of the inverter 63 is at the level of the power source voltage VCC. The select signal S1 output by the switching unit 130A in this condition is set at the low level ("L").

Further, as shown in FIG. 4, the function block 125 has a receiver unit 157 which includes an NOR gate 158, an inverter 159 and a field-effect transistor (FET) 160. The FET 160 is, for example, an n-channel metal-oxide semiconductor (MOS) transistor. When the select signal S1 received at the receiver unit 157 is set at the high level ("H"), the transistor 160 is set in ON state, and the signal line 128i of the normal-size bus 128 is selected. On the other hand, when the select signal S1 is set at the low level ("L"), the transistor 160 is set in OFF state, and the signal line 131i of the large-size bus 131 is selected.

In the receiver unit 157, the inverter 159 outputs the signal SGL, received from the selected one of the signal line 128i and the signal line 131i, to the internal circuit (not shown) of the function block 125.

By taking the wafer test and the chip test of the semiconductor apparatus into consideration, the switching operation of the switching unit 130A is carried out as follows.

The wafer test is conducted by using a wafer probe, in order to determine whether the chip on the wafer after the pattern is formed on the wafer is rejected or accepted. When the chip is determined as being rejected, the defective portion of the chip is repaired by using a redundant means that is provided in advance. At that time, the fuse is cut off by irradiation of a laser beam. The fuse is disposed in the multi-level wiring layer 142 in FIG. 4, and it is exposed from the opening (the window for repair) which is provided in the insulating layer 141. The wafer test must be performed before the forming of the large-size bus connection is performed. If the insulating layer 47 is formed on the insulating layer 141 and the large-size bus wiring layer 148 is formed thereon, the window for repair is concealed.

Before the large-size bus wiring layer 148 is formed in the semiconductor apparatus, the signal line 131i of the large-size bus 131 shown in FIG. 4 is not yet formed. In addition, the large-size bus 161 is not formed in the switching unit 130A. Hence, in such condition, the select signal S1 is set at the high level ("H"), and the signal line 128i of the normal-size bus 128 is selected.

After the wafer test is conducted, the large-size bus wiring layer 148 in FIG. 3 and the large-size bus 161 in FIG. 4 are formed in the semiconductor apparatus. As the large-size wiring layer 148 becomes the final wiring of the semiconductor apparatus, the chip test must be conducted after the large-size bus wiring layer 148 is formed. At that time, the signal line 128i of the normal-size bus 128 is no longer needed. If the signal line 128i connected to the circuit components of the semiconductor apparatus is left unchanged, the parasitic capacity thereof is attached to the signal line 131i of the large-size bus 131, which may increase the power consumption of the semiconductor apparatus.

As described above, after the wafer test is conducted, the large-size bus 161 is formed in the switching unit 130A in FIG. 4. When the chip test is conducted, the select signal S1, output by the switching unit 130A, is set at the low level ("L"). The signal line 131*i* of the large-size bus 131 is selected. As the large-size bus 161 is permanently provided in the switching unit 130A, the signal line 131*i* is always selected. The large-size bus connection has the above-described advantages over the normal-size bus connection, and, therefore, the semiconductor apparatus 100 of the present embodiment (FIG. 2) is effective in providing high-speed operation with low power consumption. The delay time as in the conventional semiconductor apparatus is shortened because of the use of the large-size bus connection.

FIG. 5 shows a large-size bus clock signal line and a normal-size bus clock signal line through which a clock signal is transmitted in the semiconductor apparatus of FIG. 2.

As shown in FIG. 5, the large-size bus clock signal line 132 and the normal-size bus clock signal line 129 are provided between the clock buffer 127 and one of the function blocks 121-125 in the semiconductor apparatus 100. The clock signal is delivered on a selected one of the clock signal lines 128 and 132 from the clock buffer 127 to each of the function blocks 121-125 in one direction only.

The clock buffer 127 includes a clock input unit 165 and a driver unit 166. The clock input unit 165 is connected to an external clock terminal 164. The driver unit 166 includes an inverter 167, an inverter 168, an inverter 169, an NAND gate 170, and an NAND gate 171. Each of the function blocks 121 to 125 includes a receiver unit 172, and the receiver unit 172 includes an NOR gate 173, an inverter 174, and an n-channel transistor 175.

A clock signal line switching unit 130B is provided in the switching unit 130 in FIG. 2. The switching unit 130B has the configuration that is the same as the configuration of the switching unit 130A in FIG. 4. Namely, as shown in FIG. 5, the switching unit 130B includes a large-size bus 161*a*, a resistor 162*a* and an inverter 163*a*. In the embodiments of FIG. 4 and FIG. 5, the bus switching unit 130A and the clock signal switching unit 130B are provided separately, and the control signal line 134 and the control signal line 134A are connected separately. Alternatively, one of the switching units 130A and 130B as well as one of the control signal lines 134 and 134A may be provided for both the purposes of the bus switching and the clock signal line switching.

Similar to the previous embodiment of FIG. 4, in the embodiment of FIG. 5, the driver unit 166 and the receiver unit 172 select the normal-size bus clock signal line 129 when the select signal S1 output by the switching unit 130B is set at the high level ("H"). On the other hand, when the select signal S1 is set at the low level ("L"), the driver unit 166 and the receiver unit 172 select the large-size bus clock signal line 132.

FIG. 6 is a diagram for explaining a large-size bus signal line and a normal-size bus signal line through which a data signal is transmitted in the semiconductor apparatus of FIG. 2.

In FIG. 6, the data signal line 128*j* as one of the signal lines of the normal-size bus 128 and the data signal line 131*j* as one of the signal lines of the large-size bus 131 are provided to transmit the data signal DATA between the function blocks 121 and 125 in the semiconductor apparatus 100.

The data signal DATA is bi-directionally transmitted on one of the data signal lines 128*j* and 131*j* between the respective function blocks 121 to 125. In the embodiment of FIG. 6, only the function blocks 121 and 125 are shown. Each of the function blocks 121 to 125 includes both the driver unit and the receiver unit with respect to each of the data signal lines provided in the semiconductor apparatus 100. Specifically, in the embodiment of FIG. 6, the function block 121 includes a driver unit 181 and a receiver unit 182, and the function block 125 includes a driver unit 201 and a receiver unit 202.

In the function block 121, the driver unit 181 includes an inverter 183, an inverter 184, an inverter 190, an inverter 191, an NAND gate 187, an NAND gate 199, an NOR gate 185, an NOR gate 186, an NAND gate 192, an NAND gate 193, a p-channel transistor 188, a p-channel transistor 195, an n-channel transistor 189, and an n-channel transistor 196. The receiver unit 182 includes an NOR gate 197, an inverter 198 and an n-channel transistor 199.

The driver unit 181 is set in the active state when the enable signal EN1, which is set at the high level ("H"), is received from the internal circuit of the function block 121. When the select signal S1 output by the switching unit 130A is set at the high level ("H"), the select signal S1 received at the NOR gate 192 is set at the low level ("L"), and the NOR gate 192 is set in the active state. In this case, the select signal received at the NOR gate 185 is set at the high level ("H"), and the NOR gate 185 is set in the inactive state. The transistors 195 and 196 are driven in accordance with the value of the data signal DATA. The driver unit 181 outputs the data signal DATA to the data signal line 128*j* of the normal-size bus 128.

When the select signal S1 output by the switching unit 130A is set at the high level ("H"), the inverter 222 outputs the low-level select signal S1, the n-channel transistor 221 connected to the data signal line 128*j* is set in OFF state.

When the select signal S1 output by the switching unit 130A is set at the low level "L" at the time of receiving the high-level enable signal EN1 from the internal circuit of the function block 121, the NOR gate 185 is set in the active state while the NOR gate 192 is set in the inactive state. In this case, the transistors 188 and 189 are driven in accordance with the value of the data signal DATA. The driver unit 181 outputs the data signal DATA to the data signal line 131*j* of the large-size bus 131.

When the select signal S1 output by the switching unit 130A is set at the low level ("L"), the inverter 222 outputs the high-level select signal S1. The n-channel transistor 221, connected to the data signal line 128*j*, is set in ON state. The data signal line 128*j* of the normal-size bus 128 is set at the level of the ground voltage VSS.

Similar to the function block 121 described above, in the function block 125, the driver unit 201 includes an inverter 203, an inverter 204, an inverter 210, an inverter 211, an NAND gate 207, an NAND gate 214, an NOR gate 205, an NOR gate 206, an NAND gate 212, an NAND gate 213, a p-channel transistor 208, a p-channel transistor 215, an n-channel transistor 209, and an n-channel transistor 216. The receiver unit 202 includes an NOR gate 217, an inverter 218 and an n-channel transistor 219. The operations of the driver unit 201 and the receiver unit 202 are essentially the same as the operations of the above-described driver unit 181 and the receiver unit 182.

Further, the function blocks 122, 123 and 124, other than the function blocks 121 and 125, are configured in the same manner.

FIG. 7A, FIG. 7B, FIG. 7C and FIG. 7D show variations of the switching units for use in the semiconductor apparatus of the present embodiment. The bus switching unit 130A and the clock signal line switching unit 130B, which are described above with reference to FIG. 4 and FIG. 5, may be configured as shown in FIG. 7A, FIG. 7B, FIG. 7C and FIG. 7D.

Figure 7A:
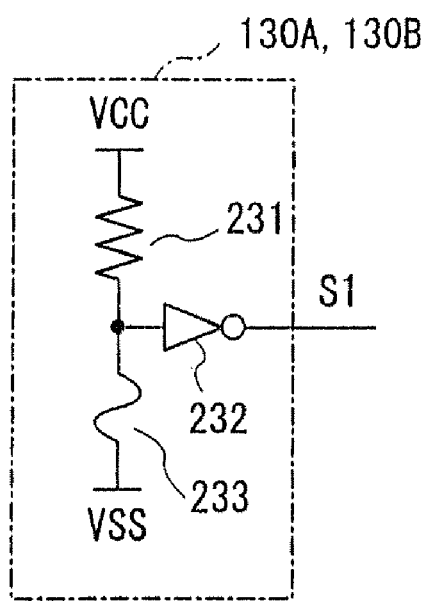

In the embodiment of FIG. 7A, the switching unit 130A or 130B includes a resistor 231, an inverter 232, and a fuse 233.

The power source voltage VCC and the ground voltage VSS are supplied to the ends of the resistor 231 and the fuse 233. When the fuse 233 connects the resistor 231 with the ground voltage VSS, the select signal S1 output by the switching unit is set at the high level ("H"). When the fuse 233 is cut off, the select signal S1 is set at the low level ("L").

Figure 7B:
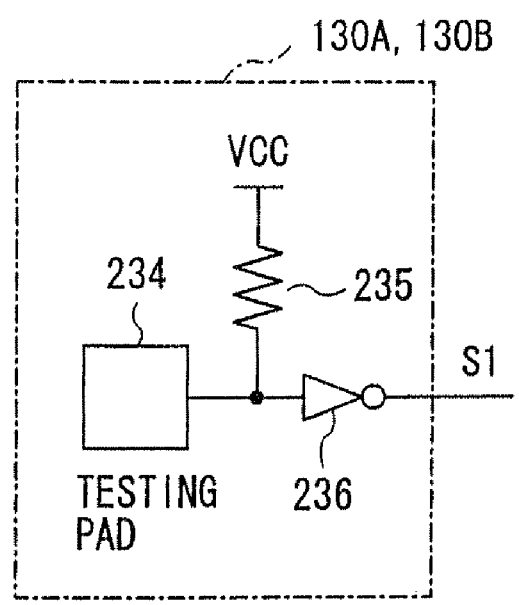

In the embodiment of FIG. 7B, the switching unit 130A or 130B includes a testing pad 234, a pull-up resistor 235, and an inverter 236. The power source voltage VCC is supplied to the end of the pull-up resistor 235. Before the large-size bus connection is formed, the testing pad 234 is contacted by the test probe so as to set the testing pad 234 at the level of the ground voltage VSS. In this condition, the select signal S1 output by the switching unit is set at the high level ("H"). When the testing pad 234 is set in the open state, the select signal S1 is set at the low level ("L").

In the embodiment of FIG. 7C, the switching unit 130A or 130B includes an electrode 239, a resistor 240, and an inverter 241. The electrode 239 is a terminal for external connection. For example, the electrode 239 is formed by the electrode 150 in FIG. 3. When the semiconductor apparatus 100 and another chip (or board) 237 are connected together, the electrode 239 is connected to the electrode 238 of the chip 237. For example, the chip 237 is overlaid onto the semiconductor apparatus 100, the electrode 238 contacts the electrode 239. The source power voltage VCC, supplied to the electrode 238 in the chip 237, is supplied to the electrode by the connection of the electrodes 238 and 239. In this condition, the select signal S1, output by the inverter 241 of the switching unit, is set at the high level ("L"). In other words, when the semiconductor apparatus 100 is in the usable condition, the large-size bus and the large-size bus clock signal line are selected.

In the embodiment of FIG. 7D, the switching unit 130A or 130B is constructed by a mode selection circuit. For example, the mode selection circuit is provided in a DRAM chip. The mode selection circuit sets the operating mode of the internal circuit in response to the externally supplied command signal or address signal. By using the mode selection circuit, the setting of the select signal S1 at one of the high level or the low level is established.

The switching units 130A and 130B shown in FIG. 4 through FIG. 7A are the circuits that are configured by using a programmable device.

Figure 8:
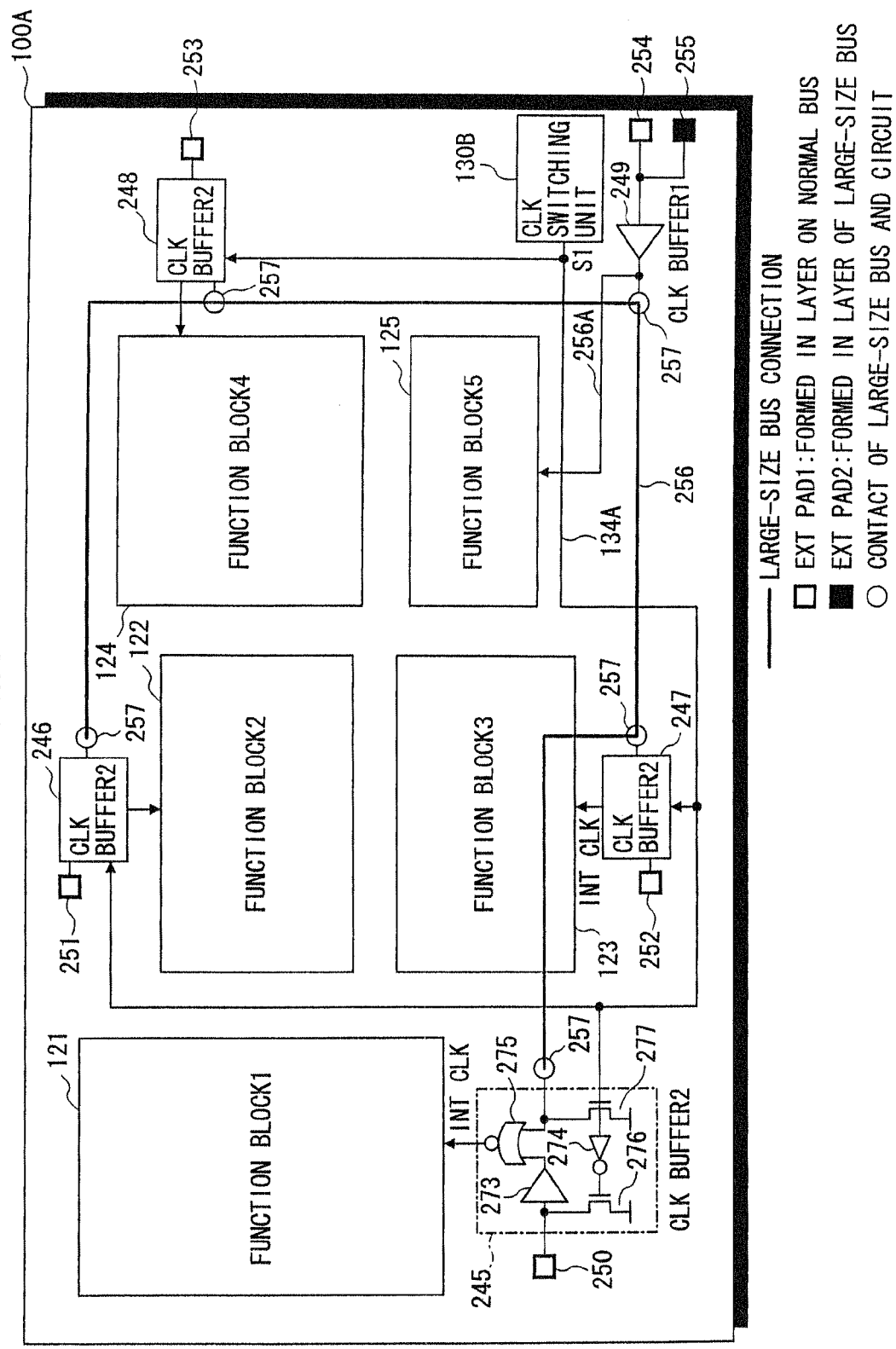
FIG. 8 is a block diagram of a second preferred embodiment of the semiconductor apparatus of the invention.

Next, FIG. 8 shows a second preferred embodiment of the semiconductor apparatus of the invention.

The semiconductor apparatus 100A of the present embodiment is configured such that the timing of operation using the large-size bus connection during the chip test after the formation of the large-size bus connection matches with the timing of operation using the normal-size bus connection during the wafer test with no considerable difference.

As shown in FIG. 8, the function blocks 121 through 125 respectively include the clock buffers 245 through 249. The clock buffer 249 has a configuration that is different from the configuration of other clock buffers 245-248, which will be described later. External connection pads (electrodes) 250 through 254 are respectively connected to the clock buffers 245 through 249. The pads 250-254 are disposed in the vicinity of the function blocks 121-125.

The large-size bus clock signal line 256 and the control line 134A are connected to each of the clock buffers 245-248. The clock signal line 256 is connected to the function blocks 121-125 via the contacts 257. Each of the clock buffers 245-248 selects one of the clock signal externally supplied from the pads 250-253 and the clock signal externally supplied via the large-size bus clock signal line 256, in accordance with the level of the select signal S1 output by the switching unit 130B. Each of the clock buffers 245-248 outputs the selected clock signal to one of the function blocks 121-124 as the internal clock signal.

The pads 250-254 are formed in the normal-size bus wiring layer, and they correspond to the electrode 143 shown in FIG. 3. Similar to the pads 250-254, the pad 255 receives the externally supplied clock signal, but the pad 255 is formed in the large-size bus wiring layer. The pad 255 corresponds to the electrode 150 shown in FIG. 3. The electrode 150 in FIG. 3 is formed as the bump, but the pad 255 in this embodiment may be formed into a flat-surface electrode.

As shown in FIG. 8, the pads 254 and 255 are disposed in the vicinity of the function block 125. The externally supplied clock signal is delivered to the function block 125 via the clock buffer 249 and the clock signal line 256A. In the present embodiment, when the wafer test is conducted before the formation of the large-size bus connection, the clock signal received at the pad 254 is sent to the function block 125, and the chip test or the operating test is conducted after the formation of the large-size bus connection, the clock signal received at the pad 255 is sent to the function block 125. The clock signal line 256A in this embodiment is adequately short, and the timing of operation of the function block 125 using the large-size bus connection during the chip test or the operating test after the formation of the large-size bus connection matches with the timing of operation of the function block 125 using the normal-size bus connection during the wafer test with no considerable difference.

During the wafer test, the external clock signals received at the pads 250-253 are respectively delivered to the function blocks 121-124 via the clock buffers 245-248 at the same timing. The select signal S1 at this time is set at the high level ("H"). During the chip test after the formation of the large-size bus connection, the select signal S1 is set at the low level ("L"). In this case, the external clock signal received at the pad 255 is sent to the function blocks 121-124 via the buffer 249 and the large-size bus clock signal line 256, and it is sent to the function block 125 via the normal-size bus clock signal line 256A. The clock signal line 256 is formed in the large-size bus wiring layer and the clock delay of the clock signal line 256 is negligible. The clock signal line 256A is adequately short and the clock delay of the clock signal line 256A is negligible.

In the semiconductor apparatus 100A of FIG. 8, the clock buffer 245 includes a buffer 273, an inverter 274, an NOR gate 275, an n-channel transistor 276, and an n-channel transistor 277. When the select signal S1 is at the high level ("H"), the transistor 277 is set in OFF state so as to disable the clock signal line 156. When the select signal S1 is at the low level ("L"), the transistor 276 is set in OFF state so as to disable the pad 250. The other clock buffers 246-248 are configured in the same manner as the clock buffer 245. The buffer 249 and the buffer 273 are constructed by using a cascaded connection of two CMOS inverters.

Suppose that, in the semiconductor apparatus of the present embodiment, the number of the pads which are formed in the normal-size bus wiring layer (such pads are called the first electrodes) are indicated by "M", and the number of the pads which are formed in the large-size bus wiring layer (such pads are called the second electrodes) is indicated by "N". The semiconductor apparatus of the present embodiment is configured such that, when the external clock signal is received at each of the first electrodes and the second electrodes, the conditions: M>N ■ 1 are met. In the above embodiment shown in FIG. 8, the pads 250-254 are the first electrodes (M=5), and the pad 255 is the second electrode (N=1).

Figure 9:
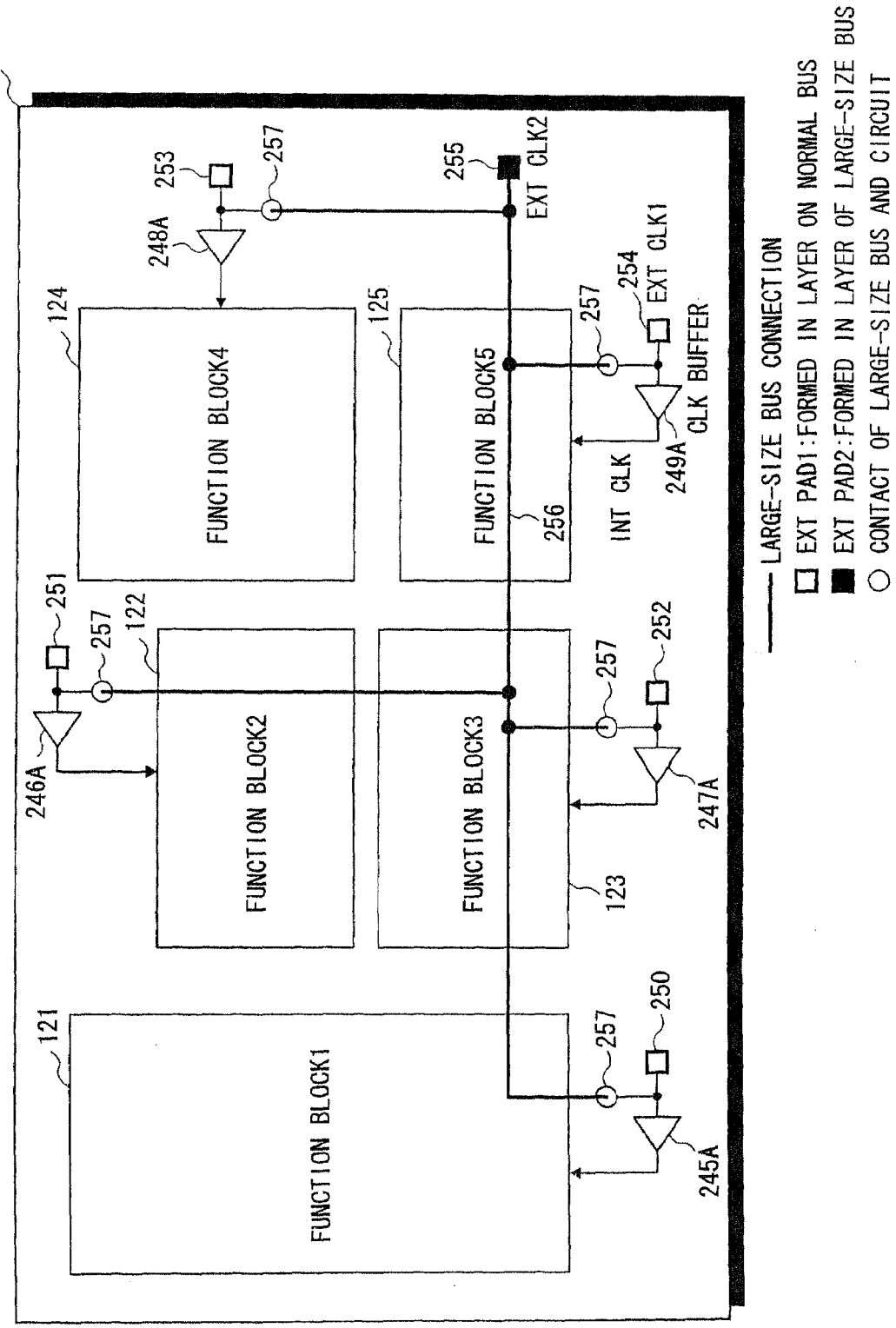
FIG. 9 is a block diagram of a third preferred embodiment of the semiconductor apparatus of the invention.

Next, FIG. 9 shows a third preferred embodiment of the semiconductor apparatus of the invention.

The semiconductor apparatus 100B of the present embodiment provides a simplified configuration of the semiconductor apparatus 100A of the previous embodiment of FIG. 8.

As shown in FIG. 9, the semiconductor apparatus 100B does not use the clock signal selection, which is performed by the clock buffers 245-248 in the previous embodiment of FIG. 8. Instead, the semiconductor apparatus 100B of the present embodiment uses a wired OR operation of a clock signal line 256. The clock signal line 256 is formed by the large-size bus connection, and the clock signal line 256 is connected with respective pads 250 through 253. The clock signal line 256 is extended from the pad 255 that is formed in the large-size bus wiring layer. The clock signal line 256 is connected to the pads 250 through 254 via the contacts 257. In addition, the clock signal line 256 is connected to the inputs of the buffers 245A through 249A that are disposed adjacent to the respective function blocks 121 through 125. The outputs of the buffers 245A through 249A are connected to the function blocks 121 through 125.

Similar to the buffers 249 and 273 described earlier, each of the buffers 245A through 249A is constructed by using a plurality of CMOS inverters connected in the cascaded formation.

When the wafer test is conducted, the externally supplied clock signal is delivered to the pads 250 through 254. After the large-size bus connection is formed in the semiconductor apparatus 100B, the externally supplied clock signal is delivered to the pad 253.

The semiconductor apparatus 100B of the present embodiment has a simplified configuration when compared with the configuration of the semiconductor apparatus 100A of the previous embodiment. However, after the large-size bus connection is formed, the externally supplied clock signal is delivered to the clock buffers 245A through 249A. The load of the clock signal line 256 in such a case is increased. For this reason, when it is preferred to provide a high-speed operation of the semiconductor apparatus, the configuration of the second preferred embodiment (FIG. 8) is more effective than the configuration of the third preferred embodiment (FIG. 9).

Figure 10:
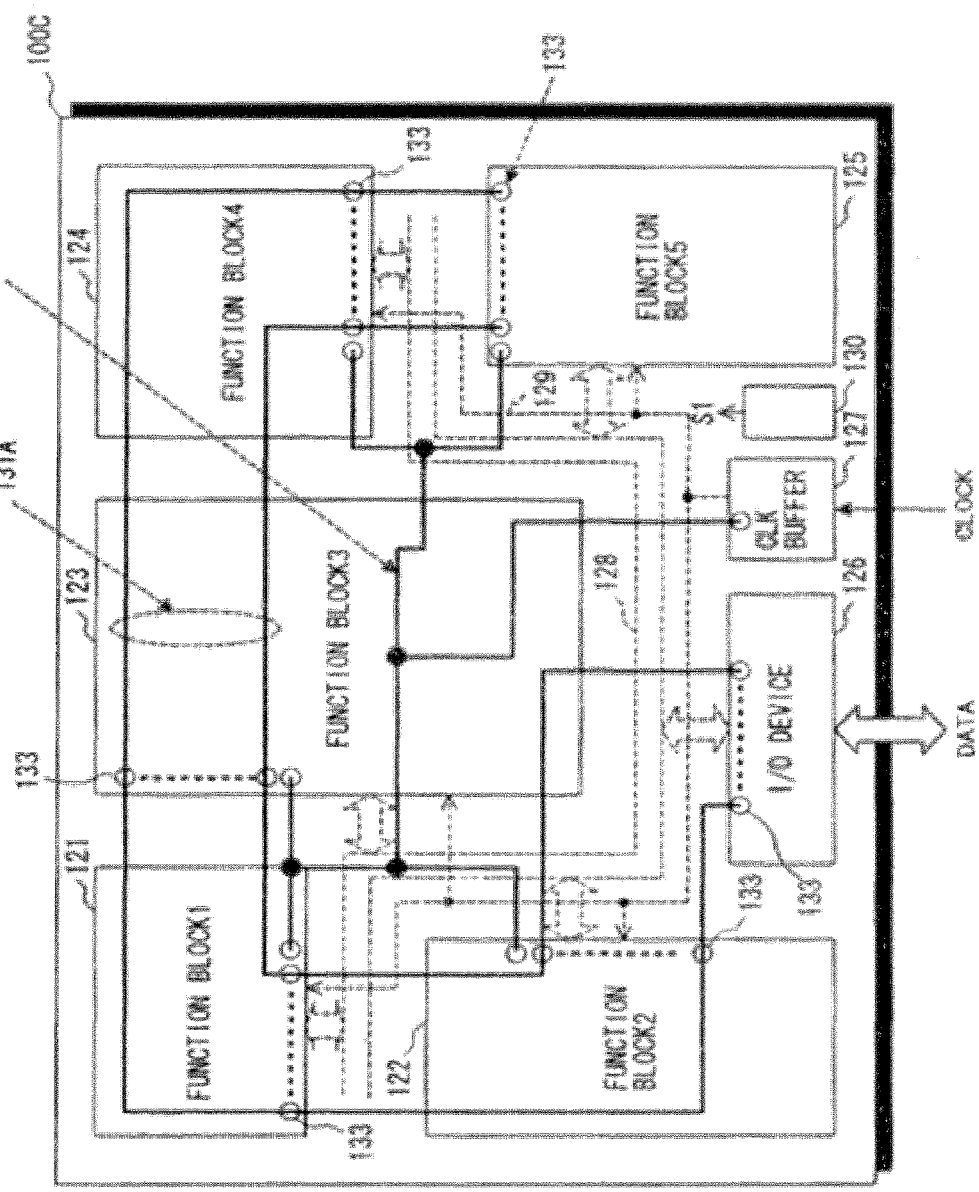
FIG. 10 is a block diagram of a variation of the semiconductor apparatus of FIG. 2 in which clock signal line portions have a substantially equal length.

FIG. 10 shows a variation of the semiconductor apparatus of FIG. 2 in which the portions of the clock signal line have a substantially equal length.

Generally, it is desired that the clock signal line portions between the circuit components have an equal length in order to provide high accuracy of the timing of operation by the clock signal delivered from the clock buffer to each circuit component.

As shown in FIG. 10, the semiconductor apparatus 100C of the present embodiment includes the bus 131A and the clock signal line 132A which are both formed by using the large-size bus connection. The clock signal line 132A is divided into clock signal line portions between the circuit components, and these line portions have a substantially equal length. For example, in the clock signal line 132A of the present embodiment, the clock signal line portion between the function blocks 121 and 123 and the clock signal line portion between the function blocks 122 and 123 have the same length. If the clock signal line portions have a slight difference in length but a high accuracy of the timing of operation is ensured, the length difference may be negligible.

Figure 11:
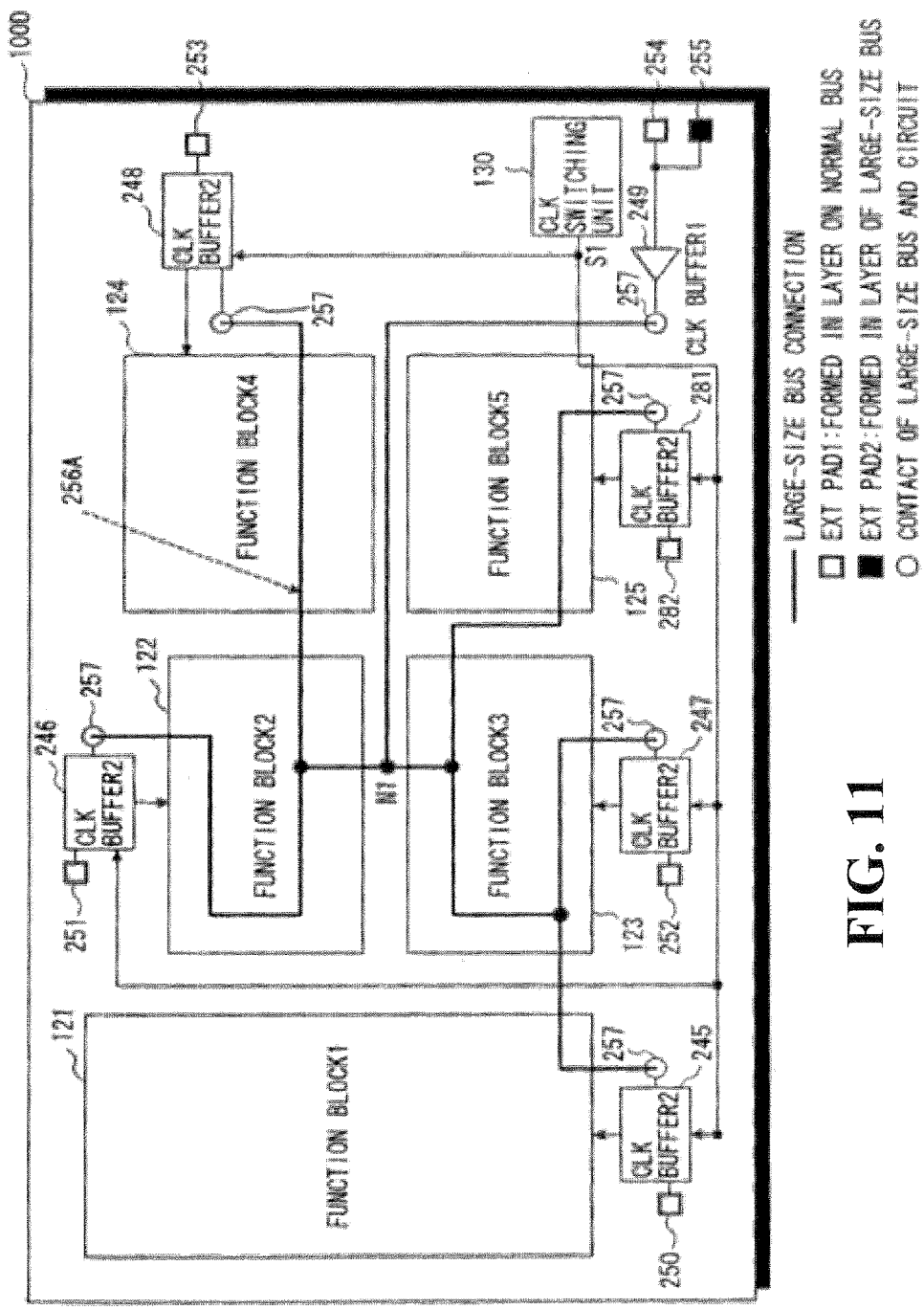
FIG. 11 is a block diagram of a variation of the semiconductor apparatus of FIG. 8 in which clock signal line portions have a substantially equal length.

FIG. 11 shows a variation of the semiconductor apparatus of FIG. 8 in which clock signal line portions have a substantially equal length.

As shown in FIG. 11, the semiconductor apparatus 100D of the present embodiment includes the clock signal line 256A which is formed by using the large-size bus connection. The clock signal line 256A is divided into clock signal line portions between the circuit components, and these line portions have a substantially equal length. For example, in the clock signal line 256A of the present embodiment, the respective clock signal line portions between one of the function block 122 or 123 and the clock buffer (CLK BUFFER 1) 249 have a substantially equal length. If the clock signal line portions have a slight difference in length but a high accuracy of the timing of operation is ensured, the length difference may be negligible.

In the semiconductor apparatus 100D of FIG. 11, the clock buffer 281 that has the same configuration as that of the clock buffer 249 is used, in order to provide the clock signal line portions between the circuit components having a substantially equal length.

In the above-described embodiments, the semiconductor apparatus of the present invention is applied to the logic chip. However, the present invention is not limited to these embodiments. For example, the present invention is also applicable to a memory chip or a multi-chip semiconductor apparatus in which the function blocks and the memories coexist.

Figure 12:
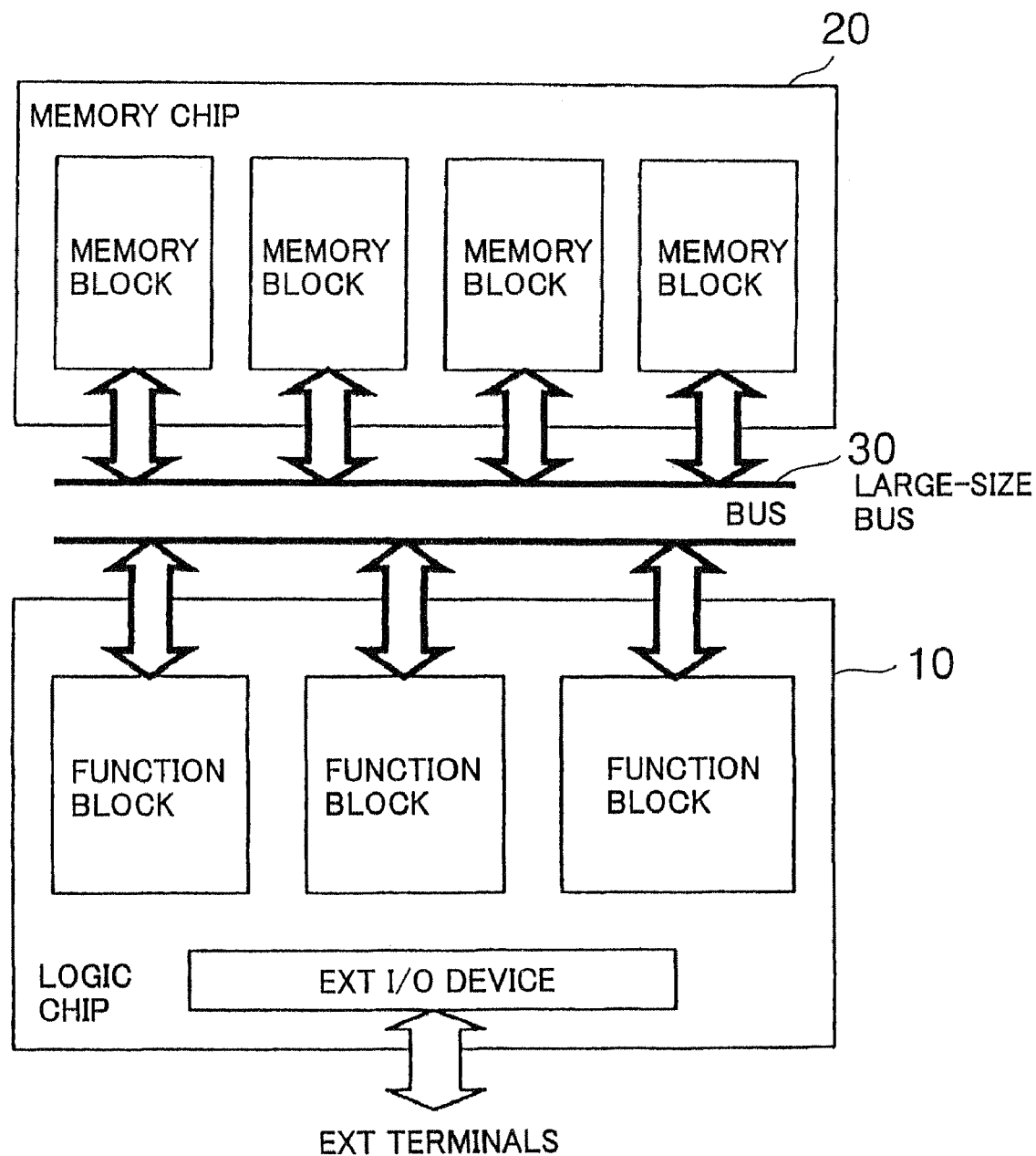
FIG. 12 is a diagram for explaining a multi-chip semiconductor apparatus of the invention.

Next, FIG. 12 is a diagram for explaining a multi-chip semiconductor apparatus according to the present invention.

As shown in FIG. 12, the multi-chip semiconductor apparatus of the present invention generally includes a logic chip 10, a memory chip 20, and a large-size bus 30. The logic chip 10 includes a plurality of function blocks each having internal circuits, and the memory chip 20 includes a plurality of memory blocks each having internal circuits. The large-size bus 30 is provided in the large-size bus wiring layer. The large-size bus 30 serves as a conduction line that interconnects the function blocks of the logic chip 10 and the memory blocks of the memory chip 20. Namely, the large-size bus 30 is shared by the logic chip 10 and the memory chip 20 for transmission of a signal between the respective blocks.

As described earlier, the large-size bus connection to constitute the large-size bus 30 has a small parasitic capacity and enables the operation at a low driving voltage, and it is possible to provide a high-speed operation of the semiconductor apparatus with low power consumption. The multi-chip semiconductor apparatus of the present invention does not require the I/O devices that are needed to connect the logic chip 10 and the memory chip 20 as in a conventional multi-chip semiconductor apparatus. According to the multi-chip semiconductor apparatus of the present invention, the delay time is shortened and the power consumption is reduced.

Figure 13:
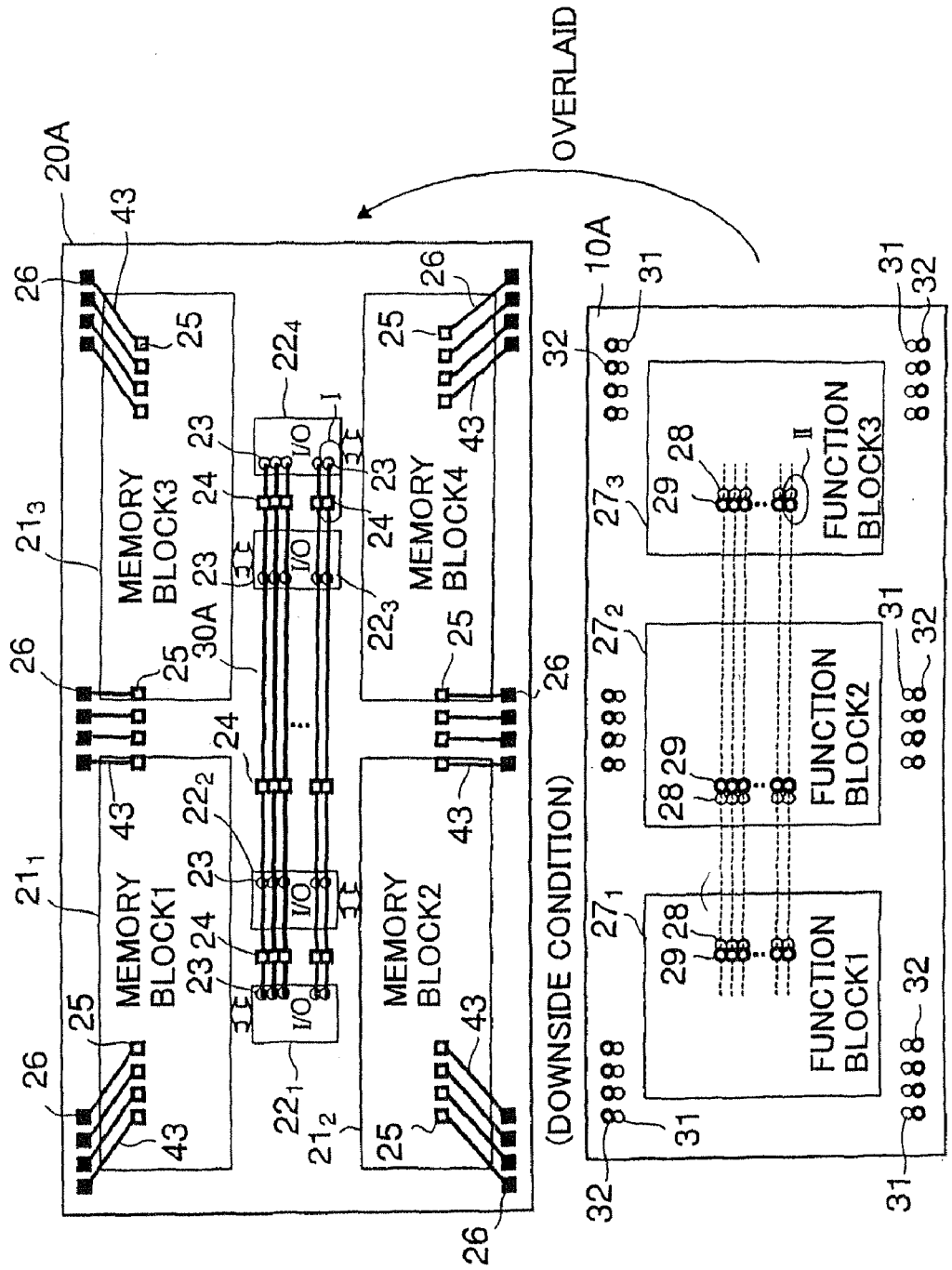
FIG. 13 is a diagram of a first preferred embodiment of the multi-chip semiconductor apparatus of the invention.

FIG. 13 shows a first preferred embodiment of the multi-chip semiconductor apparatus of the invention.

As shown in FIG. 13, the multi-chip semiconductor apparatus of the present embodiment includes a logic chip 10A and a memory chip 20A. The logic chip 10A is overlaid onto the memory chip 20A so that the logic chip surface and the memory chip surface confront each other.

The memory chip 20A has a size larger than a size of the logic chip 10A. The memory chip 20A includes four memory blocks $21_1$ through $21_4$, four I/O devices $22_1$ through $22_4$, and a large-size bus 30A. The memory blocks $21_1$-$21_4$ and the I/O devices $22_1$-$22_4$ are formed on the semiconductor substrate or chip. The large-size bus 30A is formed in the large-size bus wiring layer. The I/O devices $22_1$-$22_4$ and the signal lines of the large-size bus 30A are respectively connected together via the contacts 23. The memory blocks $21_1$-$21_4$ and the I/O devices $22_1$-$22_4$ are electrically connected together, respectively, and the memory blocks $21_1$-$21_4$ are interconnected through the large-size bus 30A. Further, the pads 24 are provided on the respective signal lines of the large-size bus 30A, and the electrical connection between the memory chip 20A and the logic chip 10A is established via the pads 24 on the large-size bus 30A.

Figure 14:
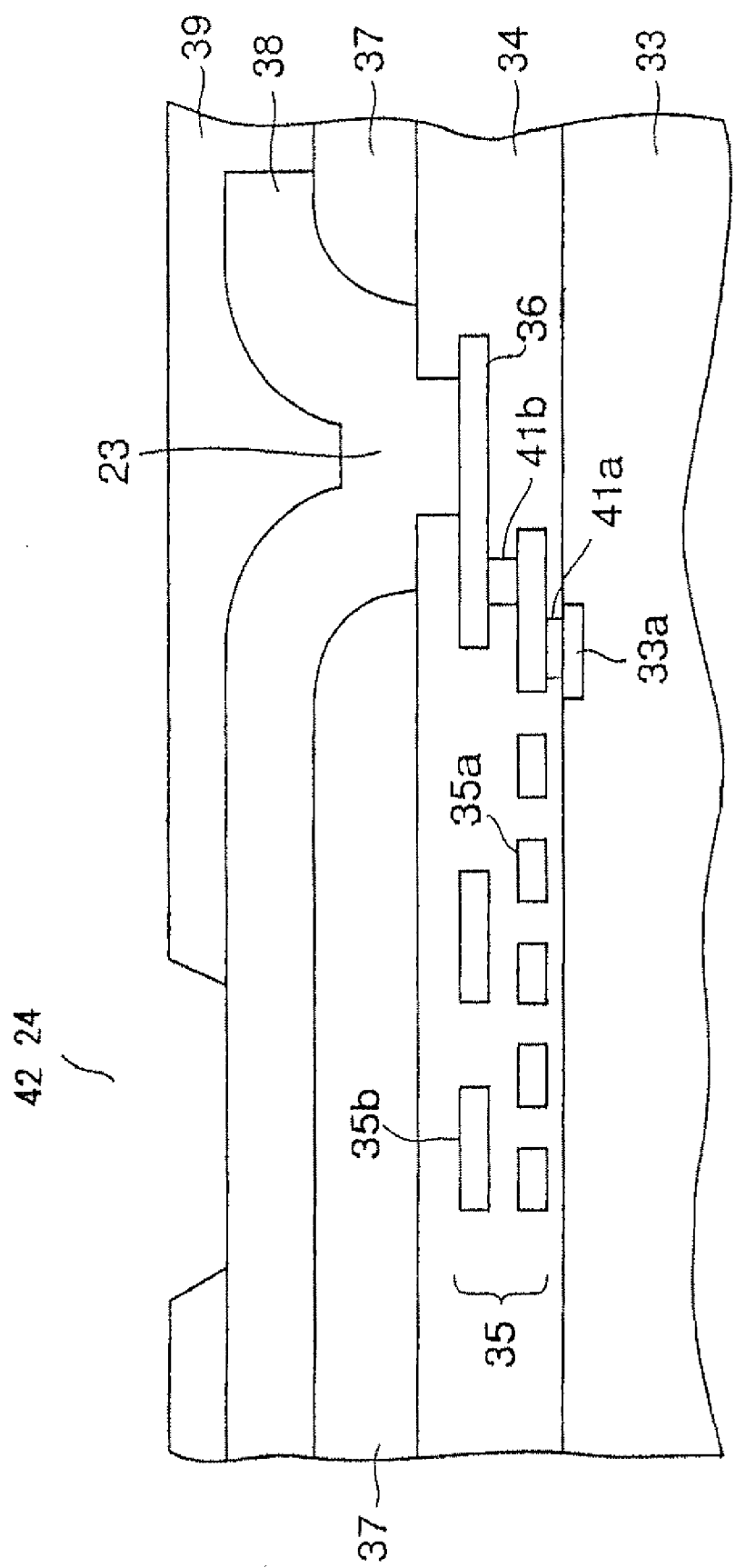
FIG. 14 is a cross-sectional view of the portion of a memory chip in the multi-chip semiconductor apparatus, which portion of the memory chip is indicated by "I" in FIG. 13.

FIG. 14 is a cross-sectional view of the portion of the memory chip 20A in the multi-chip semiconductor apparatus, which portion is indicated by "I" in FIG. 13.

As shown in FIG. 14, the multi-level wiring layer 35 is formed on the semiconductor substrate 33 (the memory chip surface). The multi-level wiring layer 35 includes the wiring layer 35a and the wiring layer 35b. The wiring layers 35a and 35b are isolated from each other by an insulating layer of polyimide resin. Further, an insulating layer of polyimide resin is provided on the top surface of the upper wiring layer 35b. For the sake of convenience, the insulating layers of the multi-level wiring layer 35 are collectively designated by reference numeral 34.

In the memory chip of FIG. 14, the multi-level wiring layer 35 includes the electrode 36 (which is called the first electrode) which is connected to the wiring layers 35a and 35b. The electrode 36 is electrically connected to the diffusion layer 33a via the contacts 41a and 41b and the intermediate wiring layer. The diffusion layer 33a is formed on the semiconductor substrate 33.

Further, in the memory chip of FIG. 14, the insulating layer 37 is formed on the insulating layer 34, and the large-size bus wiring layer 38 is provided on the insulating layer 37. The wiring layer 38 constitutes one of the signal lines of the large-size bus 30A in FIG. 13. The wiring layer 38 includes the contact 23 that is coupled to the electrode 36. The electrode 36 is exposed to the wiring layer 38 at the contact hole which is formed in the insulating layer 34. The wiring layer 38 enters the insulating layers 34 and 37 at the contact hole so that the contact 23 is electrically connected to the electrode 36. The large-size bus wiring layer 38 is larger in width and thickness than the wiring layers 35a and 35b of the multi-level wiring layer 35. For example, the large-size bus wiring layer 38 has a width in a range of 5 ■ ■ ■ to 10 ■ ■.

In the memory chip of FIG. 14, the cover layer 39 is formed on the large-size bus wiring layer 38. The cover layer 39 has an opening (or a through hole) in which the large-size bus wiring layer 38 is exposed. The electrode 42 (the second electrode), which is not shown in FIG. 14, is provided at the opening of the cover layer 39, and the electrode 42 is used to connect the memory chip 20A with another chip (the logic chip 10A). In the present embodiment, the electrode 42 corresponds to the pad 24 in FIG. 13.

Referring back to FIG. 13, in the multi-chip semiconductor apparatus of the present embodiment, the logic chip 10A includes three function blocks 27$_1$ through 27$_3$. The contacts 28 and the bumps 29 are formed on each of the function blocks 27$_1$-27$_3$. The function blocks 27$_1$-27$_3$ are formed on the semiconductor chip. The contacts 28 are connected to the corresponding one of the function blocks 27$_1$-27$_3$. The bumps 29 which are formed into the projecting electrodes are connected to the pads 24 of the large-size bus 30A of the memory chip 20A. is formed in the large-size bus wiring layer. The bumps 29 are disposed on each function block of the logic chip 10A at the locations that match with the locations of the pads 24 on the memory chip 20A when the logic chip 10A is overlaid onto the memory chip 20A. Hence, the electrical connection of the logic chip 10A and the memory chip 20A is established via the bumps 29 and the pads 24.

Figure 15:
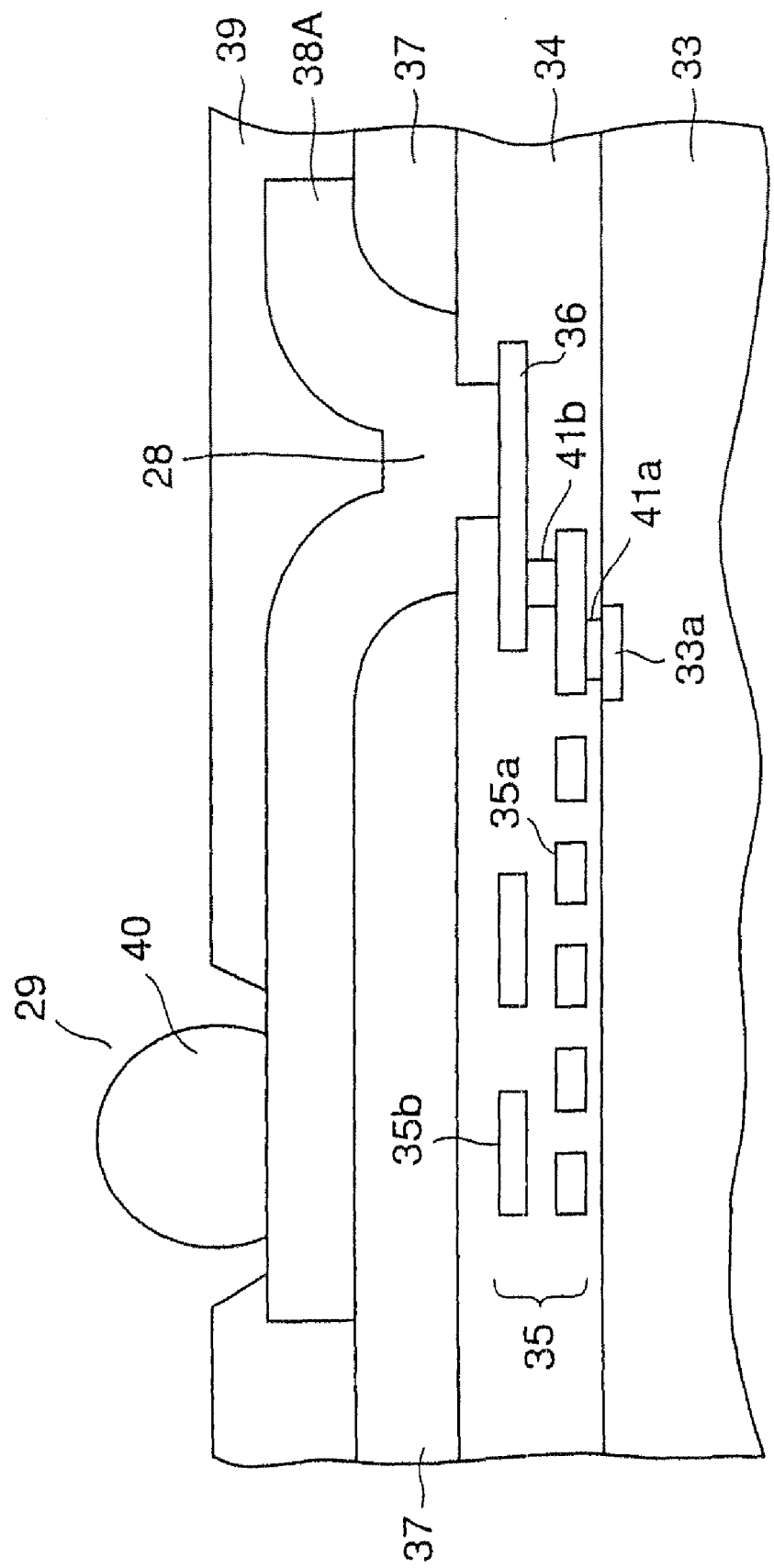
FIG. 15 is a cross-sectional view of the portion of a logic chip in the multi-chip semiconductor apparatus, which portion of the logic chip is indicated by "II" in FIG. 13.

FIG. 15 is a cross-sectional view of the portion of the logic chip 10A in the multi-chip semiconductor apparatus, which portion is indicated by "II" in FIG. 13.

In FIG. 15, the elements that are essentially the same as corresponding elements in FIG. 14 are designated by the same reference numerals, for the sake of simplicity of description.

As shown in FIG. 15, the electrode 40 (called the second electrode) that constitutes the bump 29 in FIG. 13 is formed on the large-size bus wiring layer 38A. The wiring layer 38A is provided to electrically connect the electrode 40 (the second electrode) and the electrode 36 (the first electrode) that constitutes the contact 28 in FIG. 13. The wiring layer 38A does extend in the longitudinal direction as the wiring layer 38 of the memory chip 20A.

When the logic chip 10A is overlaid onto the memory chip 20A, the electrode 40 (or the bump 29) contacts the electrode 42 (or the pad 24) so that the electrical connection is established. Similarly, all the bumps 29 on the logic chip 10A contact the corresponding pads 24 on the large-size bus 30A of the memory chip 20A so that the electrical connections are established when the logic chip 10A is overlaid onto the memory chip 20A to form the multi-chip semiconductor apparatus.

Consequently, the function blocks 27$_1$-27$_3$ of the logic chip 10A are interconnected by the large-size bus 30A of the memory chip 20A. In other words, the large-size bus 30A is shared by the logic chip 10A and the memory chip 20A. The dotted lines indicated on the logic chip 10A in FIG. 13 show the positions of the corresponding signal lines of the large-size bus 30A on the memory chip 20A when the former chip is overlaid onto the latter chip.

In the above embodiment of FIG. 13, the plural contacts 23 and the plural pads 24 are connected onto each of the signal lines of the large-size bus 30A. However, the present invention is not limited to this embodiment. The multi-chip semiconductor apparatus of the invention may be configured such that one contact 23 and plural pads 24 are connected onto each of the signal lines of the large-size bus 30A. Alternatively, the multi-chip semiconductor apparatus of the invention may be configured such that plural contacts 23 and one pad 24 are connected onto each of the signal lines of the large-size bus 30A.

Further, in the above embodiment of FIG. 14, the number of the contacts 23 and the number of the pads 24 both connected to each signal line of the large-size bus 30A are equal to each other. Alternatively, the multi-chip semiconductor apparatus of the invention may be configured such that the number of the contacts 23 and the number of the pads 24 both connected to one of the signal lines of the large-size bus 30A are different from those connected to another signal line of the large-size bus 30A. Further, in a case in which the logic chip 10A is not divided into a plurality of function blocks and is comprised of a signal function block (for example, the function block 27$_2$ only), the contacts 28 and the bumps 29 may be provided on the function block 27$_2$ only.

In the above-described embodiment, the large-size bus 30A is provided on the memory chip 20A. Alternatively, the large-size bus 30A may be provided on the logic chip 10A.

The interface of the multi-chip semiconductor apparatus of FIG. 13 with an external device is provided through the logic chip 10A. In the embodiment of FIG. 13, the logic chip 10A has a size smaller than the size of the memory chip 20A. In the logic chip 10A, there is no space needed to form the external connection electrodes. For this reason, the external connection pads 26 are provided in the peripheral portions of the memory chip 20A which do not interfere with the logic chip 10A. The external connection pads 26 are respectively connected to the contacts 25 on each function block via the large-size wiring 43. For example, the external connection pads 26 are constructed in the same manner as the electrode 36 (the first electrode) in FIG. 14. The pads 26 are exposed at the contact opening in the insulating layer. The large-size wiring 43 is provided in the large-size bus wiring layer 38 that is formed on the insulating layer 37. The contacts 25 are constructed in the same manner as the electrode 42 (the second electrode). The contacts 25 are not connected directly to the internal circuits of the memory chip 20A.

In the logic chip 10A, the contacts 31 and the electrodes 32 (such as the bumps) are provided. The contacts 31 are connected to the corresponding one of the function blocks $27_1$-$27_3$, and the electrodes 32 are respectively connected to the contacts 32. The contacts 31 and the electrodes 32 are constructed in the same manner as the contacts 28 and the bumps 29. When the logic chip 10A is overlaid onto the memory chip 20A, the electrodes 32 respectively contact the external connection pads 26 so that the electrical connections of the function blocks $27_1$-$27_3$ and the pads 26 are established. Further, the external connection of the pads 26 is produced through wire bonding or tape automated bonding (TAB).

As described in the foregoing, according to the first preferred embodiment of the multi-chip semiconductor apparatus, the large-size bus connection to constitute the large-size bus 30A has a small parasitic capacity and enables the operation at a low driving voltage, and it is possible to provide a high-speed operation of the semiconductor apparatus with low power consumption. The multi-chip semiconductor apparatus of the present embodiment does not require the I/O devices that are needed to connect the logic chip 10A and the memory chip 20A as in the conventional multi-chip semiconductor apparatus. According to the multi-chip semiconductor apparatus of the present embodiment, the delay time is shortened and the power consumption is reduced.

Figure 16:
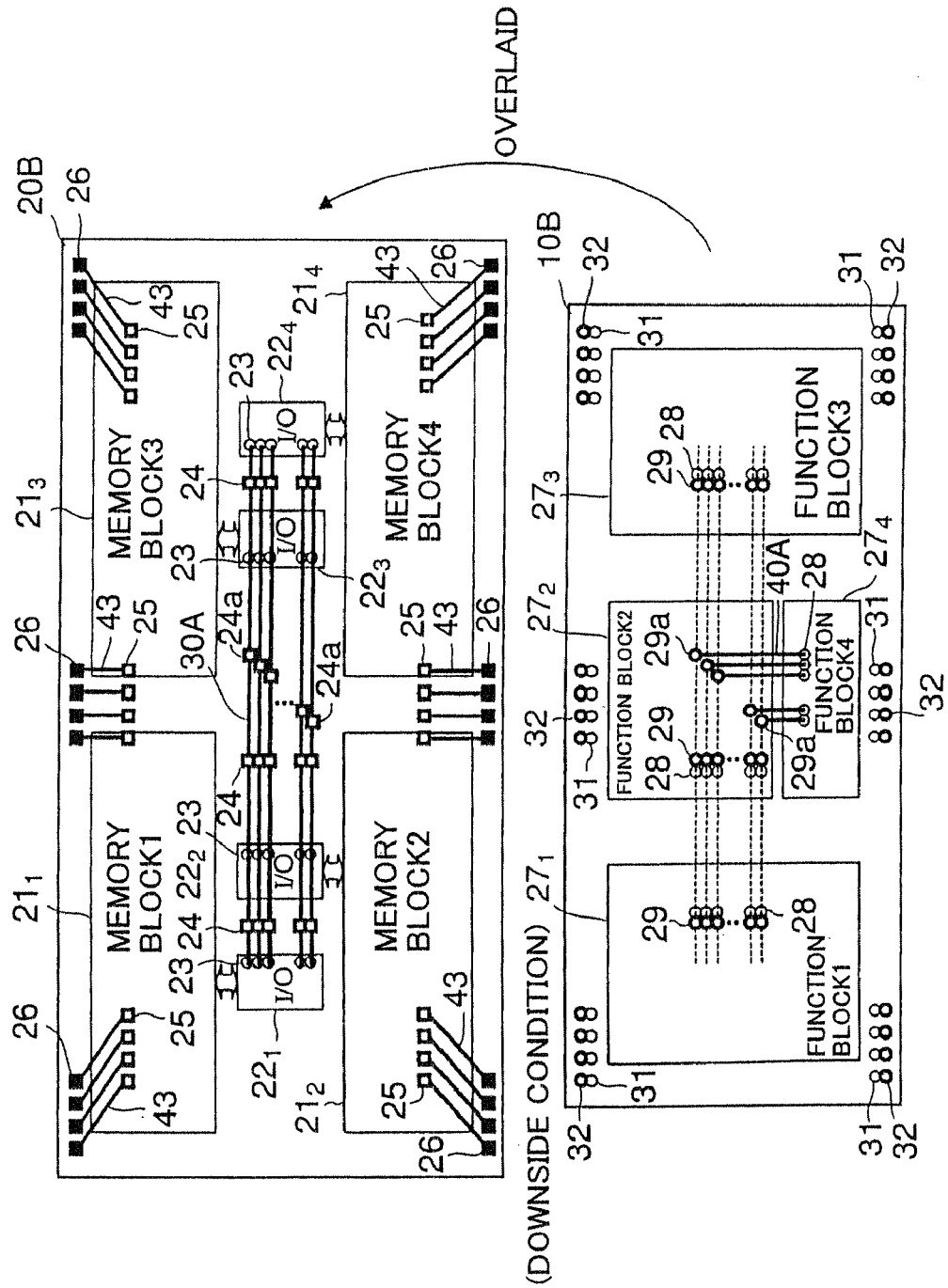
FIG. 16 is a diagram of a second preferred embodiment of the multi-chip semiconductor apparatus of the invention.

Next, FIG. 16 shows a second preferred embodiment of the multi-chip semiconductor apparatus of the invention.

In FIG. 16, the elements that are essentially the same as corresponding elements in FIG. 13 are designated by the same reference numerals, and a description thereof will be omitted.

As shown, the multi-chip semiconductor apparatus of this embodiment includes the logic chip 10B and the memory chip 20B. The multi-chip semiconductor apparatus of this embodiment shown in FIG. 16 is essentially the same as the previous embodiment shown in FIG. 13, but differs from it in the matters which will be described in the following.

In the present embodiment, the logic chip 10B further includes the fourth function block $27_4$, in addition to the function blocks $27_1$-$27_3$ as in the previous embodiment of FIG. 13. The function block $27_2$ of this embodiment is different in size from the function block $27_2$ of the previous embodiment of FIG. 13, but they are the same in the meaning of a single function block and designed by the same reference numerals. For other elements of the multi-chip semiconductor apparatus, the same reference numerals are used in such meaning.

In the present embodiment, in order to connect the function block $27_4$ with the large-size bus 30A of the memory chip 20B, the secondary large-size bus 40A is provided on the logic chip 10B, and the secondary large-size bus 40A interconnects the function block $27_2$ and the function block $27_4$. The secondary large-size bus 40A becomes a branch bus of the large-size bus 30A when the logic chip 10B is overlaid onto the memory chip 20B. In other words, the large-size bus is provided on each of the logic chip 10B and the memory chip 20B. The respective signal lines of the large-size bus 40A are connected to the function block $27_4$ at the contacts 28. The projecting electrodes 29a (or the bumps 29a) are provided on the respective signal lines of the large-size bus 40A in the function block $27_2$. The electrodes 29a are constructed in the same manner as the electrodes 29.

In the present embodiment, when the logic chip 10B is overlaid onto the memory chip 20B, the projecting electrodes 29a are coupled to the respective pads 24a that are provided on the large-size bus 30A of the memory chip 20B. For this purpose, the locations where the electrodes 29a are disposed in the logic chip 10B correspond to the locations where the pads 24 are disposed in the memory chip 20B. The function block $27_4$ is electrically connected to the large-size bus 30A via the secondary large-size bus 40A.

Figure 17:
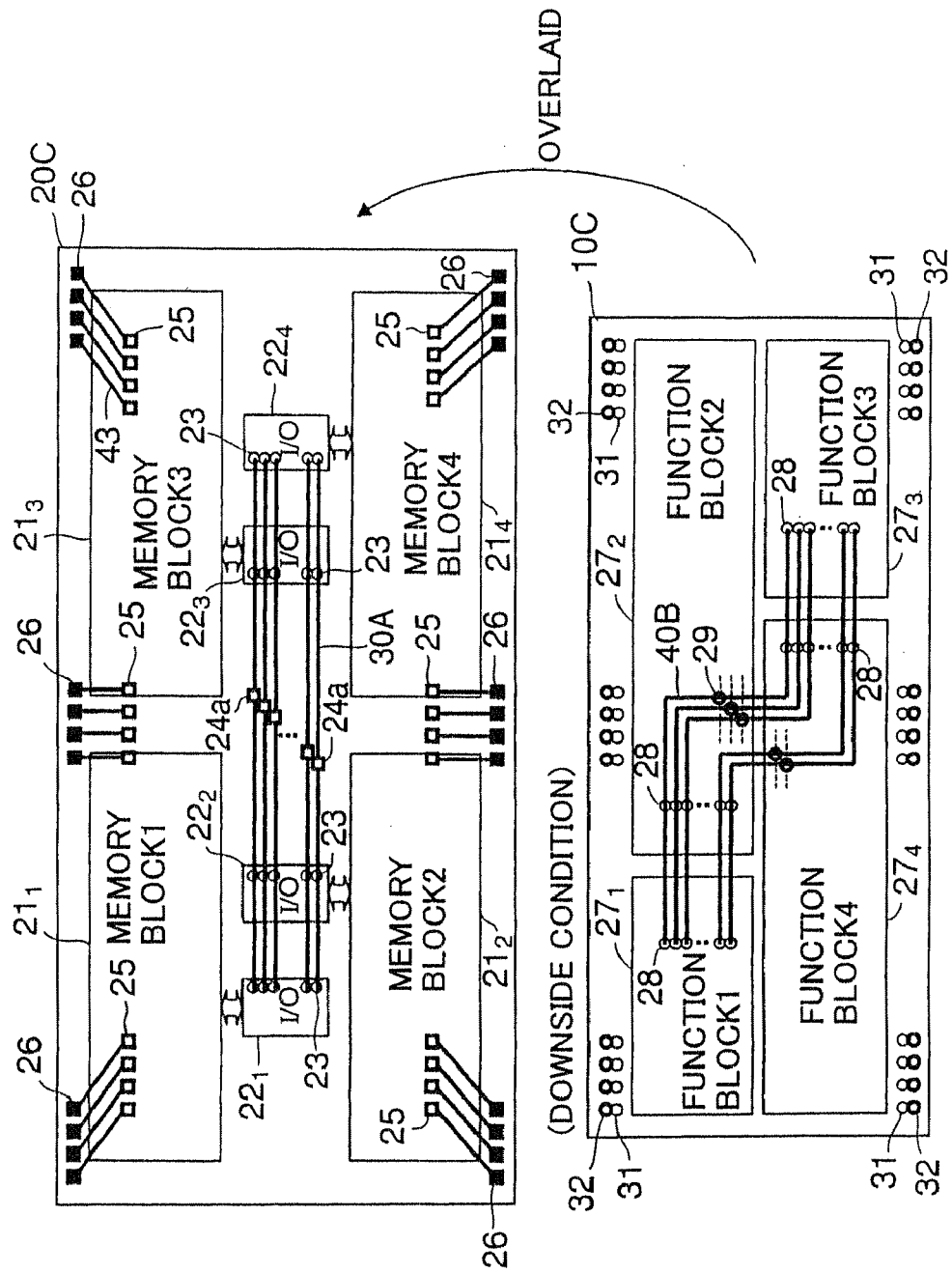
FIG. 17 is a diagram of a third preferred embodiment of the multi-chip semiconductor apparatus of the invention.

FIG. 17 shows a third preferred embodiment of the multi-chip semiconductor apparatus of the invention.

In FIG. 17, the elements that are essentially the same as corresponding elements in the preceding embodiments are designated by the same reference numerals, and a description thereof will be omitted.

As shown, the multi-chip semiconductor apparatus of this embodiment includes the logic chip 10C and the memory chip 20C. Similar to the previous embodiment of FIG. 16, the logic chip 10C of the present embodiment includes the four function blocks $27_1$-$27_4$, but the arrangement thereof in the present embodiment is different from that in the previous embodiment. When the logic chip 10C is overlaid onto the memory chip 20C, the function blocks $27_1$-$27_4$ are not located on the straight-line positions of the large-size bus 30A of the memory chip 20C. The function blocks $27_1$-$27_4$ cannot be connected with the large-size bus 30A in the same manner as in the previous embodiments of FIG. 13 and FIG. 16.

In the present embodiment, in order to connect the function blocks $27_1$-$27_4$ with the large-size bus 30A of the memory chip 20B, the secondary large-size bus 40B is provided on the logic chip 10C, and the secondary large-size bus 40B interconnects the function blocks $27_1$-$27_4$ as shown in FIG. 17. To establish appropriate connection between the secondary large-size bus 40B and the function blocks $27_1$-$27_4$, the secondary large-size bus 40B is arranged in the bent-back formation, not the straight-line formation. The projecting electrodes 29 (or the bumps 29) are provided on the respective signal lines of the large-size bus 40B in the center of the function blocks $27_1$-$27_4$. The electrodes 29 are constructed at the slanted-line positions in the center of the large-size bus 40B.

In the present embodiment, when the logic chip 10C is overlaid onto the memory chip 20C, the projecting electrodes 29 are coupled to the respective pads 24a that are provided on the large-size bus 30A of the memory chip 20C. For this purpose, the locations where the electrodes 29 are disposed in the logic chip 10C correspond to the locations where the pads 24a are disposed in the memory chip 20C. The electrical connection between the large-size bus 40B of the logic chip 10C and the large-size bus 30A of the memory chip 20C is established by the connections of the electrodes 29 and the pads 24a.

Figure 18:
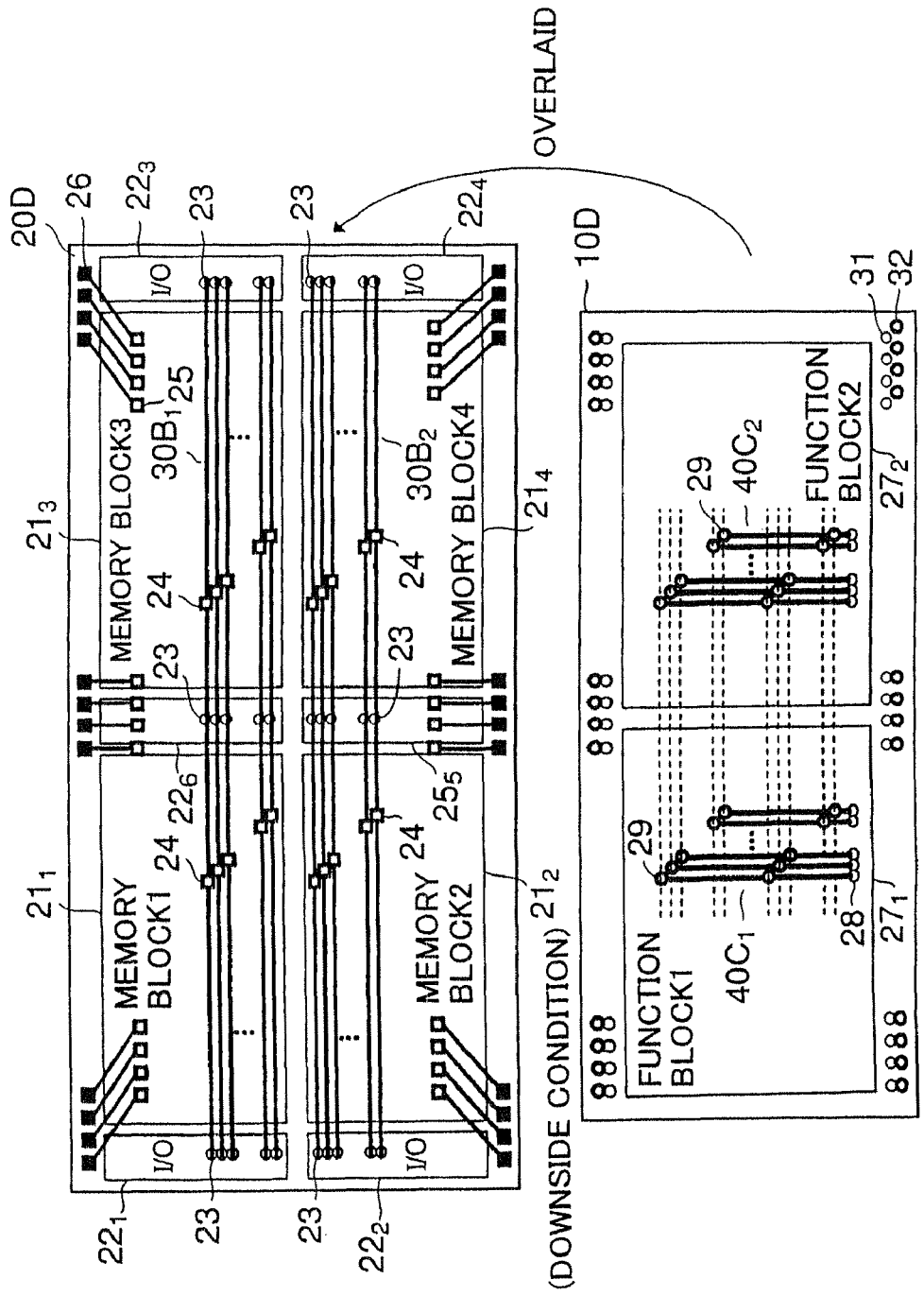
FIG. 18 is a diagram of a fourth preferred embodiment of the multi-chip semiconductor apparatus of the invention.

FIG. 18 shows a fourth preferred embodiment of the multi-chip semiconductor apparatus of the invention.

In FIG. 18, the elements that are essentially the same as corresponding elements in the preceding embodiments are designated by the same reference numerals, and a description thereof will be omitted.

As shown, the multi-chip semiconductor apparatus of this embodiment includes the logic chip 10D and the memory chip 20D. The memory chip 20D of the present embodiment includes the four memory blocks $21_1$ through $21_4$, the six I/O devices $22_1$ through $22_6$, and the two parallel large-size buses $30B_1$ and $30B_2$. Each of the large-size buses $30B_1$ and $30B_2$ is provided in the large-size wiring layer. The bus $30B_1$ interconnects the I/O devices $22_1$, $22_3$ and $22_6$ via the contacts 23. The pads 24 are arranged at the two intermediate locations on the respective signal lines of the bus $30B_1$ in the slanted-line formation as shown in FIG. 18. Similarly, the bus $30B_2$ interconnects the I/O devices $22_2$, $22_4$ and $22_5$ via the contacts 23. The pads 24 are arranged at the two intermediate locations on the respective signal lines of the bus $30B_2$ in the slanted-line formation as shown in FIG. 18. The arrangement of the I/O devices $22_1$ thorough $22_6$ shown in FIG. 19 is designed in order to make effective use of the surface area of the chip.

The logic chip 10D of the present embodiment includes the two function blocks $27_1$ and $27_2$, and the two parallel large-size buses $40C_1$ and $40C_2$. The buses $40C_1$ and $40C_2$ are parallel to each other and extend in the direction of the short side of the rectangular logic chip 10D. These buses $40C_1$ and $40C_2$ are arranged such that, when the logic chip 10D is overlaid onto the memory chip 20D, the buses $40C_1$ and $40C_2$ of the logic chip 10D are electrically connected with the buses $30B_1$ and $30B_2$ of the memory chip 20D. The signal lines of the bus $40C_1$ are connected to the function block $27_1$ via the contacts 28. The projecting electrodes 29 (or the bumps 29) are formed on the signal lines of the bus $40C_1$ such that two electrodes 29 are provided for each of the signal lines of the bus $40C_1$. Similarly, the signal lines of the bus $40C_2$ are connected to the function block $27_2$ via the contacts 28. The projecting electrodes 29 (or the bumps 29) are formed on the signal lines of the bus $40C_2$ such that two electrodes 29 are provided for each of the signal lines of the bus $40C_2$.

In the present embodiment, when the logic chip 10D is overlaid onto the memory chip 20D, the projecting electrodes 29 of the logic chip 10D are coupled to the respective pads 24 that are provided on the large-size buses $30B_1$ and $30B_2$ of the memory chip 20D. For this purpose, the locations where the electrodes 29 are disposed in the logic chip 10D correspond to the locations where the pads 24 are disposed in the memory chip 20D. The connection of the electrodes 29 and the pads 24 ■ enables the electrical connection between the large-size buses $40C_1$ and $40C_2$ of the logic chip 10D and the large-size buses $30B_1$ and $30B_2$ of the memory chip 20D. The signal lines of the bus $30B_1$ and the signal lines of the bus $30B_2$ in the memory chip 20D are interconnected by the buses $40C_1$ and $40C_2$, and they are connected to the function blocks $27_1$ and $27_2$ of the logic chip 10D. Namely, in the present embodiment, the plural buses $30B_1$ and $30B_2$ on one of the two chips are interconnected by the plural buses $40C_1$ and $40C_2$ on the other chip.

Figure 19:
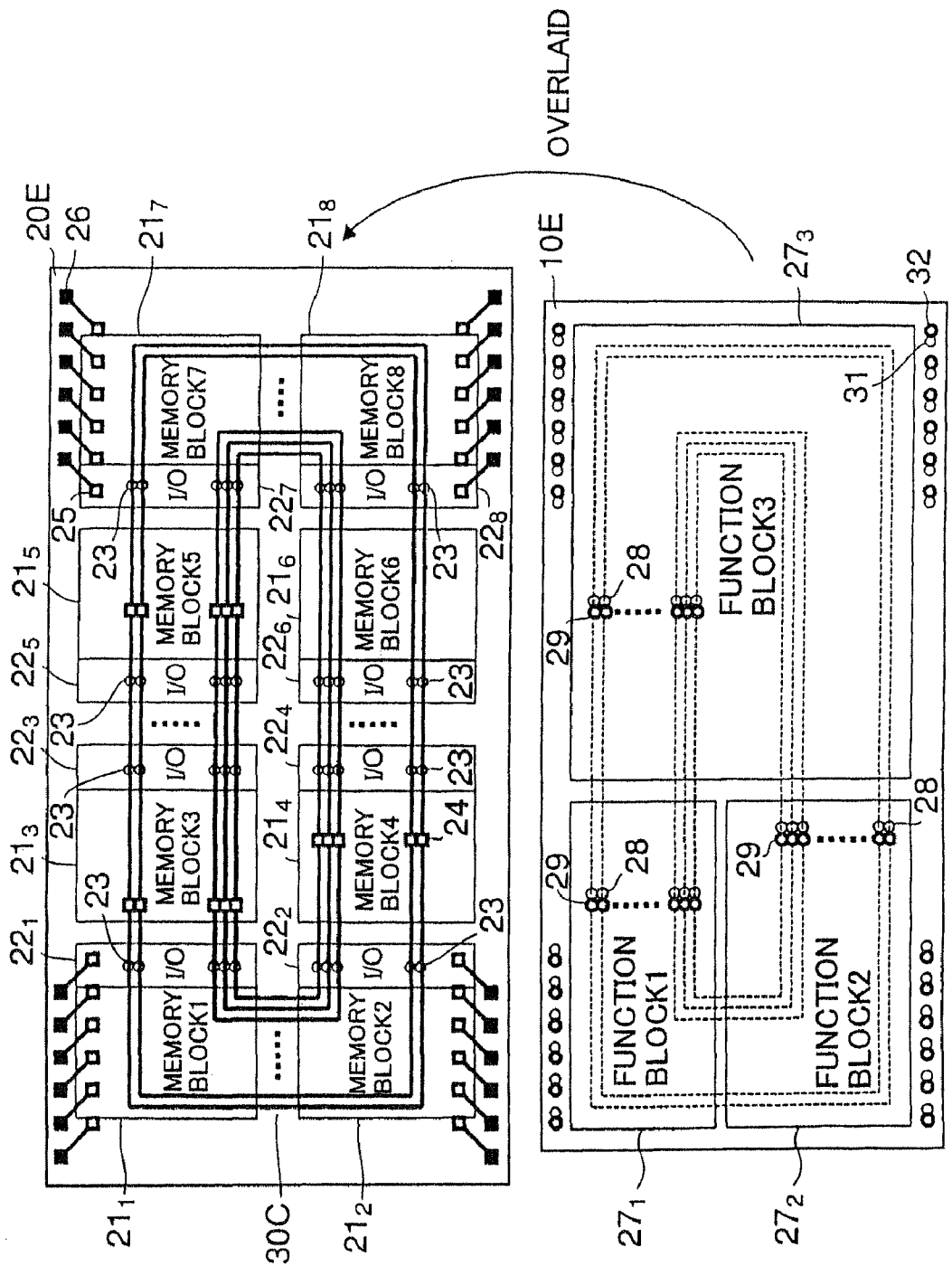
FIG. 19 is a diagram of a fifth preferred embodiment of the multi-chip semiconductor apparatus of the invention.

FIG. 19 shows a fifth preferred embodiment of the multi-chip semiconductor apparatus of the invention.

In FIG. 19, the elements that are essentially the same as corresponding elements in the preceding embodiments are designated by the same reference numerals, and a description thereof will be omitted.

As shown, the multi-chip semiconductor apparatus of this embodiment includes the logic chip 10E and the memory chip 20E. The memory chip 20E of the present embodiment includes the eight memory blocks $21_1$ through $21_8$, the eight I/O devices $22_1$ through $22_8$, and the loop-like large-size bus 30C. The I/O devices $22_1$ through $22_8$ are connected to the signal lines of the bus 30C via the contacts 23. The pads 24 are provided on the signal lines of the bus 30C, and the signal lines of the bus 30C are connected to the logic chip 10E via the pads 24.

The logic chip 10E of the present embodiment includes the three function blocks $27_1$ through $27_3$, the contacts 28 and the projecting electrodes 29 (or the bumps 29). The locations where the electrodes 29 are disposed in the logic chip 10E correspond to the locations where the pads 24 are disposed in the memory chip 20E. When the logic chip 10E is overlaid onto the memory chip 20E, the electrodes 29 contact the pads 24 of the memory chip 20E so that the function blocks $27_1$ through $27_3$ of the logic chip 10E are connected with the large-size bus 30C via the connection of the electrodes 29 and the pads 24.

In the present embodiment, the large-size bus 30C is arranged in the loop-like formation, and it is possible to increase the flexibility of connection of the bus and the internal circuits. The large-size bus 30C has no terminal end, and there is no reflection of the signal transmitted. The multi-chip semiconductor apparatus of the present embodiment is more effective in providing high-speed operation with low power consumption.

Figure 20:
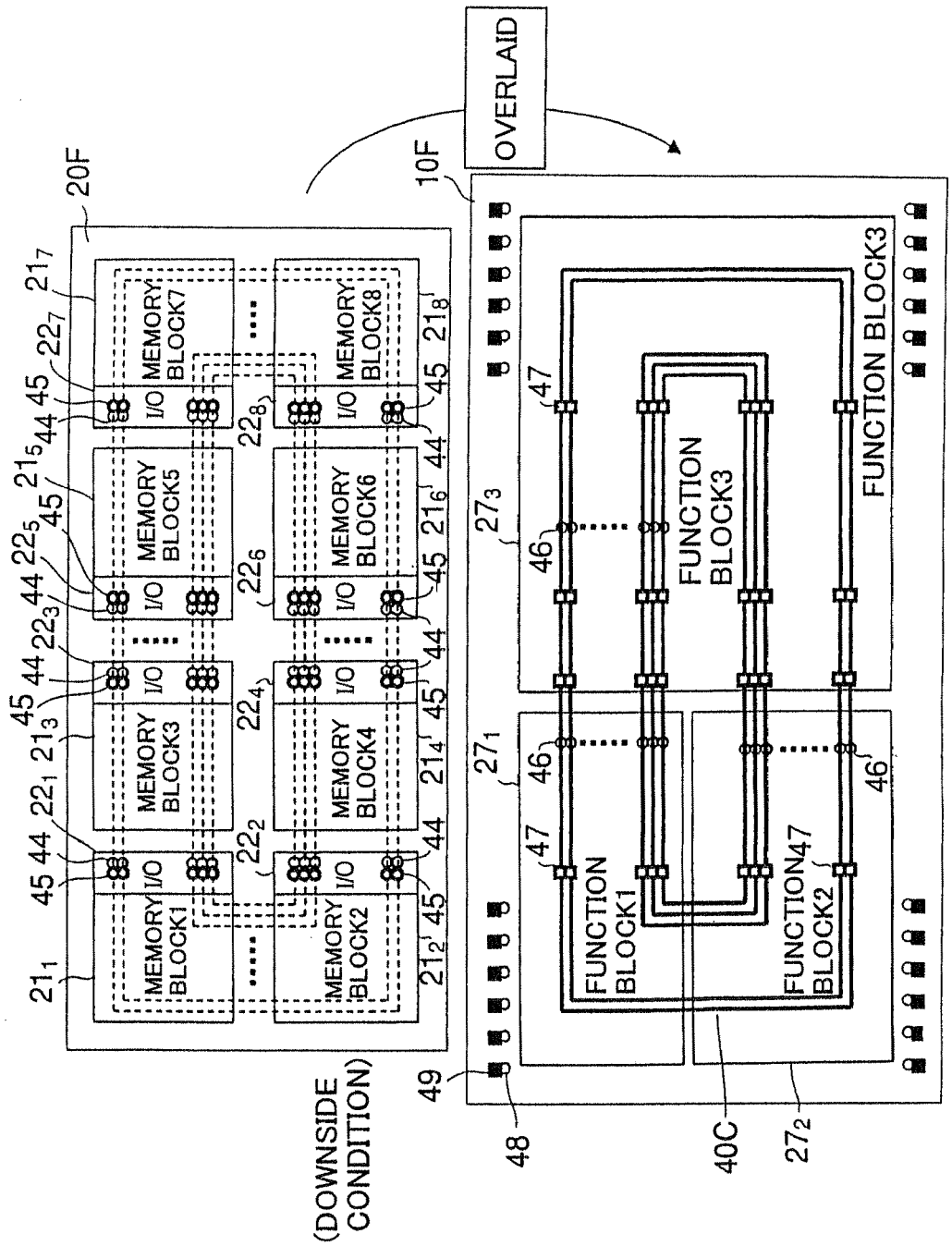
FIG. 20 is a diagram of a variation of the multi-chip semiconductor apparatus shown in FIG. 19.

FIG. 20 shows a variation of the multi-chip semiconductor apparatus shown in FIG. 19.

In FIG. 20, the elements that are essentially the same as corresponding elements in FIG. 19 are designated by the same reference numerals, and a description thereof will be omitted.

As shown, the multi-chip semiconductor apparatus of this embodiment includes the logic chip 10F and the memory chip 20F. The multi-chip semiconductor apparatus of this embodiment is essentially the same as that of FIG. 19 but it differs from that of FIG. 19 in the following matters.

The logic chip 10F is larger in size than the memory chip 20F. The loop-like large-size bus 40C is provided on the logic chip 10F, instead of the memory chip 20E. The pads 49 are provided on the logic chip 10F at the peripheral positions thereof, and the pads 49 are connected with an external device. When combining the logic chip 10F and the memory chip 20F, the memory chip 20F is overlaid onto the logic chip 10F.

In the logic chip 10F of the present embodiment, the signal lines of the loop-like large-size bus 40C are connected to each of the function blocks $27_1$ through $27_3$ via the contacts 46. The pads 47 are provided on the signal lines of the bus 40C, and the signal lines of the bus 40C are connected with the memory chip 20F via the pads 47.

The memory chip 20F of the present embodiment includes the eight memory blocks $21_1$ through $21_8$, the eight I/O devices $22_1$ through $22_8$, the contacts 44, and the projecting electrodes 45 (or the bumps 45). The I/O devices $22_1$ through $22_8$ are coupled to the contacts 44, and the contacts 44 are coupled to the projecting electrodes 45 through the large-size bus wiring layer as shown in FIG. 15.

When the memory chip 20F is overlaid onto the logic chip 10F, the electrodes 45 contact the pads 47 of the logic chip 10F so that the memory blocks $21_1$ through $21_8$ of the memory chip 20F are connected with the large-size bus 40C via the connection of the electrodes 45 and the pads 47. For this purpose, the locations where the electrodes 45 are disposed in the memory chip 20F correspond to the locations where the pads 47 are disposed in the logic chip 10F. The memory blocks $21_1$ through $21_8$ of the memory chip 20F are interconnected through the I/O devices $22_1$ through $22_8$ and the large-size bus 40C.

Figure 21:
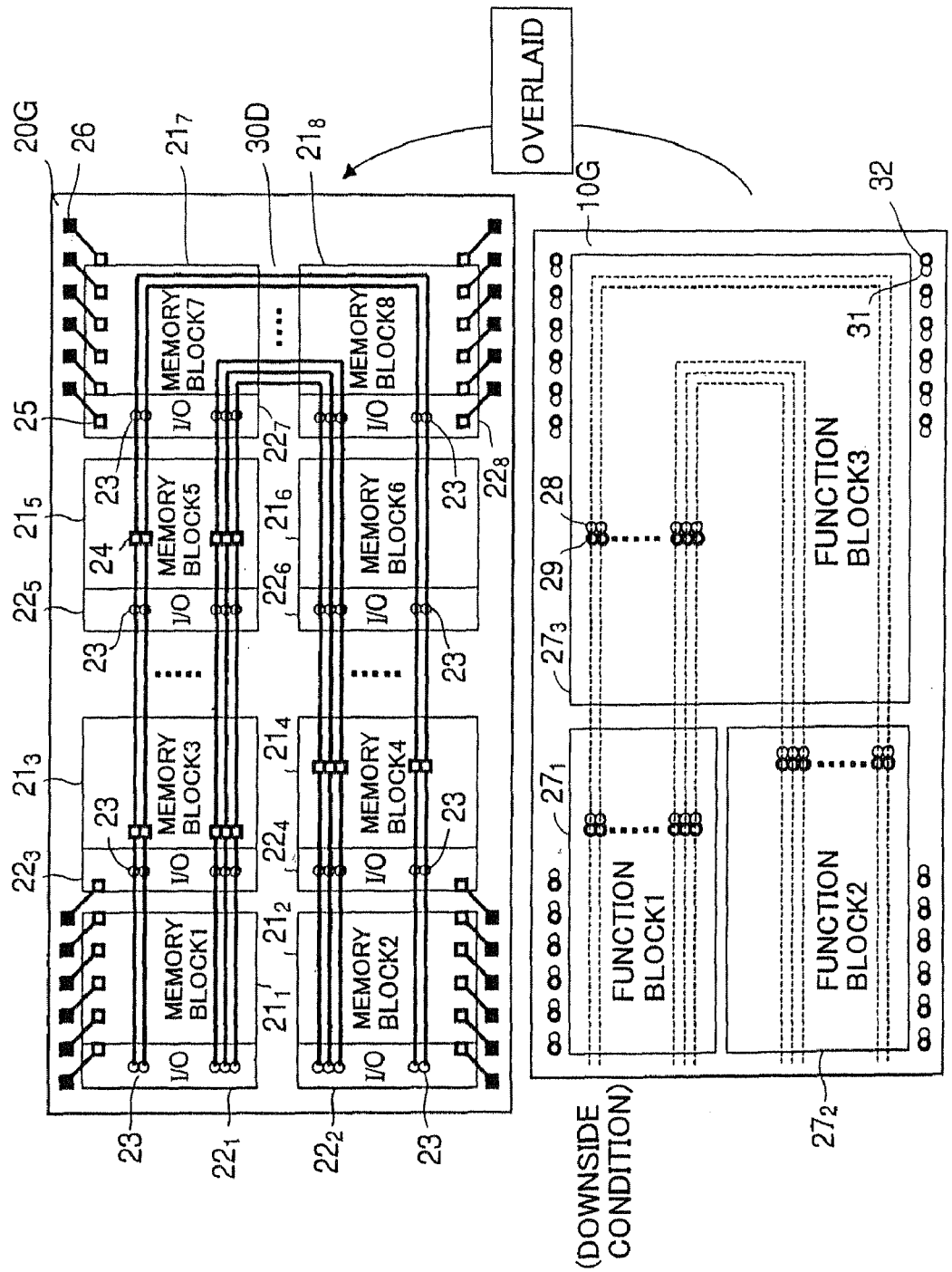
FIG. 21 is a diagram of a sixth preferred embodiment of the multi-chip semiconductor apparatus of the invention.

FIG. 21 shows a sixth preferred embodiment of the multi-chip semiconductor apparatus of the invention.

In FIG. 21, the elements that are essentially the same as corresponding elements in the preceding embodiments are designated by the same reference numerals, and a description thereof will be omitted.

As shown, the multi-chip semiconductor apparatus of this embodiment includes the logic chip 10G and the memory chip 20G. The memory chip 20G of the present embodiment includes the eight memory blocks $21_1$ through $21_8$, the eight I/O devices $22_1$ through $22_8$, and the U-shaped large-size bus 30D.

The U-shaped large-size bus 30D is useful when the formation of the loop-like large-size bus is impossible. The signal lines of the bus 30D are connected to the I/O devices $22_1$ through $22_8$ via the contacts 23. One end of each of the signal lines of the bus 30D is terminated at the I/D device $22_1$, and the other end of each of the signal lines of the bus 30D is terminated at the I/O device $22_2$. The pads 24 are provided on the signal lines of the bus 30D, and the signal lines of the bus 30D are connected to the logic chip 10G via the pads 24.

The logic chip 10G of the present embodiment includes the three function blocks $27_1$ through $27_3$, the contacts 28 and the projecting electrodes 29 (or the bumps 29). The locations where the electrodes 29 are disposed in the logic chip 10G correspond to the locations where the pads 24 are disposed in the memory chip 20G. When the logic chip 10G is overlaid onto the memory chip 20G, the electrodes 29 contact the pads 24 of the memory chip 20G so that the function blocks $27_1$ through $27_3$ of the logic chip 10G are connected with the U-shaped large-size bus 30D via the connection of the electrodes 29 and the pads 24.

Figure 22:
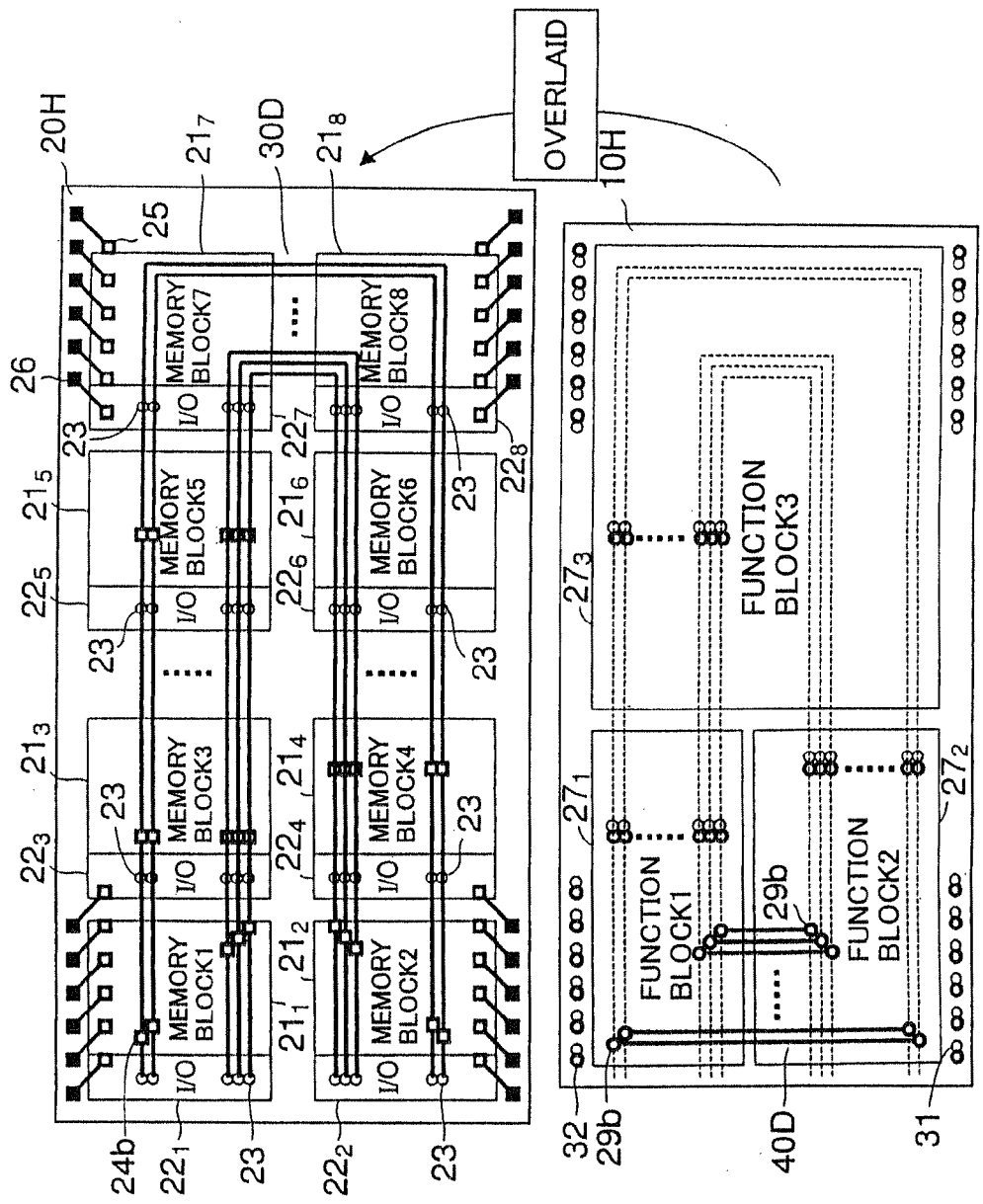
FIG. 22 is a diagram of a seventh preferred embodiment of the multi-chip semiconductor apparatus of the invention.

FIG. 22 shows a seventh preferred embodiment of the multi-chip semiconductor apparatus of the invention.

In FIG. 22, the elements that are essentially the same as corresponding elements in the preceding embodiments are designated by the same reference numerals, and a description thereof will be omitted.

As shown, the multi-chip semiconductor apparatus of this embodiment includes the logic chip 10H and the memory chip 20H. The multi-chip semiconductor apparatus of this embodiment is essentially the same as that of FIG. 21 but it differs from that of FIG. 21 in the following matters.

The large-size bus 40D is provided on the logic chip 10H. When the logic chip 10H is overlaid onto the memory chip 20H, the large-size bus 40D and the U-shaped large-size bus 30D are combined together to form the loop-like large-size bus. For this purpose, the projecting electrodes 29b (or the bumps 29b) are provided at the ends of the signal lines of the bus 40D, and the pads 24b are provided on the signal lines of the bus 30D at the corresponding locations thereof.

Figure 23:
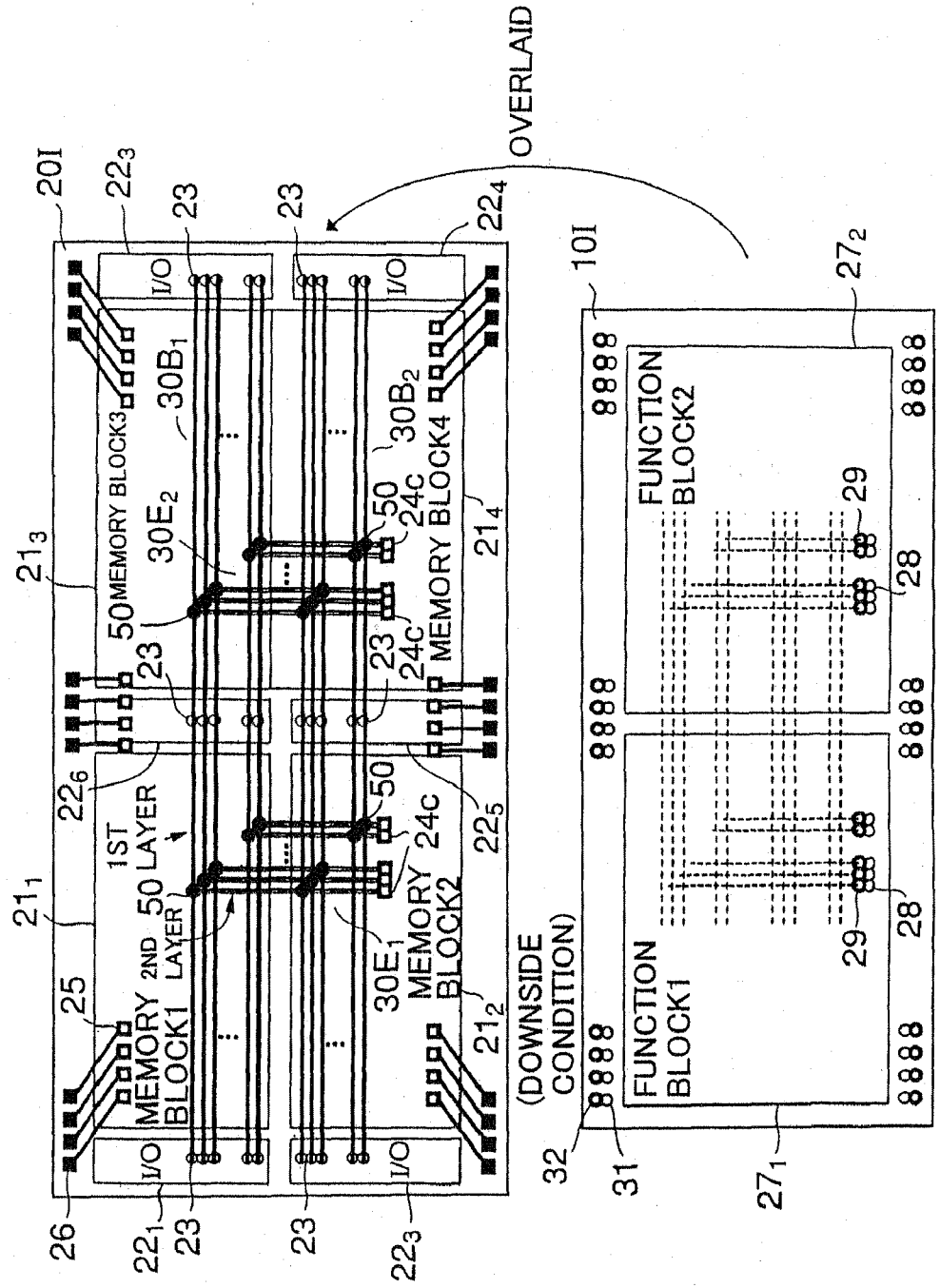
FIG. 23 is a diagram of an eighth preferred embodiment of the multi-chip semiconductor apparatus of the invention.
Figure 24:
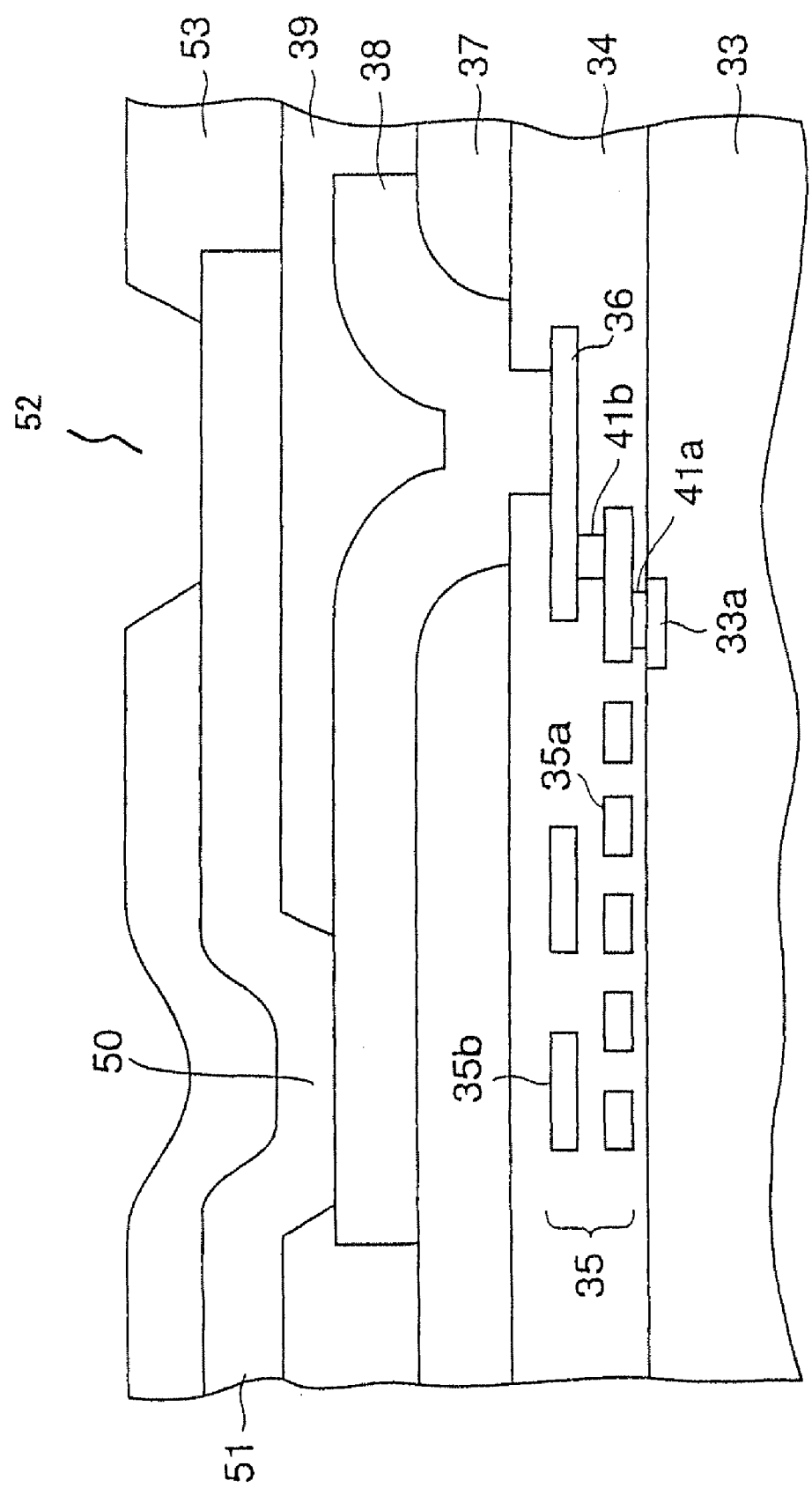
FIG. 24 is a cross-sectional view of the multi-chip semiconductor apparatus shown in FIG. 23.

FIG. 23 shows an eighth preferred embodiment of the multi-chip semiconductor apparatus of the invention. FIG. 24 is a cross-sectional view of the multi-chip semiconductor apparatus shown in FIG. 23.

In FIG. 23, the elements that are essentially the same as corresponding elements in the preceding embodiments are designated by the same reference numerals, and a description thereof will be omitted.

As shown, the multi-chip semiconductor apparatus of this embodiment includes the logic chip 10I and the memory chip 20I. The multi-chip semiconductor apparatus of the present embodiment is characterized by the large-size bus connection that is formed into the multi-layer wiring structure.

The memory chip 20I of the present embodiment has the two large-size bus wiring layers including the first wiring layer and the second wiring layer. The first wiring layer provides the large-size buses $30B_1$ and $30B_2$, and the second wiring layer provides the large-size buses $30E_1$ and $30E_2$. In FIG. 23, the large-size buses $30E_1$ and $30E_2$ of the second wiring layer are indicated by the double lines. In the present embodiment, the first wiring layer and the second wiring layer are arranged so that they are perpendicular to each other. The large-size buses $30B_1$ and $30B_2$ of the first wiring layer and large-size buses $30E_1$ and $30E_2$ of the second wiring layer are interconnected via the through holes 50 (or the vias 50).

The pads 24c are provided on the signal lines of the second-wiring-layer buses $30E_1$ and $30E_2$, and these buses $30E_1$ and $30E_2$ are connected to the logic chip 10I via the pads 24c. Similar to the previous embodiment, the projecting electrodes 29 of the logic chip 10I contact the pads 24c of the memory chip 20I when the logic chip 10I is overlaid onto the memory chip 20I.

FIG. 24 shows the relationship between the first wiring layer and the second wiring layer in the multi-chip semiconductor apparatus of the present embodiment.

As shown, the large-size bus of the first wiring layer 38 and the large-size bus of the second wiring layer 51 are electrically connected to each other via the through hole 50. The second wiring layer 51 is covered with the cover layer 53. In the case of the single-layer structure, the insulating layer 39 serves as the cover layer. However, as shown in FIG. 24, in the case of the multiple-layer structure, the insulating layer 39 serves as the inter-layer insulating layer. The pad 52 is formed in the cover layer 53 at the location where the second wiring layer 51 is partially exposed. The pad 52 is provided to make the electrical connection with the logic chip 1oI. The pad 52 in this embodiment corresponds to the pad 24c shown in FIG. 23.

In the embodiment of FIG. 24, the large-size bus of the first wiring layer 38 and the large-size bus of the second wiring layer 51 are parallel to each other, which is different from the configuration of the multi-chip semiconductor apparatus of FIG. 23. However, the embodiment of FIG. 24 is given for the sake of illustration of the relationship between the first wiring layer and the second wiring layer.

Further, in the present embodiment, the electrical connection between the large-size buses $30B_1$ and $30B_2$ of the first wiring layer is made by the large-size buses $30E_1$ and $30E_2$ of the second wiring layer. Hence, dissimilar to the logic chip 10D of the previous embodiment in FIG. 18, the logic chip 10I of the present embodiment is not provided with the buses $40C_1$ and $40C_2$.

The multi-layer wiring structure of the present invention is not limited to the two-layer wiring structure as in the above embodiment. It is possible that the three or more layer wiring structure be configured into the multi-chip semiconductor apparatus.

Figure 25:
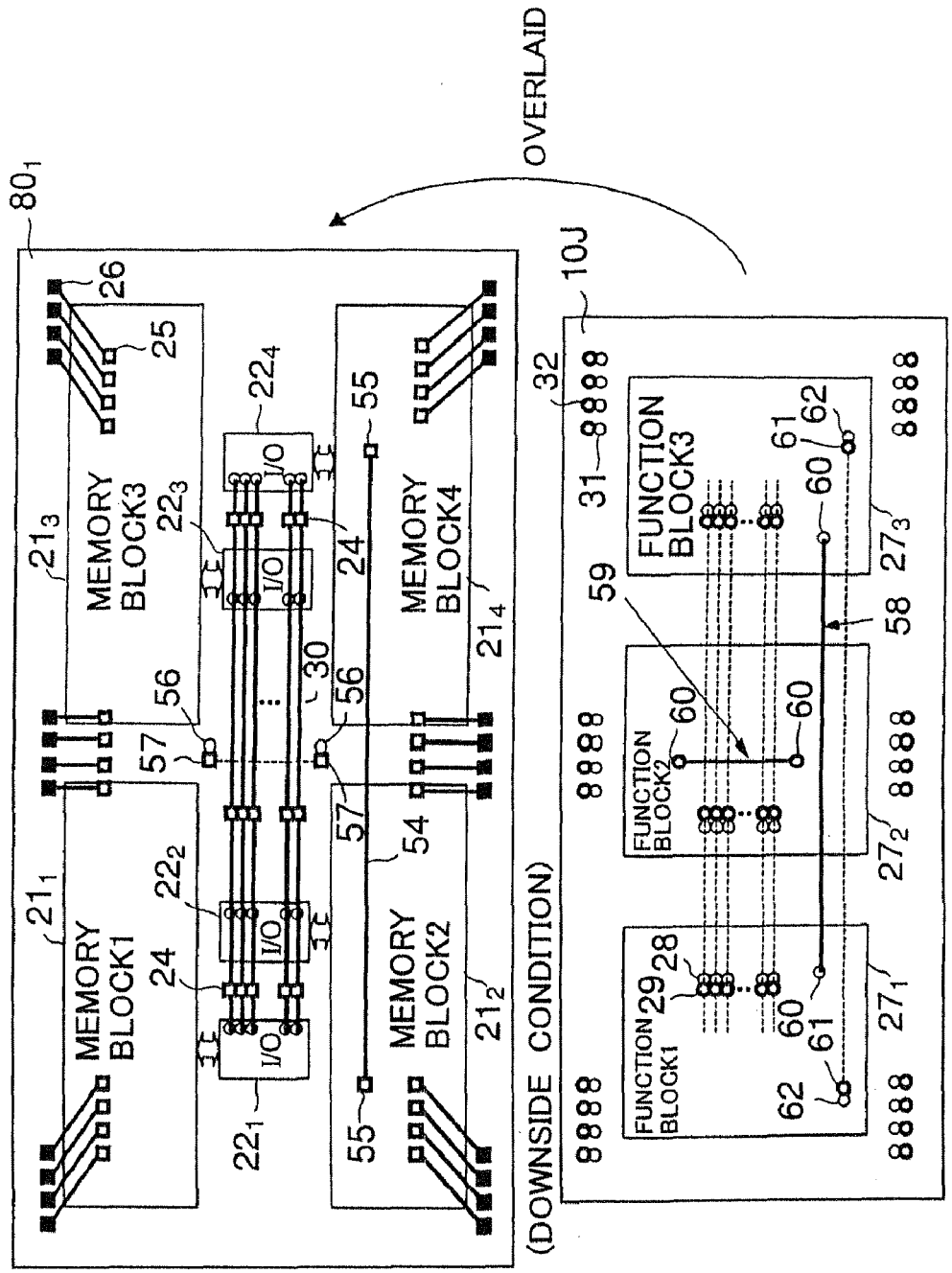
FIG. 25 is a diagram of a ninth preferred embodiment of the multi-chip semiconductor apparatus of the invention.

FIG. 25 shows a ninth preferred embodiment of the multi-chip semiconductor apparatus of the invention.

In FIG. 25, the elements that are essentially the same as corresponding elements in the preceding embodiments are designated by the same reference numerals, and a description thereof will be omitted.

As shown, the multi-chip semiconductor apparatus of this embodiment includes the logic chip 10J and the memory chip 20J. The multi-chip semiconductor apparatus of the present embodiment is characterized in that the internal circuits of the chips are interconnected by using the large-size bus. The large-size bus 58 interconnects the function block $27_1$ and the function block $27_3$ in the logic chip 10J. One end of the large-size bus 58 is coupled to the function block $27_1$ via the contact 60, and the other end of the large-size bus 58 is coupled to the function block $27_3$ via the contact 60.

Further, in the present embodiment, the large-size bus 54 is provided on the memory chip 20J in order to interconnect the function block $27_1$ and the function block $27_3$ in the logic chip 10J when the logic chip 10J is overlaid onto the memory chip 20J. In each of the function blocks $27_1$ and $27_3$, the contact 62 and the projecting electrode 61 (or the bump 61) are provided. The pads 55 are provided at both ends of the large-size bus 54 in the large-size bus 54 of the memory chip 20J, and the pads 55 are connected to the projecting electrodes 61 when the two chips are combined together. The function blocks 27₁ and 27₃ are electrically connected to each other by the large-size bus 54 of the memory chip 20J.

Further, in the present embodiment, the large-size bus 59 is provided on the logic chip 10J in order to electrically connect the pad-like electrodes 57 of the large-size bus 30 of the memory chip 20J. The electrodes 57 are electrically connected with the contacts 56 which are connected to the internal circuits of the memory chip 20J. The contacts 56 and the electrodes 57 are configured in the same manner as those corresponding elements in FIG. 14.

As described above, the internal circuits of the chips are interconnected by using the large-size bus.

The memory chips 20A through 20J of the above embodiments may be arranged as the memory blocks in the large-scale integration (LSI) system. In such a case, the multi-purpose LSI system may be constructed by the multi-chip semiconductor apparatus of the present invention.

Figure 26:
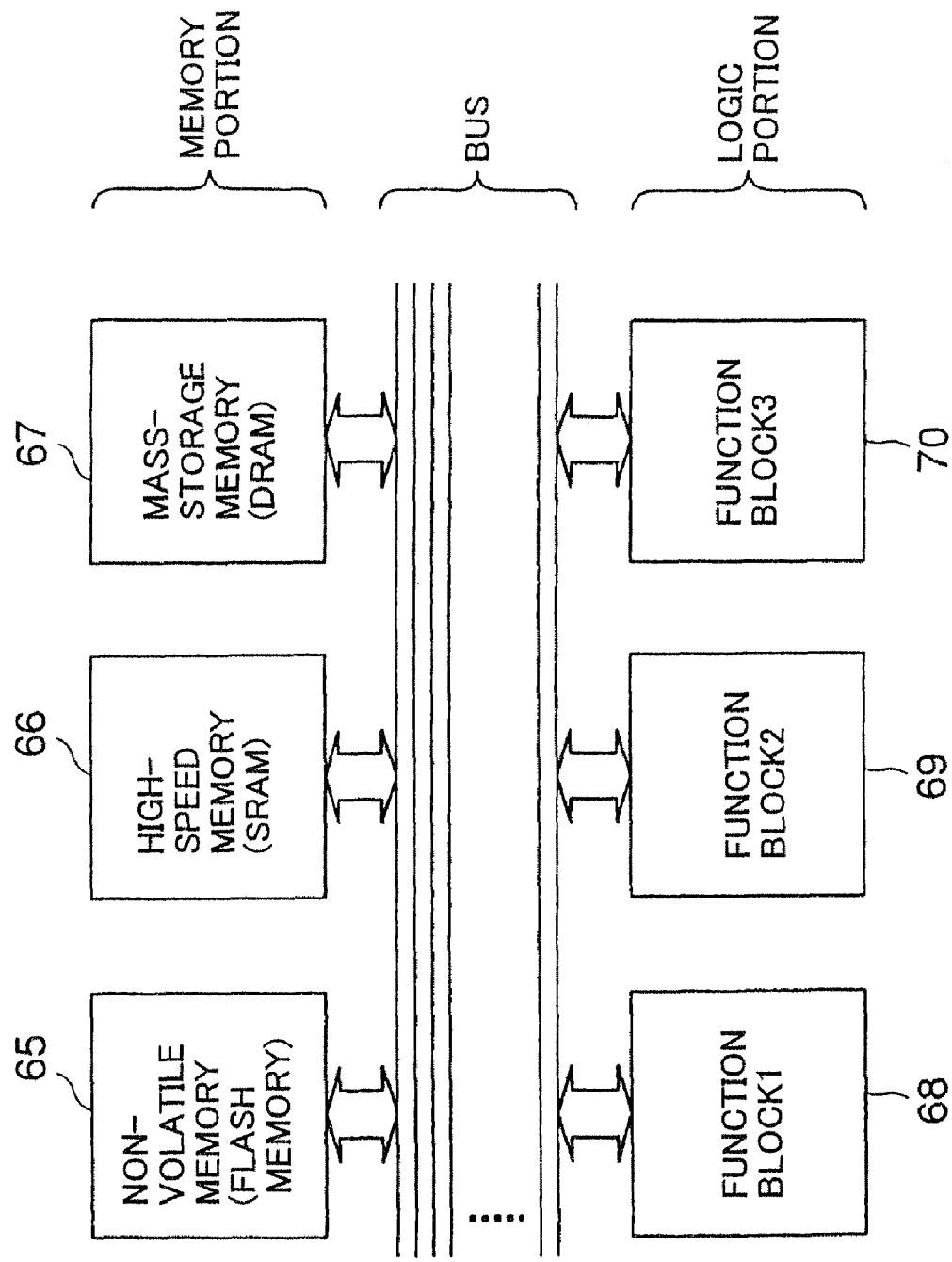
FIG. 26 is a diagram for explaining a configuration of an LSI system.

FIG. 26 shows a configuration of the LSI system in which the above matters are taken into consideration.

As shown in FIG. 26, the LSI system generally includes the non-volatile memory 65 (such as a flash memory), the high-speed memory 66 (such as a cash memory), and the mass-storage memory 67 (such as a DRAM). These memory blocks in the memory portion of the LSI system are interconnected by the large-size bus. Further, the function blocks 68 through 70 in the logic portion of the LSI system are interconnected by the large-size bus. Each of the function blocks 68-70 can access the memory blocks 65-68 through the large-size bus.

In the following, several embodiments of the multi-chip semiconductor apparatus of the invention are applied to the LSI system shown in FIG. 26.

Figure 27:
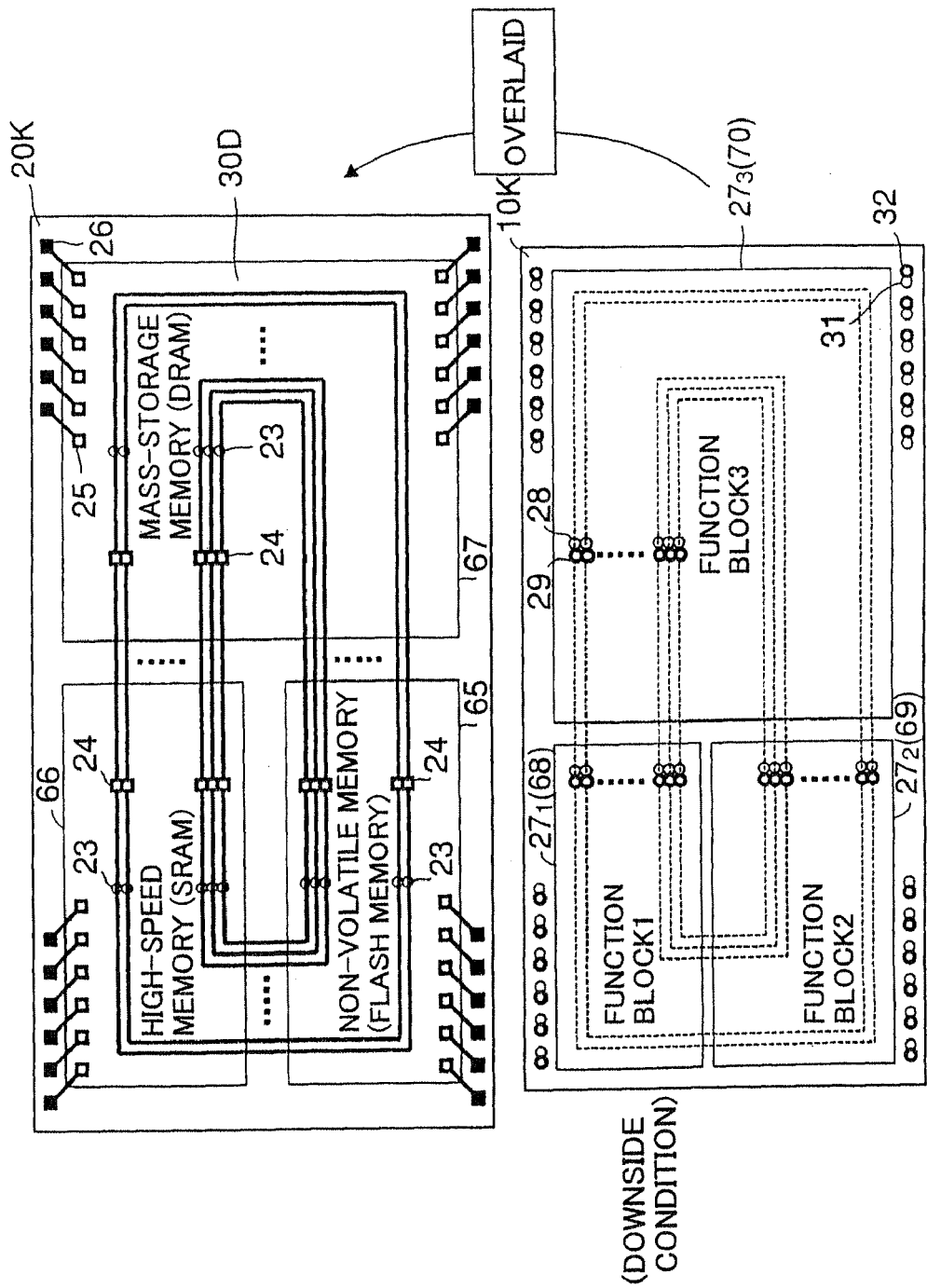
FIG. 27 is a diagram of a tenth preferred embodiment of the multi-chip semiconductor apparatus of the invention.

FIG. 27 shows a tenth preferred embodiment of the multi-chip semiconductor apparatus of the invention.

In FIG. 27, the elements that are essentially the same as corresponding elements in the preceding embodiments are designated by the same reference numerals, and a description thereof will be omitted.

As shown, the multi-chip semiconductor apparatus of this embodiment includes the logic chip 10K and the memory chip 20K. The memory chip 20K of the present embodiment includes the non-volatile memory 65 (such as a flash memory), the high-speed memory 66 (such as an SRAM), and the mass-storage memory 67 (such as a DRAM). These memory blocks are interconnected by the loop-like large-size bus 30. In other words, the memory chip 20K corresponds to the memory chip 20E of FIG. 19 in which the memory blocks are configured into the flash memory, the SRAM and the DRAM.

The logic chip 10K of the present embodiment includes the function blocks 27₁ through 27₃ (corresponding to the function blocks 68 through 70 in FIG. 26), the contacts 28 and the projecting electrodes 29 (or the bumps 29). The logic chip 10K corresponds to the logic chip 10E in FIG. 19. The logic chip 10K is overlaid onto the memory chip 20K.

Figure 28:
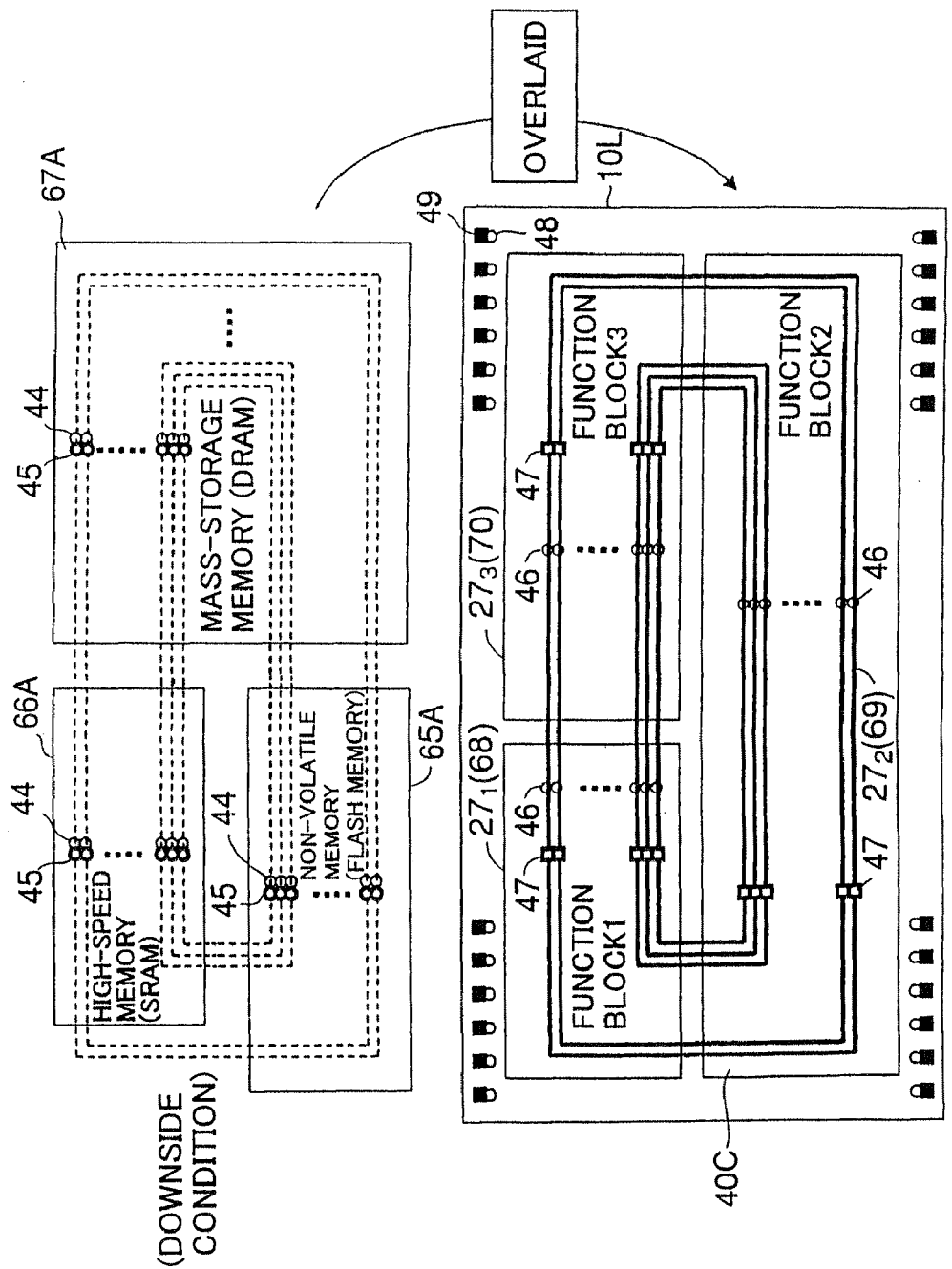
FIG. 28 is a diagram of an eleventh preferred embodiment of the multi-chip semiconductor apparatus of the invention.

FIG. 28 shows an eleventh preferred embodiment of the multi-chip semiconductor apparatus of the invention.

In FIG. 28, the elements that are essentially the same as corresponding elements in the preceding embodiments are designated by the same reference numerals, and a description thereof will be omitted.

As shown, the multi-chip semiconductor apparatus of this embodiment includes the logic chip 10L and the three separate memory chips. The memory chips of the present embodiment include the non-volatile memory 65A (such as a flash memory), the high-speed memory 66A (such as an SRAM), and the mass-storage memory 67A (such as a DRAM). These memory chips are overlaid onto the logic chip 10L. Each of the memory blocks 65A through 67A includes the internal circuit, the contacts 44 and the projecting electrodes 45 (or the bumps 45).

The logic chip 10L of the present embodiment is larger in size than the sum of the three memory chips 65A through 67A. The logic chip 10L includes the function blocks 27₁ through 27₃, the contacts 46, the pads 47, and the loop-like large-size bus 40C. The bus 40C interconnects the function blocks 27₁ through 27₃ via the contacts 46. The pads 47 are provided on the signal lines of the bus 40C, and, when the memory chips 66A through 67A are overlaid onto the logic chip 10L, the electrodes 45 contact the pads 47 so that the memory chips 66A through 67A are interconnected by the bus 40C.

In the present embodiment, it is not necessarily required that the large-size bus 40C be provided on the logic chip 10L. For example, similar to the seventh preferred embodiment of FIG. 22, the large-size bus may be provided on the memory chip 67A, and when the memory chips and the logic chip are combined together, the large-size bus of the memory chip 67A is connected to the large-size bus of the logic chip to form the loop-like large-size bus.

Figure 29:
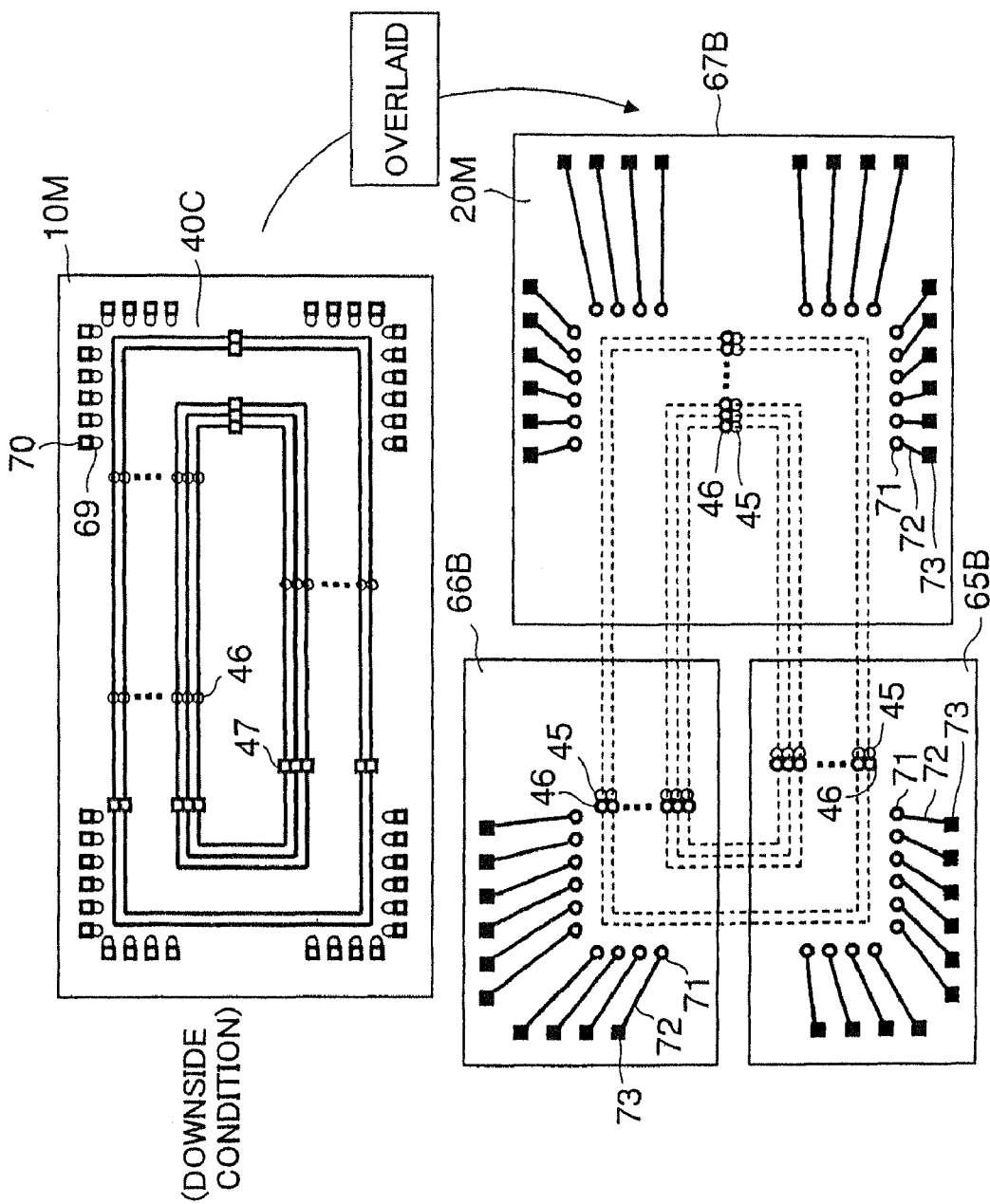
FIG. 29 is a diagram of a twelfth preferred embodiment of the multi-chip semiconductor apparatus of the invention.

FIG. 29 shows a twelfth preferred embodiment of the multi-chip semiconductor apparatus of the invention.

In FIG. 29, the elements that are essentially the same as corresponding elements in the preceding embodiments are designated by the same reference numerals, and a description thereof will be omitted.

As shown, the multi-chip semiconductor apparatus of this embodiment includes the logic chip 10M and the three separate memory chips. The memory chips of the present embodiment include the non-volatile memory 65B (such as a flash memory), the high-speed memory 66B (such as an SRAM), and the mass-storage memory 67B (such as a DRAM). The logic chip 10M is overlaid onto the three memory chips. The logic chip 10M of the present embodiment is smaller in size than the sum of the three memory chips 65B through 67B. Each of the memory blocks 65B through 67B includes the internal circuit, the projecting electrodes 71 (or the bumps 71), the external connection pads 73, and the large-size bus 71. The bus 71 interconnects the electrodes 71 and the pads 73.

The logic chip 10M includes the loop-like large-size bus 40C. The pads 47 are provided on the signal lines of the bus 40C, and, when the logic chip 10M is overlaid onto the memory chips 65B through 67B, the pads 47 contact the electrodes 45 so that the memory chips 65B through 67B are interconnected by the bus 40C.

Figure 30:
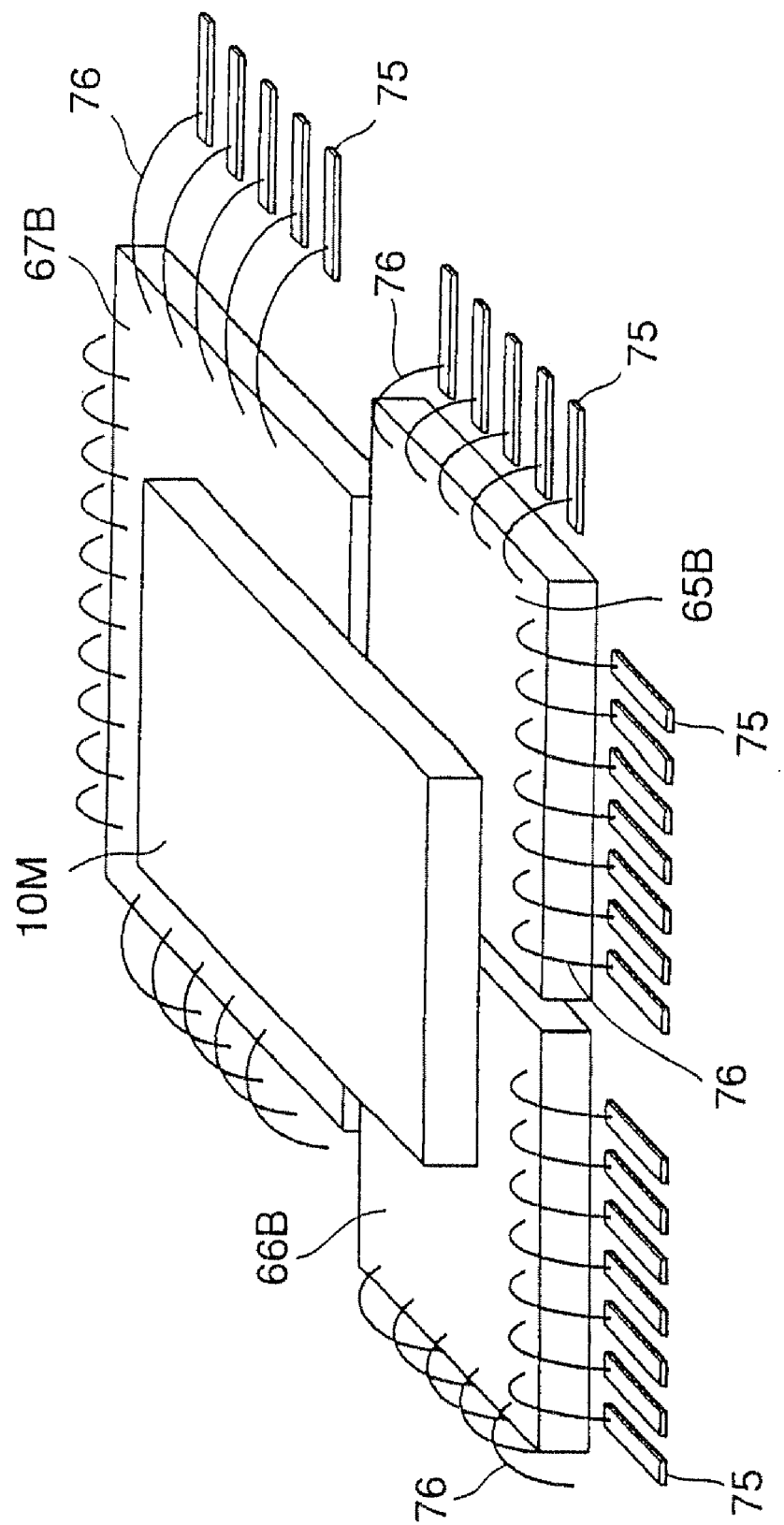
FIG. 30 is a perspective view of the multi-chip semiconductor apparatus shown in FIG. 29.

FIG. 30 is a perspective view of the multi-chip semiconductor apparatus in FIG. 29 when the logic chip 10M is overlaid onto the memory chips 65B through 67B. The memory chips 65B through 67B are mounted on the stage of the package. By using the bonding wires 76, the external connection pads 71 are electrically connected to the electrodes 75 of the stage of the package. The logic chip 10M and the memory chips 65B through 67B are covered with a resin material (not shown) of the package.

Figure 31:
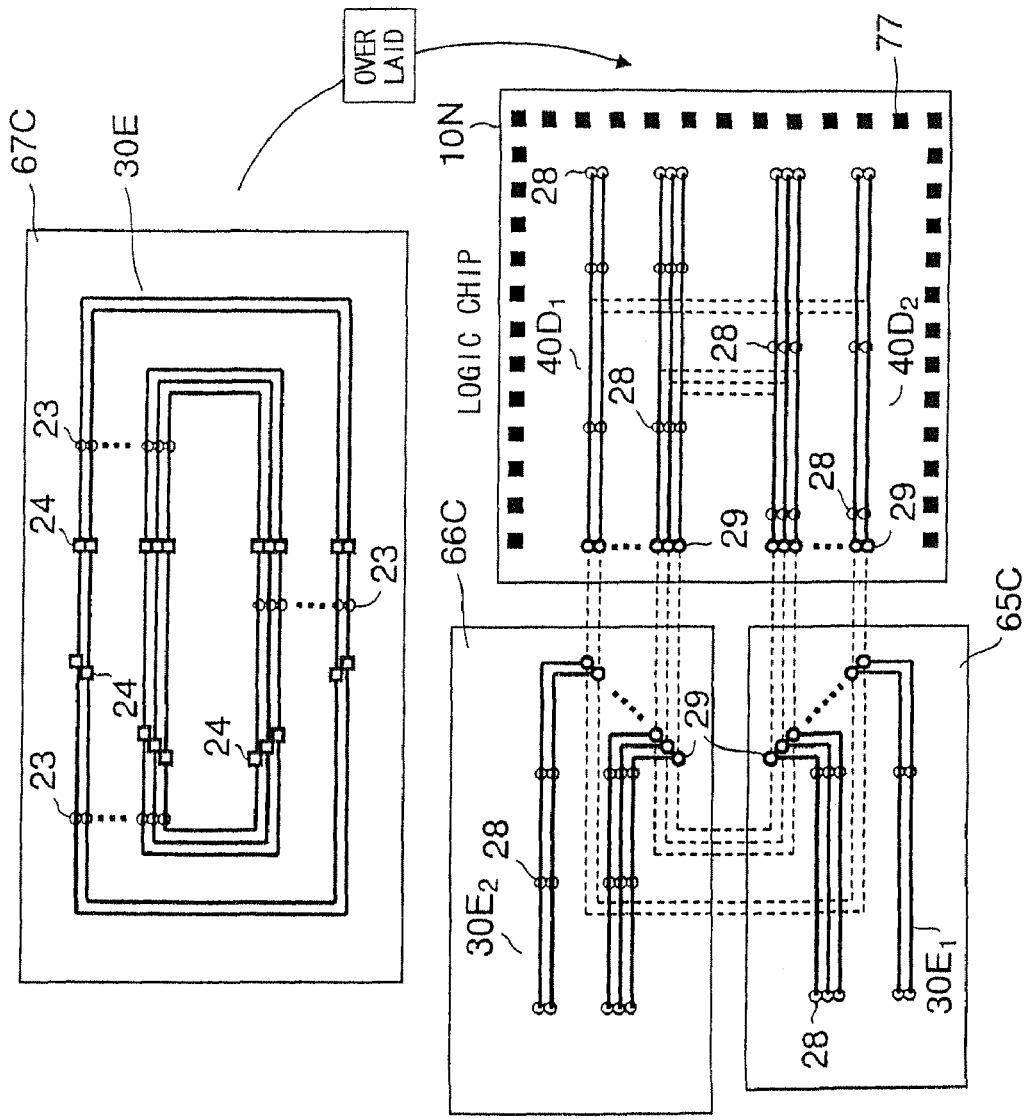
FIG. 31 is a diagram of a thirteenth preferred embodiment of the multi-chip semiconductor apparatus of the invention.

FIG. 31 shows a thirteenth preferred embodiment of the multi-chip semiconductor apparatus of the invention.

In FIG. 31, the elements that are essentially the same as corresponding elements in the preceding embodiments are designated by the same reference numerals, and a description thereof will be omitted.

As shown, the multi-chip semiconductor apparatus of this embodiment includes the logic chip 10N, the non-volatile memory 65C (such as a flash memory), the high-speed memory 66C (such as an SRAM), and the mass-storage memory 67C (such as a DRAM). The multi-chip semiconductor apparatus of the present embodiment is a variation of the multi-chip semiconductor apparatus of FIG. 29.

The memory chip 67C is overlaid onto the logic chip 10N and the two memory chips 65C and 66C. The memory chip 67C of the present embodiment is smaller in size than the sum of the two memory chips 65C and 66C and the logic chip 10N. The loop-like large-size bus 30E is provided on the memory chip 67C. The large-size bus $30E_1$ is provided on the memory chip 65C, and the large-size bus $30E_2$ is provided on the memory chip 66C. The large-size buses $40D_1$ and $40D_2$ are provided on the logic chip 10N.

The pads 24 are provided on the signal lines of the bus 30E of the memory chip 67C, and, when the memory chip 67C is overlaid onto the logic chip 10M and the memory chips 65C and 66C, the pads 24 contact the electrodes 29 so that the memory chips 65C and 66C and the logic chip 10N are interconnected by the buses 30E, $30E_1$, $30E_2$, $40D_1$ and $40D_2$.

In the present embodiment, the memory chips 65C, 66C and 67C are considered the non-volatile memory, the high-speed memory and the mass-storage memory, for the sake of convenience. However, the present invention is not limited to this embodiment. For example, the memory chip 67C may be the high-speed memory. The logic chip 10N may be a memory chip, and one of the memory chips 65C-67C may be the logic chip.

Figure 32:
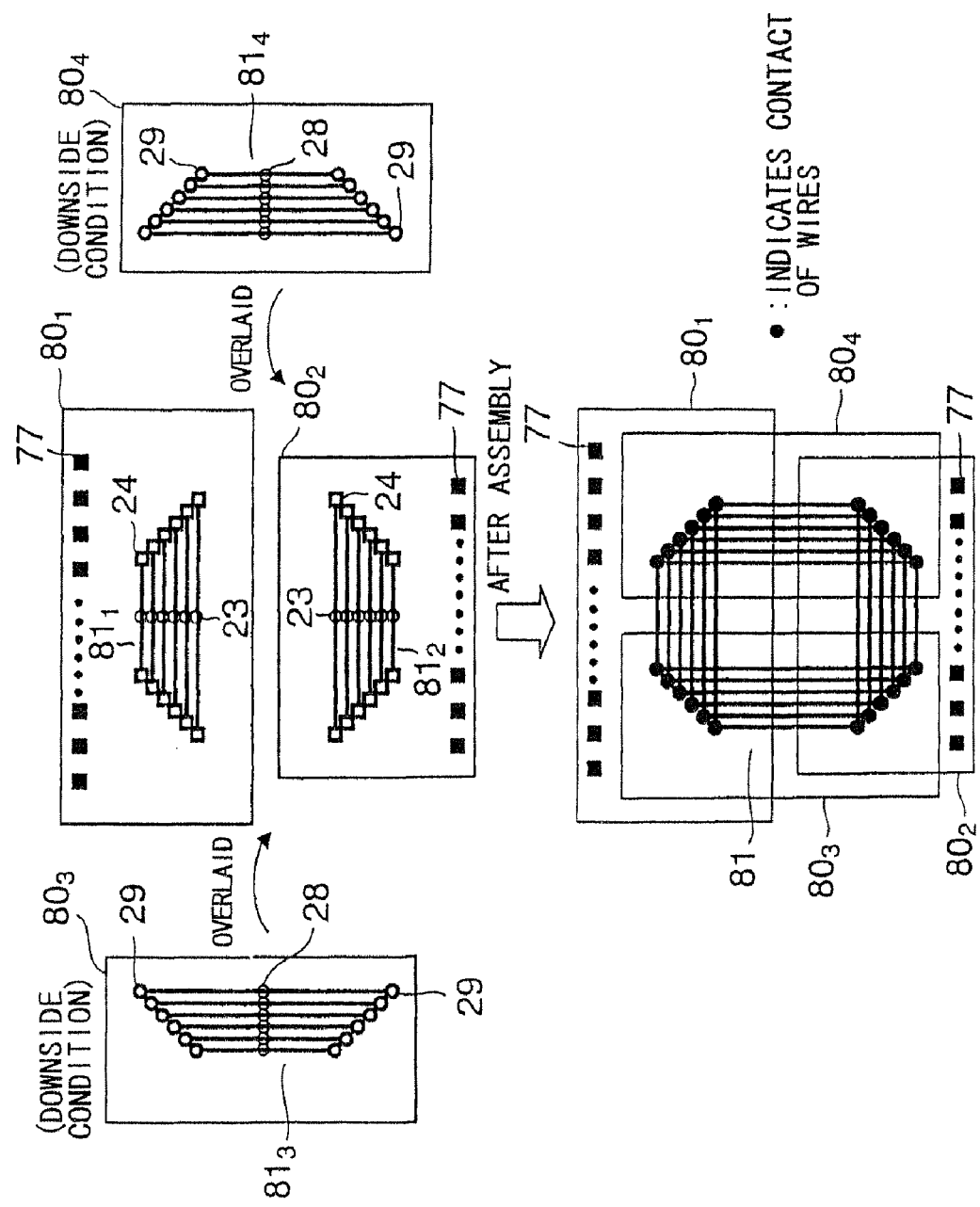
FIG. 32 is a diagram of a fourteenth preferred embodiment of the multi-chip semiconductor apparatus of the invention.

FIG. 32 shows a fourteenth preferred embodiment of the multi-chip semiconductor apparatus of the invention.

In FIG. 32, the elements that are essentially the same as corresponding elements in the preceding embodiments are designated by the same reference numerals, and a description thereof will be omitted.

As shown, the multi-chip semiconductor apparatus of this embodiment includes the four chips $80_1$ through $80_4$. The longitudinal sides of the chips $80_1$ and $80_2$ confront each other, and the chips $80_3$ and $80_4$ are overlaid onto the chips $80_1$ and $80_2$. After the chips are combined together, the loop-like large-size bus 81 is formed.

Each of the chips $80_1$ and $80_2$ includes the internal circuit, the large-size bus 81, the contacts 23, the pads 24, and the external connection pads 77. Each of the chips $80_3$ and $80_4$ includes the internal circuit, the large-size bus 81, the contacts 28 and the projecting electrodes 29.

In the present embodiment, when the chips $80_3$ and $80_4$ are overlaid onto the chips $80_1$ and $80_2$, the projecting electrodes 28 contact the pads 23 so that the loop-like large-size bus 81 is formed and the four chips are interconnected by the bus 81.

Figure 33:
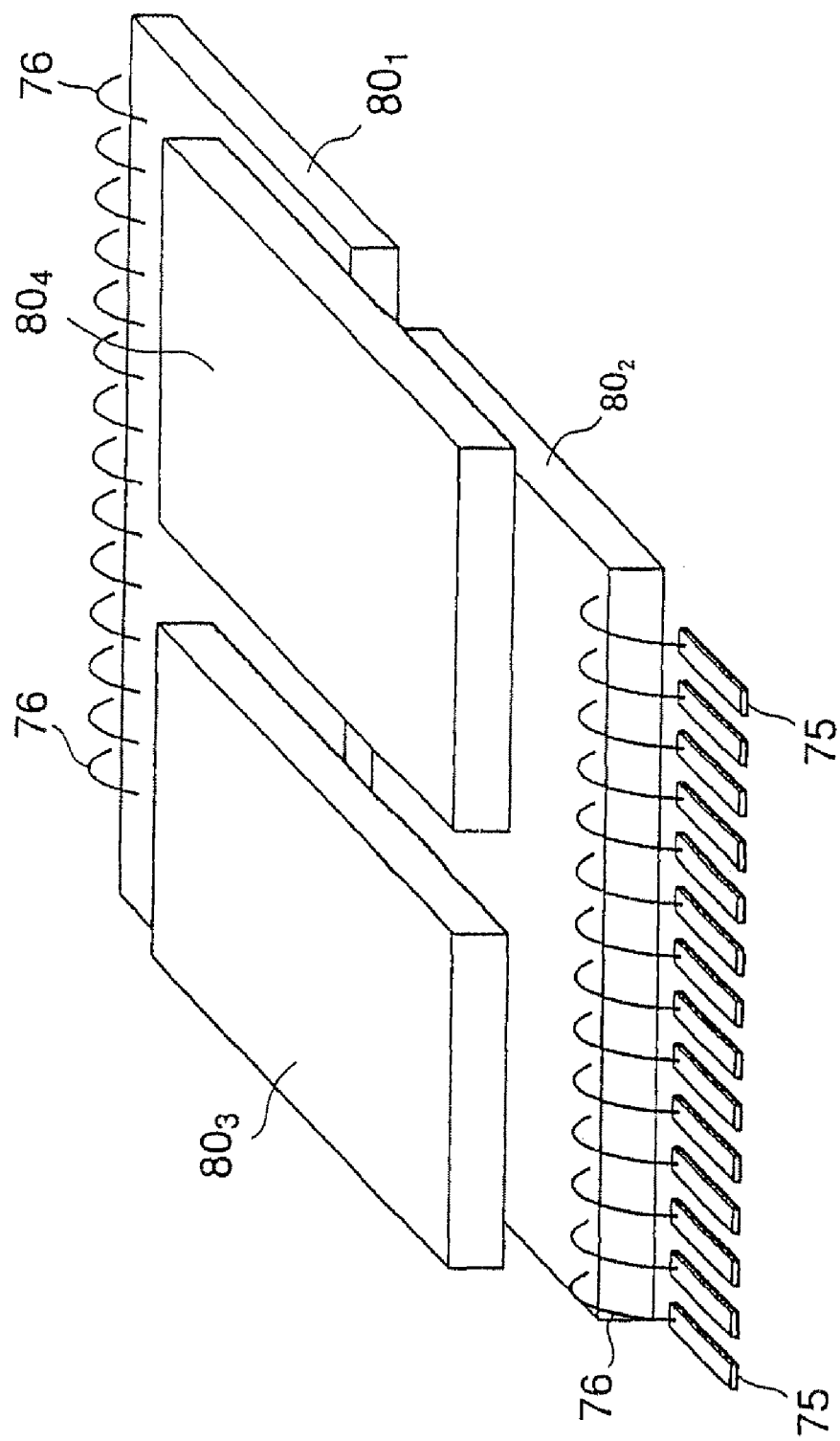
FIG. 33 is a perspective view of the multi-chip semiconductor apparatus shown in FIG. 32.

FIG. 33 is a perspective view of the multi-chip semiconductor apparatus in FIG. 32 when the chips $80_3$ and $80_4$ are overlaid onto the chips $80_1$ and $80_2$. The chips $80_1$ and $80_2$ are mounted on the stage of the package. By using the bonding wires 76, the external connection pads 77 are electrically connected to the electrodes 75 of the stage of the package. The chips $80_1$ through $80_4$ are covered with a resin material (not shown) of the package.

FIG. 34A and FIG. 34B show a fifteenth preferred embodiment of the multi-chip semiconductor apparatus of the invention.

In FIG. 34A and FIG. 34B, the elements that are essentially the same as corresponding elements in the preceding embodiments are designated by the same reference numerals, and a description thereof will be omitted.

As shown, the multi-chip semiconductor apparatus of this embodiment includes the three chips $85_1$ through $85_3$. The longitudinal sides of the chips $85_1$ and $85_2$ confront each other, and the chip $85_3$ is overlaid onto the chips $85_1$ and $85_2$. After the chips are combined together, the large-size buses 86 are formed.

Each of the chips $85_1$ and $85_2$ includes the internal circuit, the large-size bus 86, the contacts 23, the pads 24, and the external connection pads 77. The chip $85_3$ includes the internal circuit, the large-size bus $86_3$, the contacts 28 and the projecting electrodes 29.

In the present embodiment, when the chips $85_3$ is overlaid onto the chips $85_1$ and $85_2$, the projecting electrodes 28 contact the pads 23 so that the large-size buses 86 are combined and the three chips 85 are interconnected by the buses 86.

FIG. 34B is a perspective view of the multi-chip semiconductor apparatus in FIG. 34A when the chip $85_3$ is overlaid onto the chips $85_1$ and $85_2$. The chips $80_1$ and $80_2$ are mounted on the stage of the package.

FIG. 35 shows another configuration of the LSI system, which is different from the LSI system in FIG. 26.

As shown in FIG. 35, the LSI system generally includes the non-volatile memory 65 (such as a flash memory), the mass-storage memory 67 (such as a DRAM), the frame memory 91, the large-size bus, and the logic chip 68. The frame memory 91 stores image data. The logic chip 68 performs image-processing procedures for the image data stored in the frame memory 91, and delivers the processed image data to the memory chips 65 and 67. In the actual procedures, the image data is read from the frame memory 91, and the processed image data produced by the logic chip 68 is delivered to the memory chips 65 and 67. It is difficult for the LSI system in FIG. 26 to efficiently perform the above parallel processes because the large-size bus is shared by the respective chips.

In the LSI system of the present embodiment, the above matters are taken into consideration. The frame memory 91 is not connected to the large-size bus, and it is connected directly to the logic chip 68 via the bus 92. It is preferred that the bus 92 is also provided in the large-size bus wiring layer.

Figure 36:
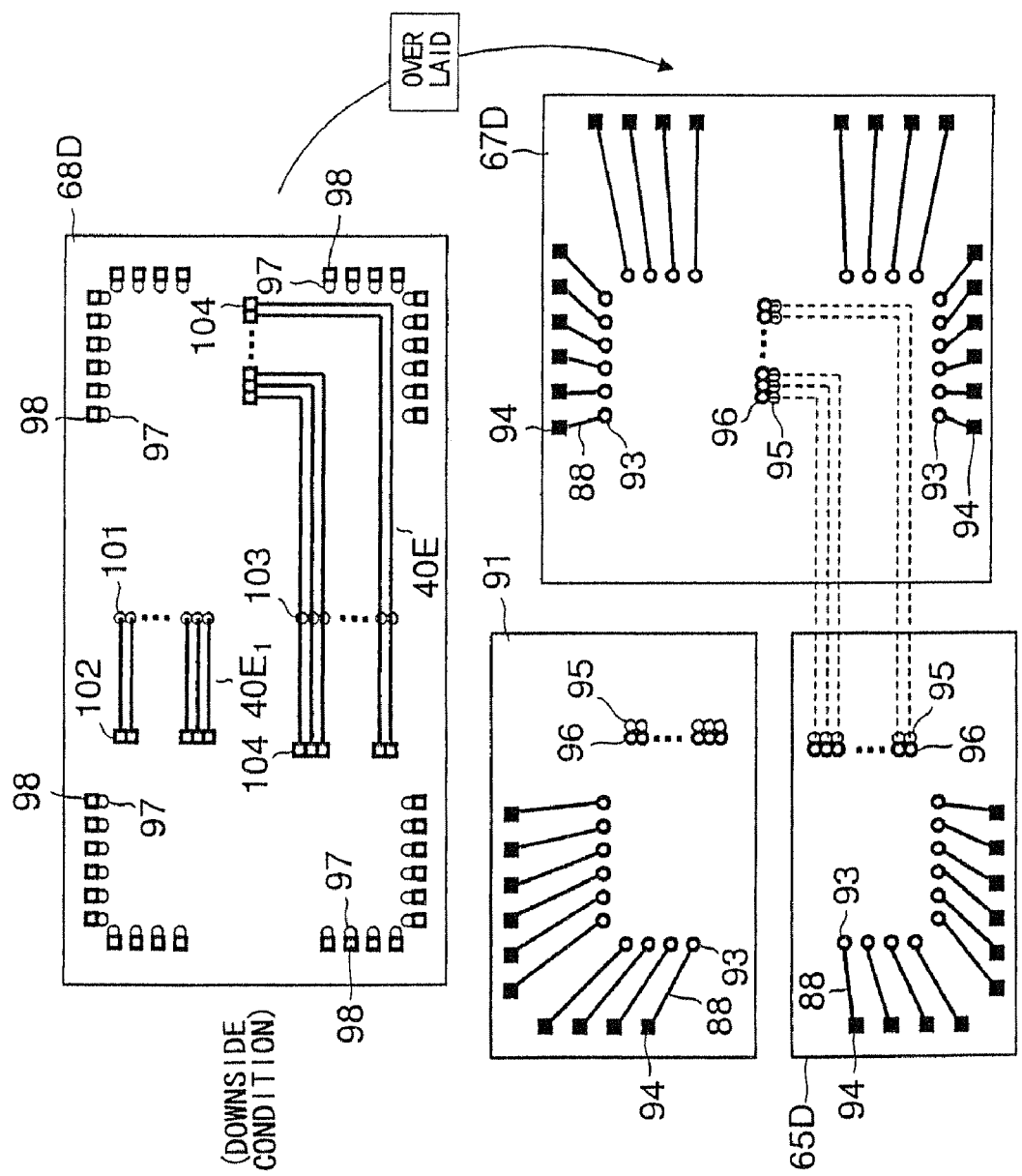
FIG. 36 is a diagram of a sixteenth preferred embodiment of the multi-chip semiconductor apparatus of the invention.

FIG. 36 shows a sixteenth preferred embodiment of the multi-chip semiconductor apparatus of the invention which has the system configuration shown in FIG. 35.

In FIG. 36, the elements that are essentially the same as corresponding elements in the preceding embodiments are designated by the same reference numerals, and a description thereof will be omitted.

As shown, the multi-chip semiconductor apparatus of this embodiment includes the non-volatile memory chip 65D, the mass-storage memory 67D, the frame memory 91 and the logic chip 68D. The logic chip 68D is overlaid onto the three memory chips 65D, 67D and 91. Each of the memory chips 65D, 67D and 91 includes the internal circuit, the contacts 93, the external connection pads 94, and the large-size bus 88. Each of the memory chips 65D, 67D and 91 includes the contacts 95 and the projecting electrodes 96 (or the bumps 96). The large-size bus 88 interconnects the contacts 95 and the electrodes 96. The electrodes 96 are provided to make the electrical connection of the logic chip 68D and the memory chips 65D, 67D and 91.

The logic chip 68D of the present embodiment includes the large-size bus 40E, the large-size bus $40E_1$, the internal circuit, the contacts 97, and the pads 98. The pads 98 are connected to the contacts 97 via the large-size bus wiring layer. The bus 40E is connected to the internal circuit via the contacts 103. The pads 104 are provided at both ends of the signal lines of the bus 40E, and the pads 104 are used for connection with the corresponding memory chips. The contacts 101 are provided at one ends of the signal lines of the bus $40E_1$ and the pads 102 are provided at the other ends of the signal lines of the bus 40E₁. The pads 102 are used for connection with the corresponding memory chips.

When the logic chip 68D is overlaid onto the memory chips 65D, 67D and 91, the pads 104 contact the electrodes 96, and the connection of the logic chip 68D and the memory chips 65D and 67D is established by the bus 40E. Further, the pads 102 of the logic chip 68D contact the electrodes 96 of the frame memory 91, and the connection of the logic chip 68D and the frame memory 91 is established by the bus 40E₁. Hence, the multi-chip semiconductor apparatus in FIG. 36 has the system configuration in FIG. 35.

Figure 37:
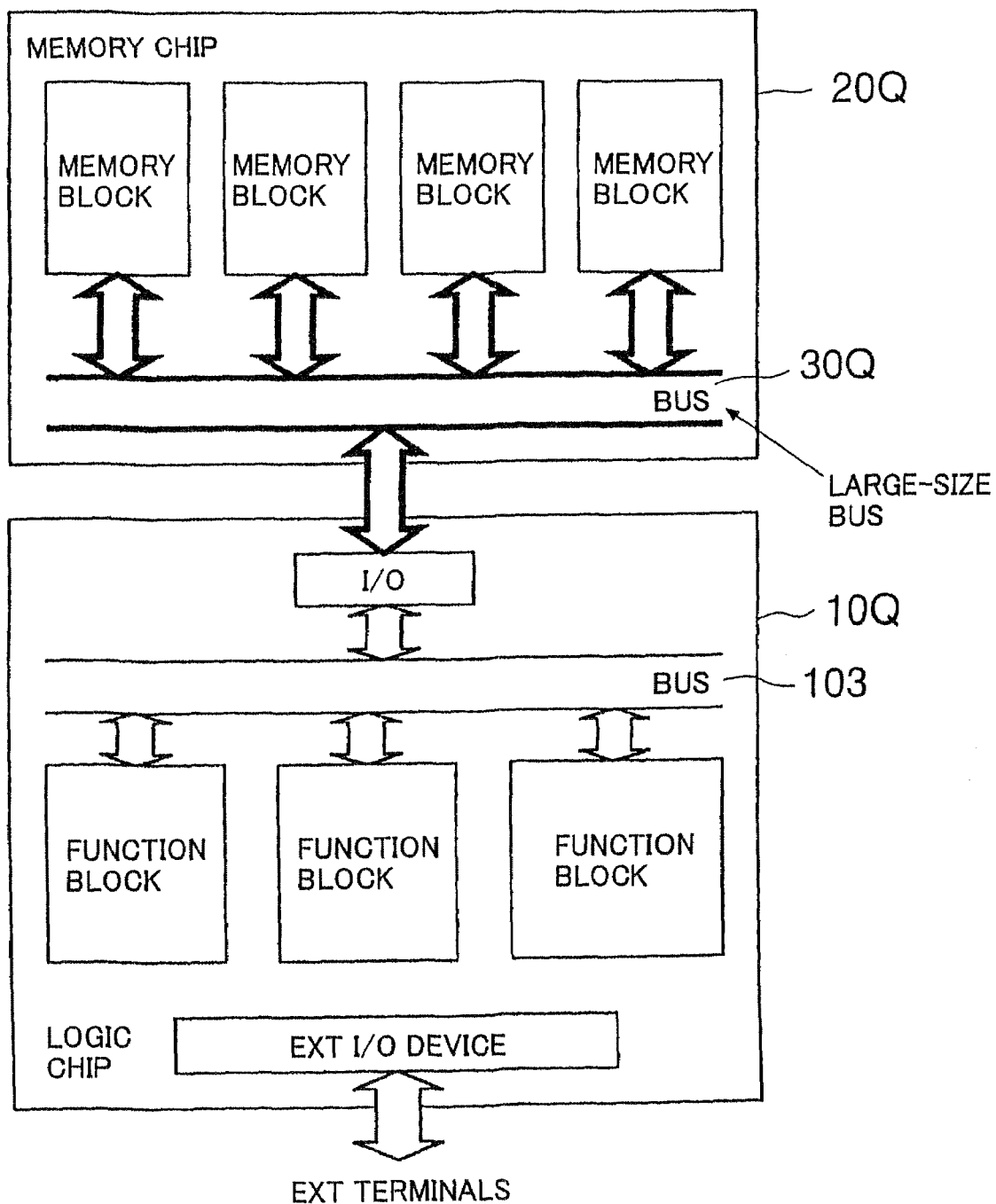
FIG. 37 is a diagram for explaining another configuration of the multi-chip semiconductor apparatus that is different from the multi-chip semiconductor apparatus of FIG. 12.

FIG. 37 shows another configuration of the multi-chip semiconductor apparatus that is different from the multi-chip semiconductor apparatus of FIG. 12.

In the present embodiment, the large-size bus connection is used by some of the multiple chips, and the normal-size bus connection is used by the other chips. As shown in FIG. 37, the multi-chip semiconductor apparatus of this embodiment includes the logic chip 10Q and the memory chip 20Q. The memory chip 20Q includes the large-size bus 30Q that interconnects the memory blocks. The logic chip 10Q includes the normal-size bus 103 that interconnects the function blocks. The logic chip 10Q is connected to an external device through the I/O device. The electrical connection between the memory chip 20Q and the logic chip 10Q is established by the connection of the I/O device of the logic chip 10Q to the large-size bus 30Q of the memory chip 20Q.

According to the multi-chip semiconductor apparatus of the present embodiment, the delay time is shortened and the power consumption is reduced in comparison with the conventional multi-chip semiconductor apparatus.

Figure 38:
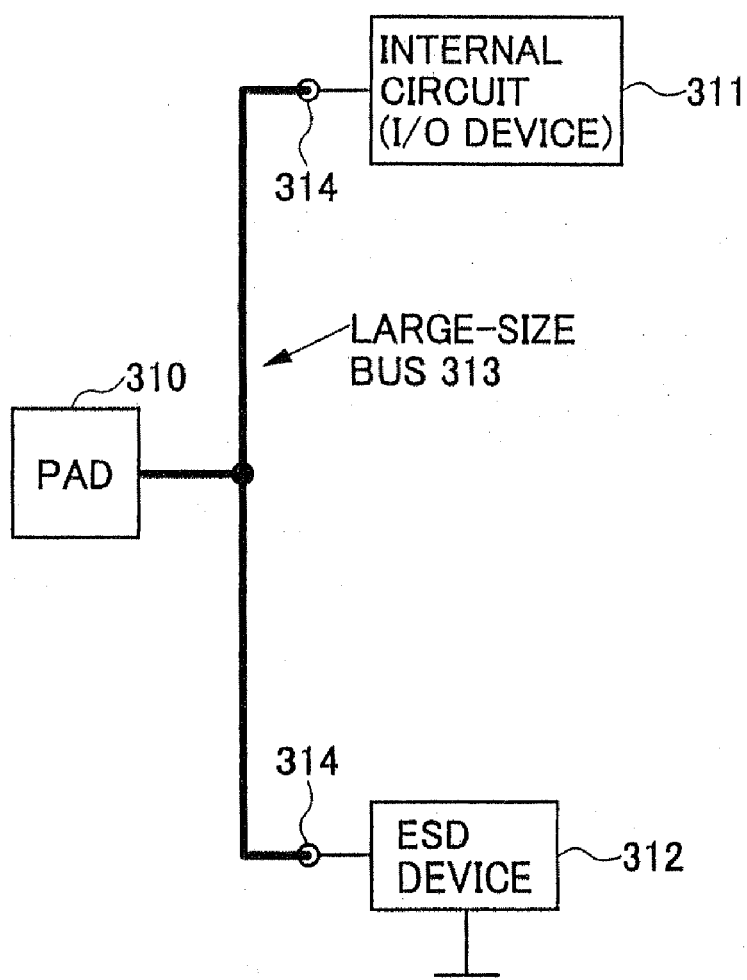
FIG. 38 is a block diagram of another preferred embodiment of the semiconductor apparatus of the invention.

Next, FIG. 38 shows another preferred embodiment of the semiconductor apparatus of the invention.

A semiconductor apparatus is known wherein an electrostatic discharge (ESD) device is connected to an external terminal (such as an I/O terminal) in order to protect the internal circuits (such as I/O devices) connected to the external terminal against electrostatic breakdown. The ESD device usually includes a resistor and an MOS transistor, the transistor having a source and a gate connected to the ground. For the purpose of protecting the internal circuits, the ESD device has a large size adequate to withstand a large amount of electric current flowing from the ESD device to the ground. It is necessary to dispose the ESD device in the vicinity of the internal circuits in order to effectively protect the internal circuits.

However, the ESD device has a large size and does not relate to the normal operation of the semiconductor apparatus. It is desirable that the ESD device be arranged at a vacant location of the chip where the circuit components are not provided. If a normal-size bus, which is provided to connect the external terminal with the ESD device and meet the demand for the circuit layout, is excessively long, it is difficult for the ESD device to instantaneously escape the large amount of current to the ground due to the wiring resistance and the parasitic capacity of the normal-size bus.

As the I/O devices directly affect the speed of operation of the semiconductor apparatus, it is required to dispose the I/O devices at appropriate locations of the chip. Conventionally, there has been the tradeoff between the requirement of the layout of the I/O devices and the demand for the layout of the ESD device.

The semiconductor apparatus of the present embodiment is configured to utilize the large-size bus connection in order to provide flexibility of the layout of the circuit components as well as high-speed operation with low power consumption.

As shown in FIG. 38, in the semiconductor apparatus of the present embodiment, a pad (or an external terminal) 310 is provided to connect the semiconductor apparatus with an external device. The semiconductor apparatus includes an internal circuit 311, such as an I/O device, which is connected to the pad 310. An ESD device 312 is connected to an intermediate position between the pad 310 and the internal circuit 311 in order to protect the internal circuit 311 against electrostatic breakdown as described above.

In the present embodiment, the connection between the pad 310 and the internal circuit 311 and the connection between the pad 310 and the ESD device 312 via the intermediate position are established by using a large-size bus 313. The large-size bus 313 is electrically connected to the ESD device 312 via the contact 314. Similarly, the large-size bus 313 is electrically connected to the internal circuit 311 via the contact 314.

As described earlier, the connection of the large-size bus 313, which is formed in the wiring layer having a width in a range of 5 ■■■ to 10 ■■■■ has the following advantages:

1) it provides a small electrical resistance because the width of the wiring layer is large;

2) it provides a small parasitic capacity because the interlayer distance between the bulk and the insulating layer and the wiring intervals of the large-size bus connection are large;

3) it is suited for a high-speed operation of semiconductor devices because the time constant of the large-size bus is very small.

According to the present embodiment, the connection of the large-size bus 313 enables the ESD device 312 to be spaced apart from the internal circuit 311 and to effectively attain the protection of the internal circuit 311. The demand for the layout of the ESD device in the semiconductor apparatus can be met. It is possible that the large-size bus 313 in the present embodiment have a length larger than the permissible maximum length of the normal-size bus that is needed to attain the protection of the internal circuit as in a conventional semiconductor apparatus.

Figure 39:
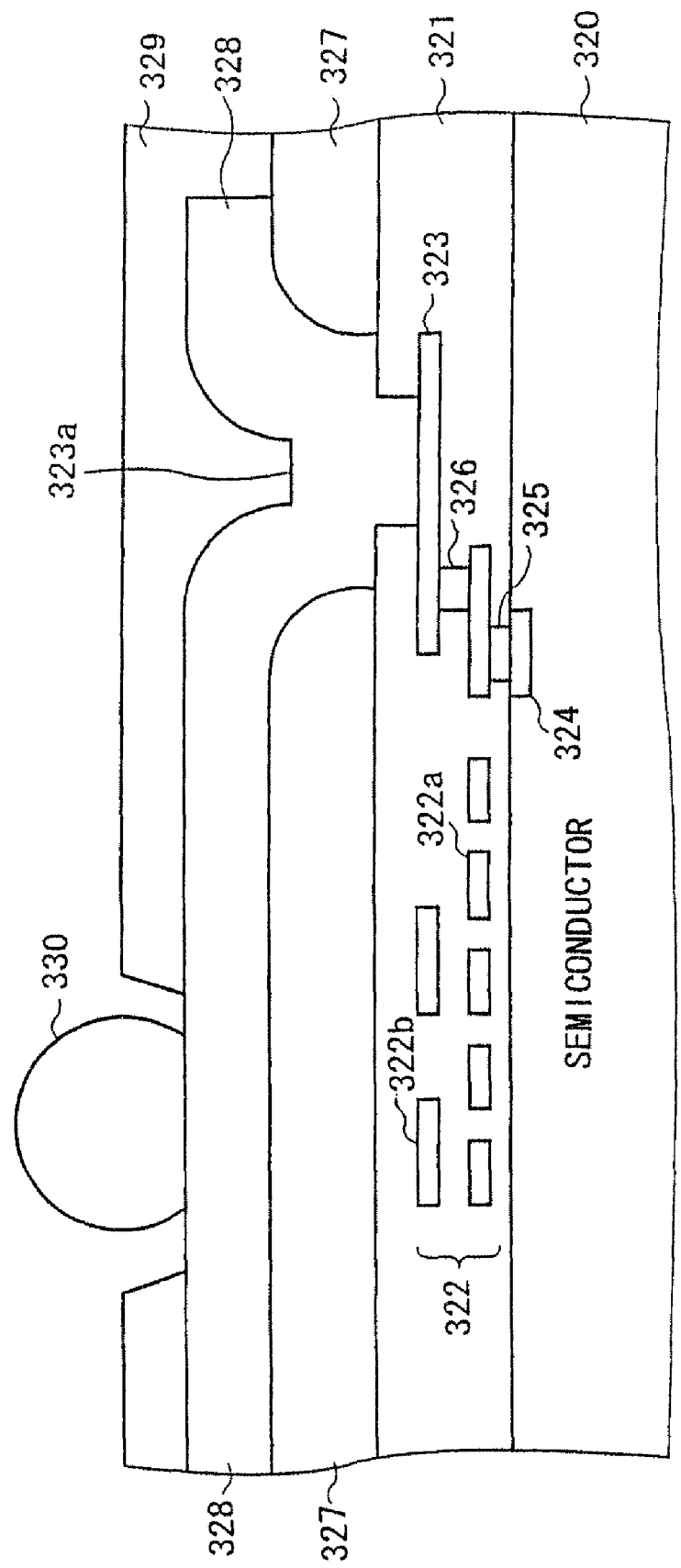
FIG. 39 is a cross-sectional view of the semiconductor apparatus shown in FIG. 38.

FIG. 39 is a cross-sectional view of the semiconductor apparatus shown in FIG. 38 for explaining the large-size bus 313.

As shown in FIG. 39, the multi-level wiring layer 322 is formed on the semiconductor substrate 320. The multi-level wiring layer 322 includes the wiring layer 322a and the wiring layer 322b. The wiring layers 322a and 322b are isolated from each other by an insulating layer of polyimide resin. Further, an insulating layer of polyimide resin is provided on the top surface of the upper wiring layer 322b. For the sake of convenience, the insulating layers of the multi-level wiring layer 322 are collectively designated by reference numeral 121.

In the semiconductor apparatus shown in FIG. 39, the multi-level wiring layer 322 includes the electrode 323 which is connected to the wiring layers 322a and 322b. The electrode 323 is electrically connected to the diffusion layer 324 via the contacts 325 and 326 and the intermediate wiring layer. The diffusion layer 324 is formed on the semiconductor substrate 320. The normal-size bus as in the conventional semiconductor apparatus is formed in the multi-level wiring layer 322.

Further, in the semiconductor apparatus of FIG. 39, the large-size bus wiring layer 328 is provided on the insulating layer 327. The large-size bus 311 in FIG. 38 is provided in the large-size bus wiring layer 328. The wiring layer 328 includes the contact 323a that is coupled to the electrode 323. The electrode 323 is exposed to the wiring layer 328 at the contact hole which is formed in the insulating layer 321. The wiring layer 328 enters the insulating layers 321 and 327 at the contact hole so that the contact 323a is electrically connected to the electrode 323. The large-size bus wiring layer 328 is larger in width and thickness than the wiring layers 322a and 322b of the multi-level wiring layer 322. For example, the large-size bus wiring layer 328 has a width in a range of 5 ■ ■ ■ to 10 ■ ■.

In the semiconductor apparatus of FIG. 39, the cover layer 329 is provided on the large-size bus wiring layer 328. The cover layer 329 includes an opening (or a through hole) where the large-size bus wiring layer 328 is exposed. The electrode 330 is provided at the opening of the cover layer 329, and the electrode 330 is used to connect the large-size bus 313 with another chip provided on the wiring layer 328. The electrode 330 is constructed, for example, in the form of either the bump or the pad. The electrode 330 corresponds to the pad 310 (or the external terminal) in FIG. 38

Figure 40:
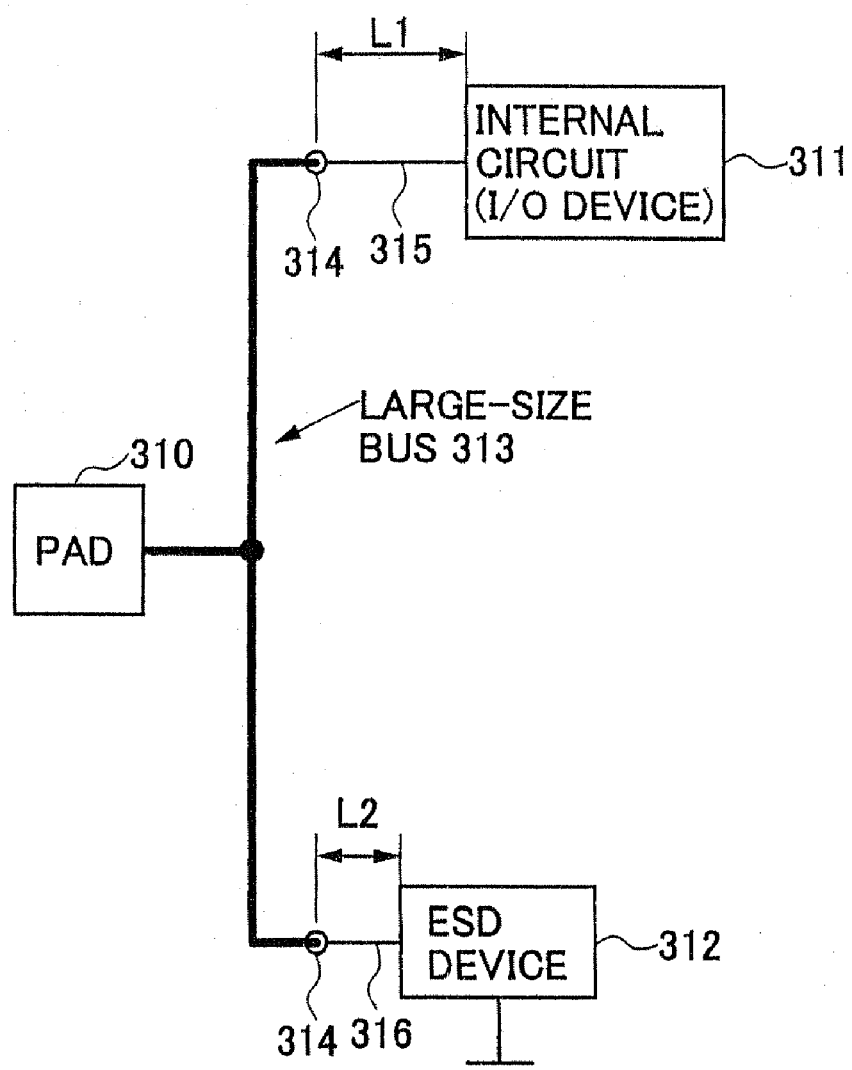
FIG. 40 is a block diagram of a variation of the semiconductor apparatus of the present embodiment.

FIG. 40 shows a variation of the semiconductor apparatus of the present embodiment. In FIG. 40, the elements that are essentially the same as corresponding elements in FIG. 38 are designated by the same reference numerals, and a description thereof will be omitted.

In the embodiment shown in FIG. 40, a normal-size bus 315 is provided to connect the internal circuit 311 with the large-size bus 313 via the contact 314, and a normal-size bus 316 is provided to connect the ESD device 312 with the large-size bus 313 via the contact 314. In the present embodiment, the normal-size bus 315 has a length L1 that is larger than a length L2 of the normal-size bus 316 (L1>L2). The parasitic capacity and wiring resistance of the normal-size bus are larger than those of the large-size bus. The semiconductor apparatus of the present embodiment is configured such that the condition L1>L2 is met, and, in the present embodiment, the electrostatic current is more likely to flow through the ESD device 312 than the internal circuit 311. Hence, the semiconductor apparatus of the present embodiment is effective in preventing the electrostatic breakdown of the internal circuit 311.

Figure 41:
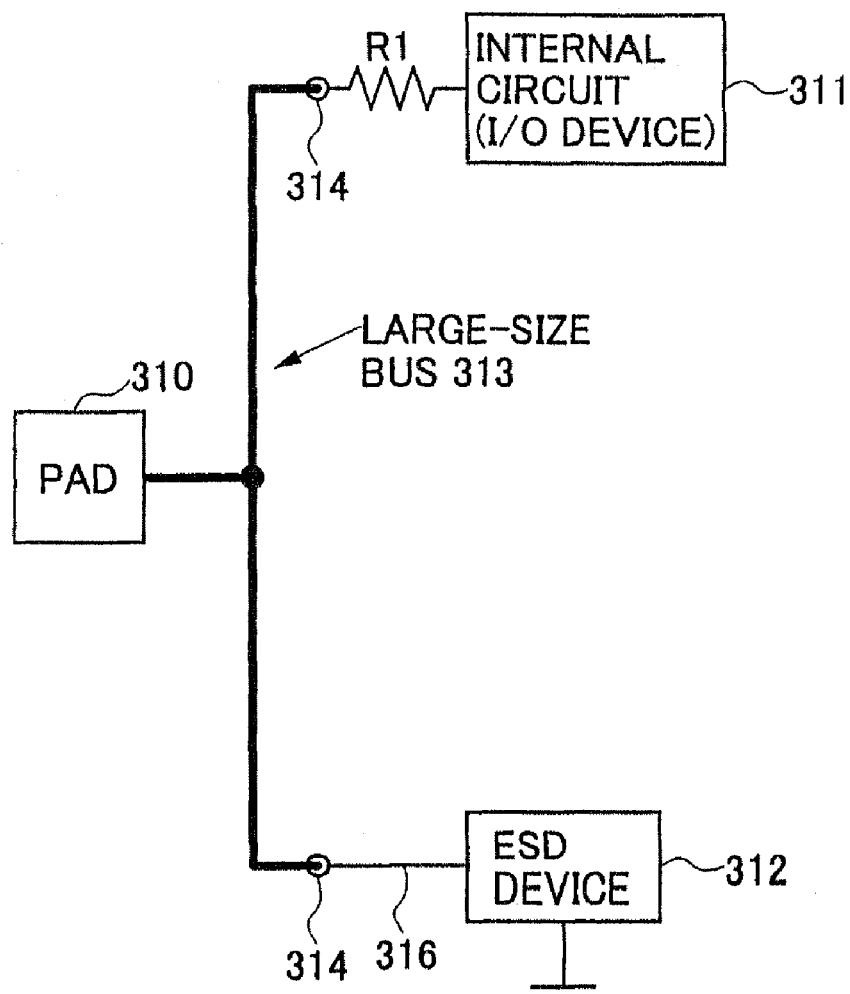
FIG. 41 is a block diagram of another variation of the semiconductor apparatus of the present embodiment.

FIG. 41 shows another variation of the semiconductor apparatus of the present embodiment. In FIG. 41, the elements that are essentially the same as corresponding elements in FIG. 38 are designated by the same reference numerals, and a description thereof will be omitted.

In the embodiment shown in FIG. 41, a resistor R1 is provided to connect the internal circuit 311 with the large-size bus 313 via the contact 314, and a normal-size bus 316 is provided to connect the ESD device 312 with the large-size bus 313 via the contact 314. In the present embodiment, because of the use of the resistor R1, the electrostatic current is more likely to flow through the ESD device 312 than the internal circuit 311. Hence, the semiconductor apparatus of the present embodiment is effective in preventing the electrostatic breakdown of the internal circuit 311.

Figure 42:
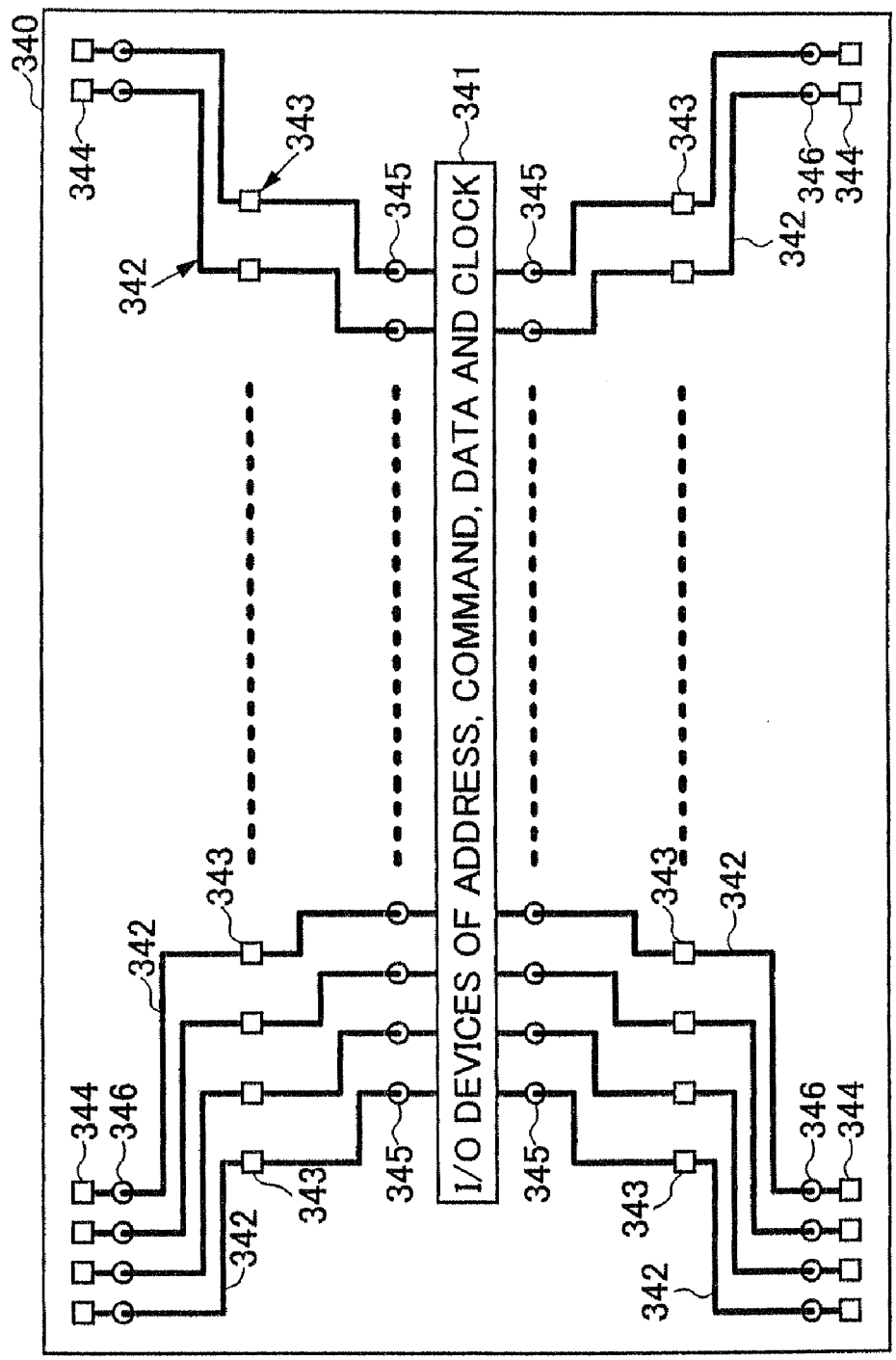
FIG. 42 is a diagram showing a configuration of the semiconductor apparatus of the present embodiment.

FIG. 42 shows an overall configuration of the semiconductor apparatus of the present embodiment.

As shown in FIG. 42, the semiconductor apparatus of the present embodiment includes a semiconductor chip 340, and the chip 340 includes I/O devices 341 in the central positions of the chip 340. The I/O devices 341 receive and transmit various signals including an address signal, a command signal, a data signal and a clock signal. A plurality of ESD devices 344 are disposed at peripheral positions of the chip 340. A large-size bus 342 is provided to interconnect the I/D devices 341 and the ESD devices 344. External terminals 343 are provided on the respective signal lines of the large-size bus 342 to connect the semiconductor apparatus with an external device. Each of the external terminals 343 in FIG. 42 corresponds to the electrode 330 in FIG. 39. The electrodes 330 may be constructed in the form of either the bumps or the pads.

In the semiconductor apparatus of FIG. 42, one end of each signal line of the large-size bus 342 is connected to one of the I/O devices 341 via the contact 345, and the other end of each signal lines of the large-size bus 342 is connected to one of the ESD devices 344 via the contact 346.

In the semiconductor apparatus of the present embodiment, the connection of the large-size bus 342 enables the ESD devices 344 to be spaced apart from the I/O devices 341 and to effectively attain the protection of the I/O devices 341. Specifically, when the I/O devices 341 are disposed in the central locations of the chip 340, the ESD devices 344 can be disposed at the peripheral locations of the chip 340 that are spaced apart from the I/O devices 341. It is possible that the large-size bus 342 in the present embodiment have a length larger than the permissible maximum length of the normal-size bus that is needed to attain the protection of the internal circuit as in the conventional semiconductor apparatus.

Figure 43:
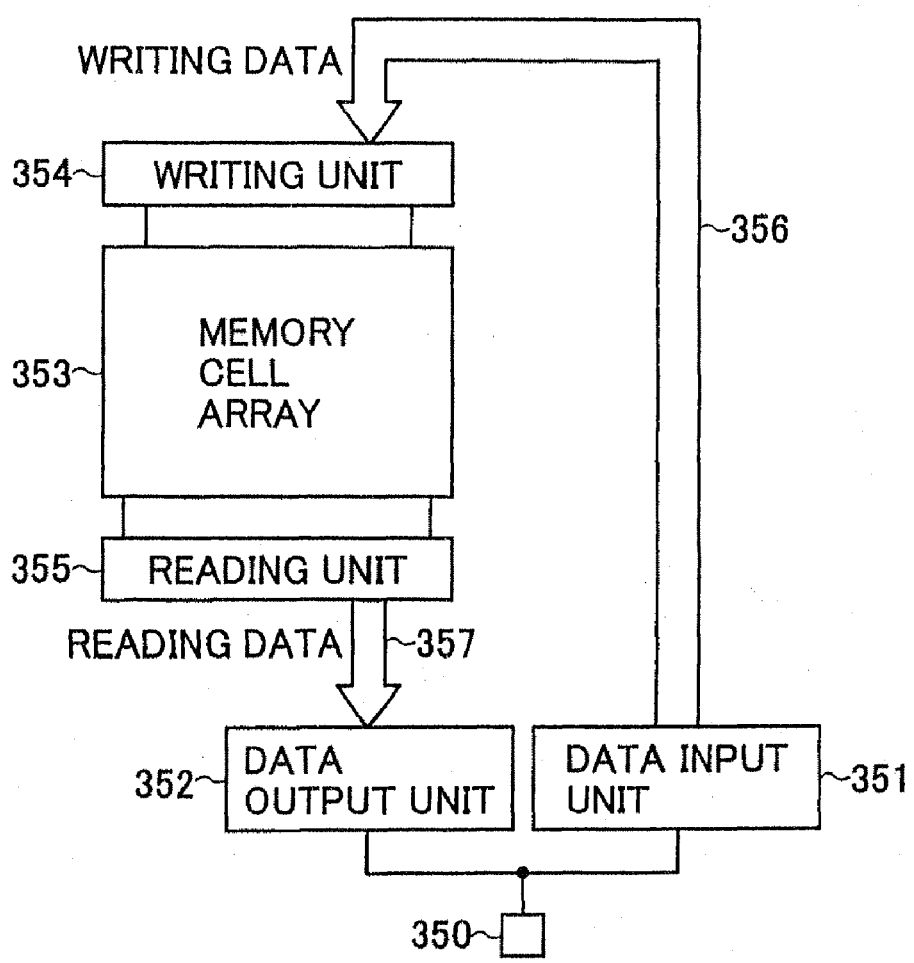
FIG. 43 is a block diagram of a semiconductor memory apparatus.

FIG. 43 shows a configuration of a semiconductor memory apparatus. As shown in FIG. 43, the semiconductor memory apparatus generally includes an external terminal 350, a data input unit 351, a data output unit 352, a memory cell array 353, a writing unit 354, a reading unit 355, a writing data bus 356 and a reading data bus 357.

When it is intended to increase the degree of integration of the memory core including the memory cell array 353, the writing unit 354 and the reading unit 355, the writing unit 354 is disposed on one side of the memory cell array 353 and the reading unit 355 is disposed on the other side of the memory cell array 353 as shown in FIG. 43. In such a configuration, the data input unit 351 and the data output unit 352, which share the external terminal 350, are disposed adjacent to each other and in the vicinity of the external terminal 350. If a normal-size bus, which is provided to connect the external terminal 350 with either of the data input unit 351 or the data output unit 352 and meet the demand for the circuit layout, is excessively long, the wiring resistance and the parasitic capacity of the normal-size bus may cause a defective operation of the semiconductor memory apparatus.

However, when the layout condition that the data input unit 351 and the data output unit 352 be disposed adjacent to each other is met, at least one of the signal line length of the writing data bus 356 connecting the data input unit 351 and the writing unit 354 and the signal line length of the reading data bus 357 connecting the reading unit 355 and the data output unit 352 becomes excessively long. The area of the entire chip is increased and the delay of the signal transmission occurs. In the semiconductor memory apparatus shown in FIG. 43, the signal line length of the writing data bus 356 connecting the data input unit 351 and the writing unit 354 becomes excessively long.

Figure 44A:
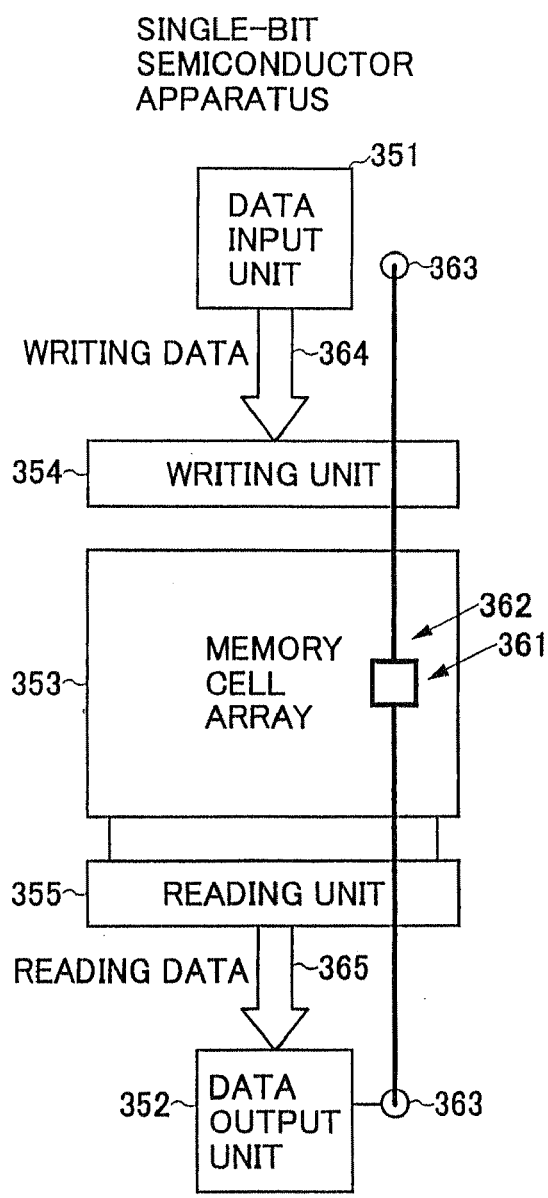
FIG. 44A and FIG. 44B are diagrams showing another preferred embodiment of the semiconductor apparatus of the invention.
Figure 44B:
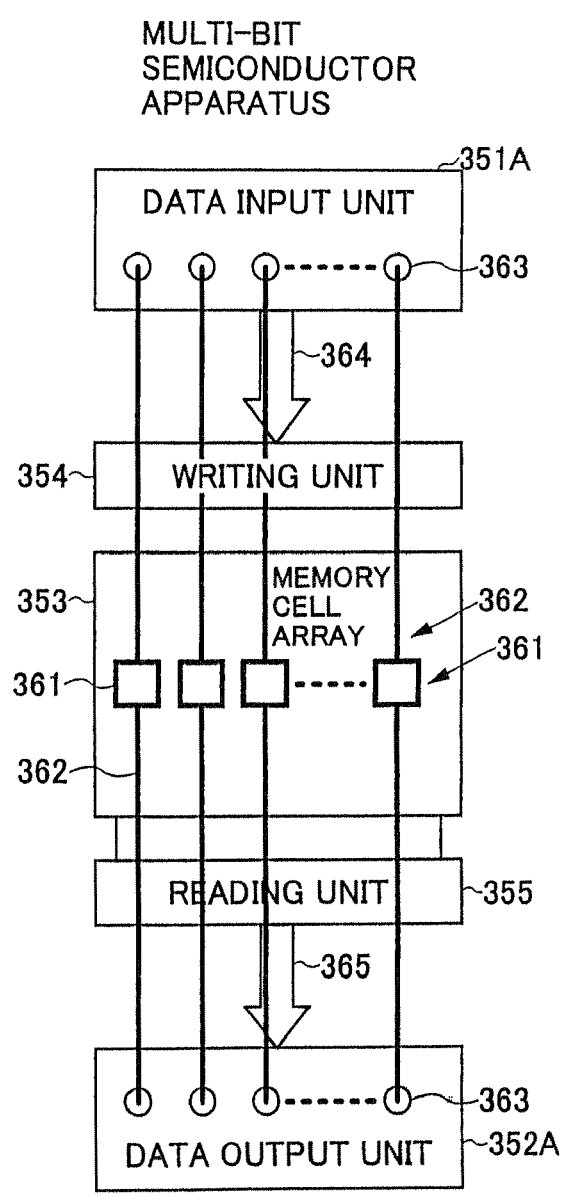

FIG. 44A and FIG. 44B show another preferred embodiment of the semiconductor apparatus of the invention.

The semiconductor apparatus of the present embodiment is configured in order to resolve the above problem of the semiconductor memory apparatus in FIG. 43. FIG. 44A shows a single-bit configuration of the semiconductor apparatus of the present embodiment. FIG. 44B shows a multiple-bit configuration of the semiconductor apparatus of the present embodiment. In FIG. 44A and FIG. 44B, the elements that are essentially the same as corresponding elements in FIG. 43 are designated by the same reference numerals, and a description thereof will be omitted.

In the single-bit semiconductor apparatus of FIG. 44A, the writing unit 354 is disposed on one side of the memory cell array 353, and the reading unit 355 is disposed on the other side of the memory cell array 353. The data input unit 351 is disposed adjacent to the writing unit 354, and the data output unit 352 is disposed adjacent to the reading unit 355. A large-size bus 362 is provided so that it is electrically connected at one end to the data input unit 351 via the contact 363, and it is electrically connected at the other end to the data output unit 352 via the contact 363. An external electrode 361, which is provided to connect the semiconductor apparatus with an external device, is formed on the large-size bus 362 at the central position thereof. The external electrode 361 corresponds to the electrode 330 in FIG. 39. The external electrode 361 may be constructed in the form of the bump or the pad.

In the semiconductor apparatus of the present embodiment, the connection of the large-size bus 362 enables the data input unit 351 and the data output unit 352 to be spaced apart each other and to effectively prevent the problem of the conventional semiconductor memory apparatus, such as a defective operation due to the wiring resistance and the parasitic capacity of the normal-size bus having too long signal lines. Even when the signal line length of the large-size bus 363 is large, the large-size bus 363 provides a small electrical resistance and a small parasitic capacity. It is no longer necessary to dispose the data input unit 351 and the data output unit 352 in the vicinity of the external terminal 361.

In the present embodiment, both the signal line length of the writing data bus 364 connecting the data input unit 351 and the writing unit 354 and the signal line length of the reading data bus 365 connecting the reading unit 355 and the data output unit 352 can be shortened.

In the multiple-bit semiconductor apparatus of FIG. 44B, the data input unit 351A is disposed adjacent to the writing unit 354, and the data output unit 352A is disposed adjacent to the reading unit 355, similar to the previous embodiment of FIG. 44A. A plurality of large-size buses 362 are provided in parallel so that each large-size bus 362 is electrically connected at one end to the data input unit 351A via the contact 363, and each large-size bus 362 is electrically connected at the other end to the data output unit 352A via the contact 363.

The present invention is not limited to the above-described embodiments, and variations and modifications may be made without departing from the scope of the present invention.

Further, the present invention is based on Japanese priority application No. 2000-363901, filed on Nov. 29, 2000, Japanese priority application No. 2000-363902, filed on Nov. 29, 2000, and Japanese priority application No. 2000-363903, filed on Nov. 29, 2000, the entire contents of which are hereby incorporated by reference.

What is claimed is:

1. A semiconductor apparatus having circuit components, comprising:
    a first bus interconnecting the circuit components;
    a second bus interconnecting the circuit components; and
    a switching unit outputting a select signal that causes each circuit component to select one of the first bus and the second bus when transmitting a signal from one of the circuit components to another,
    the second bus having a size larger than a size of the first bus,
    wherein the first bus is provided for transmission of the signal between the circuit components before formation of the second bus, and, when the semiconductor apparatus operates before the formation of the second bus, the signal is transmitted on the first bus from one of the circuit components to another.

2. A semiconductor apparatus having circuit components, comprising:
    a first bus interconnecting the circuit components;
    a second bus interconnecting the circuit components; and
    a switching unit outputting a select signal that causes each circuit component to select one of the first bus and the second bus when transmitting a signal from one of the circuit components to another,
    the switching unit being configured such that the first bus is selected only when a wafer test is conducted before formation of the second bus, and the second bus is selected at any time the semiconductor apparatus operates after the wafer test is conducted.

3. The semiconductor apparatus according to claim 1, wherein the first bus and the second bus are provided to transmit a same signal from one of the circuit components to another.

4. The semiconductor apparatus according to claim 1, wherein the first bus and the second bus are provided to transmit at least one of an address signal, a data signal, a control signal and a clock signal between the circuit components.

5. A semiconductor apparatus having circuit components, comprising:
    a first bus interconnecting the circuit components;
    a second bus interconnecting the circuit components; and
    a switching unit outputting a select signal that causes each circuit component to select one of the first bus and the second bus when transmitting a signal from one of the circuit components to another,
    the second bus having a size larger than a size of the first bus,
    wherein the switching unit is configured such that the second bus is always selected when the semiconductor apparatus operates after the formation of the second bus in the semiconductor apparatus.

6. The semiconductor apparatus according to claim 1, wherein the switching unit is provided to establish electrical connection between the circuit components by only the selected one of the first bus and the second bus.

7. The semiconductor apparatus according to claim 1, wherein the switching unit is provided with a programmable device.

8. The semiconductor apparatus according to claim 1, wherein the second bus includes signal line portions having a substantially equal length.

9. A semiconductor apparatus having circuit components, comprising:
    a first wiring layer provided on a chip and including a number M of first electrodes, the M first electrodes being connected to the circuit components via a first bus; and
    a second wiring layer provided above the first wiring layer and including a number N of second electrodes, the N second electrodes being connected to the circuit components via a second bus, the second bus having a size larger than a size of the first bus, wherein the semiconductor apparatus is configured such that a clock signal is received at each of the first electrodes and the second electrodes and the conditions M>N.box-solid.1 are met, wherein the circuit components includes respective receiver units each of which is connected to one of the M first electrodes, and, when a select signal is set at a first level, the clock signal received at each first electrode is transmitted through the first wiring layer to corresponding one of the circuit components, and, when the select signal is set at a second level, the clock signal received at each second electrode is transmitted through the second wiring layer to corresponding one of the circuit components.

* * * * *